(12) United States Patent
Lee et al.

(10) Patent No.: US 9,755,157 B2
(45) Date of Patent: Sep. 5, 2017

(54) ORGANIC COMPOUND AND ORGANIC OPTOELECTRIC DEVICE AND DISPLAY DEVICE

(71) Applicants: Han-Ill Lee, Uiwang-si (KR);
Dong-Kyu Ryu, Uiwang-si (KR);
Eun-Sun Yu, Uiwang-si (KR);
Jin-Seok Hong, Uiwang-si (KR);
Dong-Min Kang, Uiwang-si (KR);
Ji-Hun Shin, Uiwang-si (KR);
Sang-Shin Lee, Uiwang-si (KR);
Yu-Na Jang, Uiwang-si (KR);
Soo-Young Jeong, Uiwang-si (KR);
Su-Jin Han, Uiwang-si (KR)

(72) Inventors: Han-Ill Lee, Uiwang-si (KR);
Dong-Kyu Ryu, Uiwang-si (KR);
Eun-Sun Yu, Uiwang-si (KR);
Jin-Seok Hong, Uiwang-si (KR);
Dong-Min Kang, Uiwang-si (KR);
Ji-Hun Shin, Uiwang-si (KR);
Sang-Shin Lee, Uiwang-si (KR);
Yu-Na Jang, Uiwang-si (KR);
Soo-Young Jeong, Uiwang-si (KR);
Su-Jin Han, Uiwang-si (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 530 days.

(21) Appl. No.: 14/197,376

(22) Filed: Mar. 5, 2014

(65) Prior Publication Data

US 2015/0034914 A1 Feb. 5, 2015

(30) Foreign Application Priority Data

Aug. 5, 2013 (KR) .................. 10-2013-0092803

(51) Int. Cl.
*H01L 51/54* (2006.01)
*C09K 11/06* (2006.01)
*H01L 51/00* (2006.01)
*H01L 51/50* (2006.01)

(52) U.S. Cl.
CPC ...... *H01L 51/0067* (2013.01); *H01L 51/0071* (2013.01); *H01L 51/5016* (2013.01)

(58) Field of Classification Search
None
See application file for complete search history.

(56) References Cited

U.S. PATENT DOCUMENTS

| 5,942,340 | A | 8/1999 | Hu et al. |
| 5,952,115 | A | 9/1999 | Hu et al. |
| 7,138,483 | B2 | 11/2006 | Wang et al. |
| 2002/0132134 | A1 | 9/2002 | Hu et al. |
| 2008/0145708 | A1 | 6/2008 | Heil et al. |

| 2012/0068170 | A1† | 3/2012 | Pflumm |
| 2012/0097899 | A1* | 4/2012 | Parham ............ C07D 401/04 252/500 |
| 2012/0168734 | A1† | 7/2012 | Park |
| 2012/0305904 | A1† | 12/2012 | Kai |
| 2014/0014940 | A1† | 1/2014 | Pflumm |
| 2014/0353640 | A1† | 12/2014 | Haketa |

FOREIGN PATENT DOCUMENTS

| EP | 2301926 A1 | 3/2011 |
| JP | 2002-326965 A | 11/2002 |
| JP | 2012-028548 A | 2/2012 |
| KR | 10-2006-0069089 A | 6/2006 |
| KR | 10-2010-0003624 A | 1/2010 |
| KR | 10-2010-0130197 A | 12/2010 |
| KR | 10-2011-0015836 A | 2/2011 |
| KR | 10-2011-0016288 A | 2/2011 |
| KR | 10-2011-0018340 A | 2/2011 |
| KR | 2011-0102055 † | 9/2011 |
| KR | 10-2011-0117548 A | 10/2011 |
| KR | 10-2011-0117549 A | 10/2011 |
| KR | 10-2011-0129766 A | 12/2011 |
| KR | 10-2011-0129767 A | 12/2011 |
| KR | 10-2011-0133007 A | 12/2011 |

(Continued)

*Primary Examiner* — Andrew K Bohaty
(74) *Attorney, Agent, or Firm* — Lee & Morse, P.C.

(57) ABSTRACT

An organic compound represented by a combination of a moiety represented by the following Chemical Formula 1, a moiety represented by the following Chemical Formula 2, and a moiety represented by the following Chemical Formula 3,

[Chemical Formula 1]

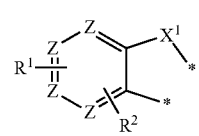

[Chemical Formula 2]

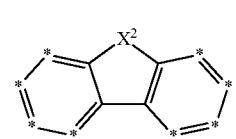

[Chemical Formula 3]

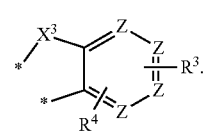

13 Claims, 1 Drawing Sheet

(56) References Cited

FOREIGN PATENT DOCUMENTS

| KR | 10-2011-0133008 A | 12/2011 |
|---|---|---|
| KR | 10-2011-0133009 A | 12/2011 |
| KR | 10-2011-0133010 A | 12/2011 |
| KR | 10-2011-0133011 A | 12/2011 |
| KR | 10-2012-0011445 A | 2/2012 |
| KR | 10-2012-0029751 A | 3/2012 |
| KR | 10-2012-0034140 A | 4/2012 |
| KR | 10-2012-0042633 A | 5/2012 |
| KR | 10-2012-0047706 A | 5/2012 |
| KR | 10-2012-0052879 A | 5/2012 |
| KR | 10-2012-0065214 A | 6/2012 |
| KR | 2012-0065214 † | 6/2012 |
| KR | 10-2012-0078301 A | 7/2012 |
| WO | WO 2006/065105 A1 | 6/2006 |
| WO | WO 2006/100896 A1 | 9/2006 |
| WO | WO 2006/122630 A1 | 11/2006 |
| WO | WO 2013/041176 A1 | 3/2013 |

\* cited by examiner
† cited by third party

[FIG. 1]
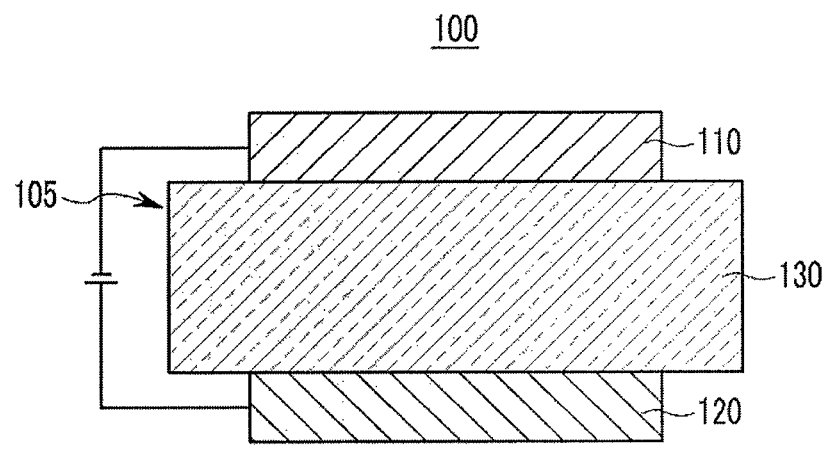
[FIG. 2]
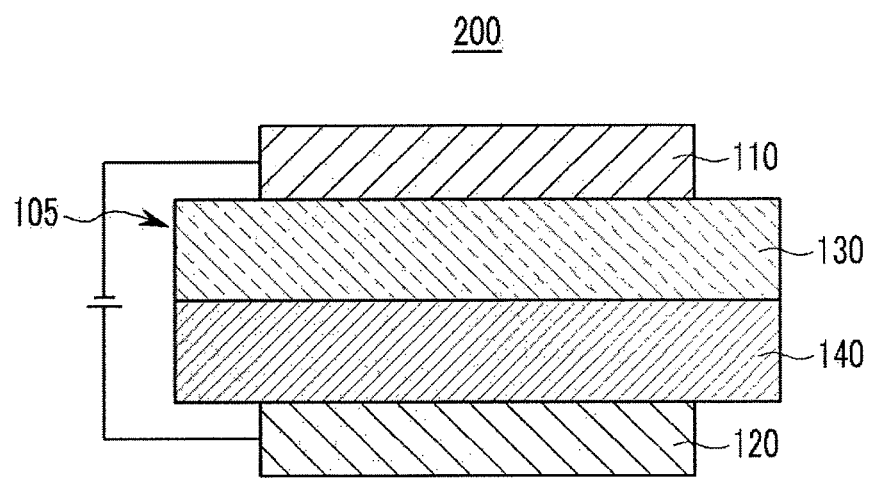

ORGANIC COMPOUND AND ORGANIC OPTOELECTRIC DEVICE AND DISPLAY DEVICE

CROSS-REFERENCE TO RELATED APPLICATION

Korean Patent Application No. 10-2013-0092803, filed on Aug. 5, 2013, in the Korean Intellectual Property Office, and entitled: "Organic Compound and Organic Optoelectric Device and Display Device," is incorporated by reference herein in its entirety.

BACKGROUND

1. Field

Embodiments relate to an organic compound, an organic optoelectric device, and a display device.

2. Description of the Related Art

An organic optoelectric device may be a device that converts electrical energy into photoenergy, or vice versa.

An organic optoelectric device may be classified as follows in accordance with its driving principles. One is an electronic device where excitons generated by photoenergy are separated into electrons and holes, and the electrons and holes are transferred to separate electrodes respectively and electrical energy is produced. Another is a light emitting device to generate photoenergy from electrical energy by supplying a voltage or a current to electrodes.

SUMMARY

Embodiments are directed to an organic compound represented by a combination of a moiety represented by the following Chemical Formula 1, a moiety represented by the following Chemical Formula 2, and a moiety represented by the following Chemical Formula 3.

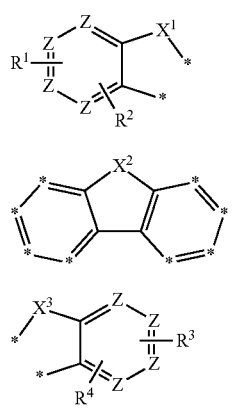

[Chemical Formula 1]

[Chemical Formula 2]

[Chemical Formula 3]

In the Chemical Formulae 1 to 3, $X^1$, $X^2$, and $X^3$ may independently be $NR^a$, $CR^bR^c$, $SiR^dR^e$, O, S, SO or $SO_2$, and, when one of $X^1$, $X^2$, and $X^3$ is $NR^a$, the other two of $X^1$, $X^2$, and $X^3$ may be other than $NR^a$, each Z may independently be $CR^f$ or N, two *'s of the Chemical Formula 1 may be bonded with adjacent two *'s of the Chemical Formula 2 to form a fused ring, two *'s of the Chemical Formula 3 may be bonded with another adjacent two *'s of the Chemical Formula 2 to form a fused ring,

*'s not forming a fused ring in the Chemical Formula 2 may independently be $CR^g$ or N, and $R^1$ to $R^4$ and $R^a$ to $R^g$ may independently be hydrogen, deuterium, a substituted or unsubstituted C1 to C30 alkyl group, a substituted or unsubstituted C3 to C30 cycloalkyl group, a substituted or unsubstituted C3 to C30 heterocycloalkyl group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a substituted or unsubstituted C2 to C30 alkoxycarbonyl group, a substituted or unsubstituted C2 to C30 alkoxycarbonylamino group, a substituted or unsubstituted C7 to C30 aryloxycarbonylamino group, a substituted or unsubstituted C1 to C30 sulfamoylamino group, a substituted or unsubstituted C2 to C30 alkenyl group, a substituted or unsubstituted C2 to C30 alkynyl group, a substituted or unsubstituted silyl group, a substituted or unsubstituted silyloxy group, a substituted or unsubstituted C1 to C30 acyl group, a substituted or unsubstituted C1 to C20 acyloxy group, a substituted or unsubstituted C1 to C20 acylamino group, a substituted or unsubstituted C1 to C30 sulfonyl group, a substituted or unsubstituted C1 to C30 alkylthiol group, a substituted or unsubstituted C1 to C30 heterocyclothiol group, a substituted or unsubstituted C6 to C30 arylthiol group, a substituted or unsubstituted C1 to C30 heteroarylthiol group, a substituted or unsubstituted C1 to C30 ureide group, a halogen, a halogen-containing group, a cyano group, a hydroxyl group, an amino group, a nitro group, a carboxyl group, a ferrocenyl group, or a combination thereof.

Embodiments are also directed to an organic optoelectric device including an anode and a cathode facing each other, and at least one organic layer interposed between the anode and the cathode, the organic layer including an organic compound according to an embodiment.

Embodiments are also directed to a display device including an organic optoelectric device according to an embodiment.

BRIEF DESCRIPTION OF THE DRAWINGS

Features will become apparent to those of skill in the art by describing in detail exemplary embodiments with reference to the attached drawings in which:

FIGS. 1 and 2 illustrate cross-sectional views of organic light emitting diodes according to example embodiments.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

As used herein, when a definition is not otherwise provided, the term "substituted" refers to one substituted with a deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C3 to C30 cycloalkyl group, a C3 to C30 heterocycloalkyl group, a C6 to C30 aryl group, a C6 to C30 heteroaryl group, a C1 to C20 alkoxy group, a fluoro group, a C1 to C10 trifluoroalkyl group such as a trifluoromethyl group, and the like, or a cyano group, instead of at least one hydrogen of a substituent or a compound.

In addition, two adjacent substituents of the substituted halogen, hydroxy group, amino group, substituted or unsubstituted C1 to C20 amine group, nitro group, substituted or unsubstituted C3 to C40 silyl group, C1 to C30 alkyl group, C1 to C10 alkylsilyl group, C3 to C30 cycloalkyl group, C3 to C30 heterocycloalkyl group, C6 to C30 aryl group, C6 to C30 heteroaryl group, C1 to C20 alkoxy group, fluoro group, C1 to C10 trifluoroalkyl group such as trifluoromethyl group and the like, or cyano group may be fused with each other to form a ring. For example, the substituted C6 to C30 aryl group may be fused with another adjacent substituted C6 to C30 aryl group to form a substituted or unsubstituted fluorene ring.

In the present specification, when specific definition is not otherwise provided, the term "hetero" refers to one including 1 to 3 hetero atoms selected from N, O, S, P, and Si, and remaining carbons in one compound or substituent.

As used herein, when a definition is not otherwise provided, the term "alkyl group" may refer to an aliphatic hydrocarbon group. The alkyl group may refer to "a saturated alkyl group" without any double bond or triple bond.

The alkyl group may be a C1 to C30 alkyl group. More specifically, the alkyl group may be a C1 to C20 alkyl group or a C1 to C10 alkyl group. For example, a C1 to C4 alkyl group includes 1 to 4 carbons in alkyl chain, and may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

As used herein, the term "aryl group" refers to a substituent including all element of the cycle having p-orbitals which form conjugation, and may be monocyclic, polycyclic or fused ring polycyclic (i.e., rings sharing adjacent pairs of carbon atoms) functional group.

As used herein, the term "aryl group" refers to a substituent including all element of the cycle having p-orbitals which form conjugation, and may be monocyclic, polycyclic or fused ring polycyclic (i.e., rings sharing adjacent pairs of carbon atoms) functional group. The heteroaryl group may be a fused ring where each ring may include the 1 to 3 heteroatoms.

More specifically, the substituted or unsubstituted C6 to C30 aryl group and/or the substituted or unsubstituted C2 to C30 heteroaryl group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted—benzothiopheneyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted fluorenyl group, a substituted or unsubstituted dibenzofuraneyl group, a substituted or unsubstituted dibenzothiopheneyl group, a substituted or unsubstituted carbazolyl group, or a combination thereof, but is not limited thereto.

In the specification, one linked to each other to form a fused ring refers to one to form naphthalene, triphenylene, anthracene, phenanthrene, tetralin, quinoline, indene, indane, and the like.

In the specification, hole characteristics refer to characteristics capable of donating an electron to form a hole when electric field is applied, and characteristics that hole formed in the anode is easily injected into the emission layer and transported in the emission layer due to conductive characteristics according to HOMO level.

In addition, electron characteristics refer to characteristics capable of accepting an electron when electric field is applied, and characteristics that electron formed in the cathode is easily injected into the emission layer and transported in the emission layer due to conductive characteristics according to LUMO level.

Hereinafter, an organic compound according to an example embodiment is described.

The organic compound according to the present example embodiment is represented by a combination of a moiety represented by the following Chemical Formula 1, a moiety represented by the following Chemical Formula 2, and a moiety represented by the following Chemical Formula 3.

[Chemical Formula 1]

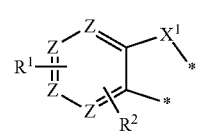

[Chemical Formula 2]

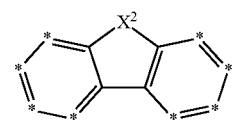

-continued

[Chemical Formula 3]

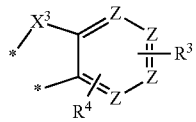

According to the present example embodiment, in the Chemical Formulae 1 to 3, $X^1$, $X^2$ and $X^3$ are independently $NR^a$, $CR^bR^c$, $SiR^dR^e$, O, S, SO or $SO_2$. In an example embodiment, when one of $X^1$, $X^2$, and $X^3$ is $NR^a$, the other two of $X^1$, $X^2$, and $X^3$ are not $NR^a$. For example, when one of $X^1$, $X^2$, and $X^3$ is $NR^a$, the other two of $X^1$, $X^2$, and $X^3$ may be independently $CR^bR^c$, $SiR^dR^e$, O, S, SO, or $SO_2$.

Each Z is independently $CR^f$ or N.

The two *'s of the Chemical Formula 1 are bonded with adjacent two *'s (e.g., carbons) of the Chemical Formula 2 to form a fused ring, two *'s of the Chemical Formula 3 are bonded with adjacent two *'s (e.g., carbons) of the Chemical Formula 2 to form a fused ring, and *'s not forming a fused ring in the Chemical Formula 2 are independently $CR^g$ or N.

$R^1$ to $R^4$ and $R^a$ to $R^g$ are independently hydrogen, deuterium, a substituted or unsubstituted C1 to C30 alkyl group, a substituted or unsubstituted C3 to C30 cycloalkyl group, a substituted or unsubstituted C3 to C30 heterocycloalkyl group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a substituted or unsubstituted C2 to C30 alkoxycarbonyl group, a substituted or unsubstituted C2 to C30 alkoxycarbonylamino group, a substituted or unsubstituted C7 to C30 aryloxycarbonylamino group, a substituted or unsubstituted C1 to C30 sulfamoylamino group, a substituted or unsubstituted C2 to C30 alkenyl group, a substituted or unsubstituted C2 to C30 alkynyl group, a substituted or unsubstituted silyl group, a substituted or unsubstituted silyloxy group, a substituted or unsubstituted C1 to C30 acyl group, a substituted or unsubstituted C1 to C20 acyloxy group, a substituted or unsubstituted C1 to C20 acylamino group, a substituted or unsubstituted C1 to C30 sulfonyl group, a substituted or unsubstituted C1 to C30 alkylthiol group, a substituted or unsubstituted C1 to C30 heterocyclothiol group, a substituted or unsubstituted C6 to C30 arylthiol group, a substituted or unsubstituted C1 to C30 heteroarylthiol group, a substituted or unsubstituted C1 to C30 ureide group, a halogen, a halogen-containing group, a cyano group, a hydroxyl group, an amino group, a nitro group, a carboxyl group, a ferrocenyl group, or a combination thereof.

The organic compound according to the present example embodiment includes a plurality of fused rings, which may help increase charge mobility and resultantly decrease a driving voltage of an organic optoelectronic device and improve its efficiency when applied to the organic optoelectronic device. In an example embodiment, the organic compound according to the present example embodiment includes only a 0 or 1 nitrogen (N)-containing fused ring out of the plurality of fused rings and may show significant charge mobility and driving voltage improvement effects compared with an organic compound including a plurality of nitrogen (N)-containing fused rings.

In addition, the organic compound according to the present example embodiment may exhibit steric hindrance that decreases interaction among molecules, which may suppress crystallization and, resultantly, may improve life-span of an organic optoelectronic device when applied to the organic optoelectronic device.

In an example embodiment, the organic compound may be represented by, for example, one of the following Chemical Formulae 4 to 6 depending on bonding positions of the moieties.

[Chemical Formula 4]

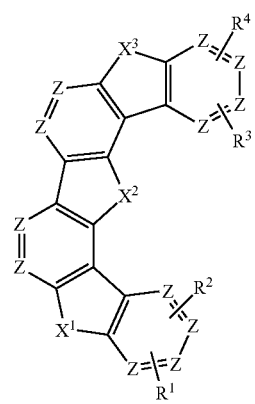

[Chemical Formula 5]

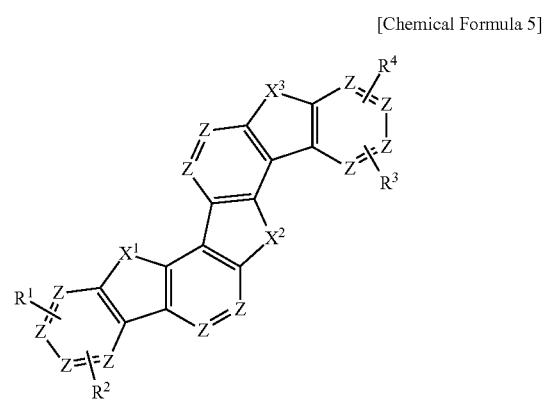

[Chemical Formula 6]

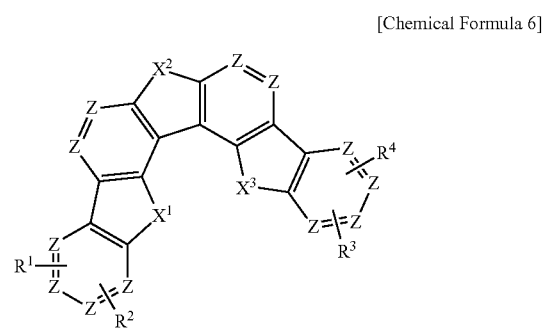

In the Chemical Formulae 4 to 6, $X^1$, $X^2$, $X^3$, Z, $R^1$ to $R^4$, and $R^a$ to $R^f$ are the same as described above.

The organic compound represented by Chemical Formula 4 may be represented by, for example, one of the following Chemical Formulae 4a to 4c.

[Chemical Formula 4a]

[Chemical Formula 4b]

[Chemical Formula 4c]

[Chemical Formula 5a]

[Chemical Formula 5b]

[Chemical Formula 5c]

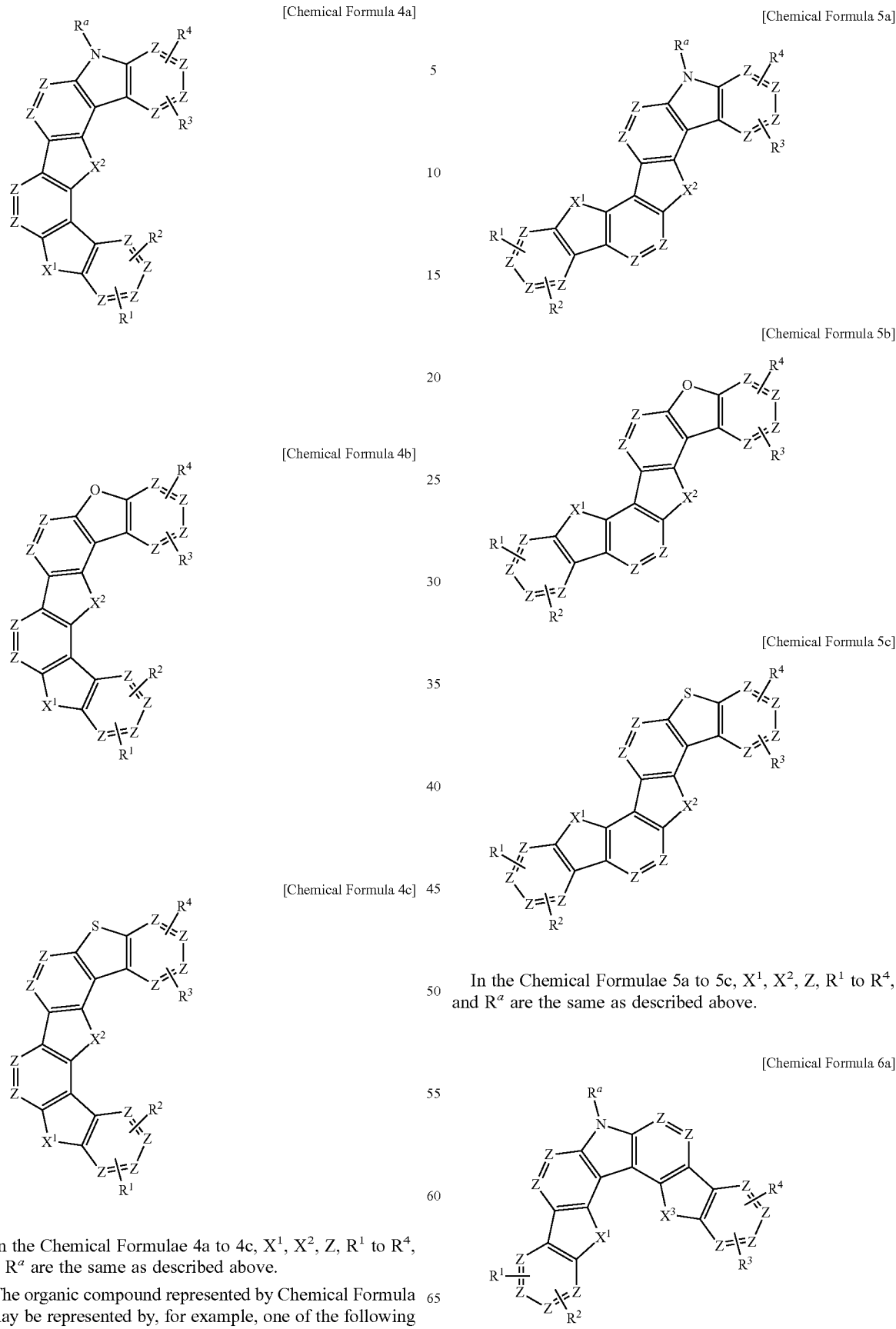

In the Chemical Formulae 4a to 4c, $X^1$, $X^2$, Z, $R^1$ to $R^4$, and $R^a$ are the same as described above.

The organic compound represented by Chemical Formula 5 may be represented by, for example, one of the following Chemical Formulae 5a to 5c.

In the Chemical Formulae 5a to 5c, $X^1$, $X^2$, Z, $R^1$ to $R^4$, and $R^a$ are the same as described above.

[Chemical Formula 6a]

[Chemical Formula 6b]

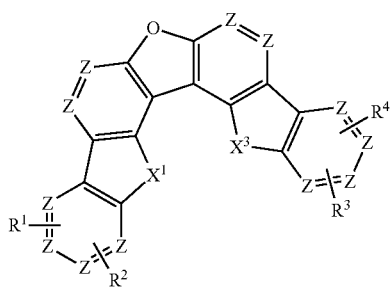

[Chemical Formula 6c]

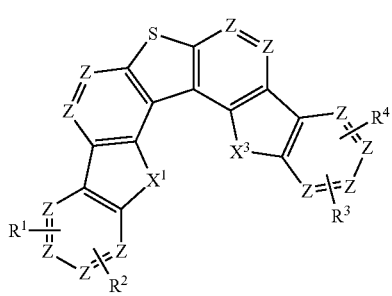

In the Chemical Formulae 6a to 6c, $X^1$, $X^2$, Z, $R^1$ to $R^4$, and $R^a$ are the same as described above.

The organic compound according to an example embodiment may have various substituents in order to provide a desired characteristic. For example, in an example embodiment the organic compound has a substituent having hole characteristics and may have strong hole characteristics. In another implementation, the compound has a substituent having electron characteristics and may have strong electron characteristics. In another implementation, the compound has both a substituent having electron characteristics and a substituent having hole characteristics, and may have strong amphiphilic characteristics.

In the Chemical Formula 1, the substituents $R^1$ to $R^4$ and $R^a$ to $R^f$ may be selected from, for example, hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, and a combination thereof.

At least one of $R^1$ to $R^4$ and $R^a$ to $R^f$ may be a functional group having electron characteristics, hole characteristics, or amphiphilic characteristics. In an example embodiment, at least one of $R^1$ to $R^4$ and $R^a$ to $R^f$ may be, for example, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, or a combination thereof.

In an example embodiment, at least one of $R^1$ to $R^4$ and $R^a$ to $R^f$ may be one of the substituted or unsubstituted functional groups listed in the following Group 1.

[Group 1]

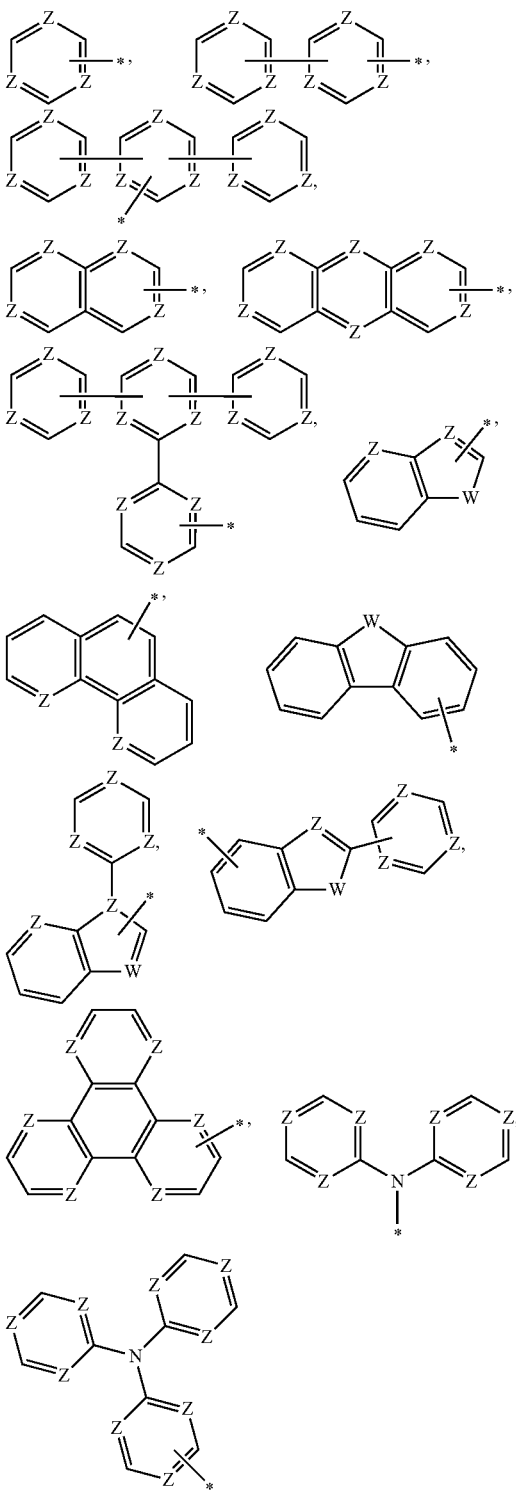

According to the present example embodiment, in the Group 1,
each Z is independently N, C, or $CR^h$,
each W is independently N, O, S, SO, $SO_2$, $NR^i$, $CR^j$, or $CR^kR^l$,
$R^h$ to $R^l$ are independently hydrogen, deuterium, a substituted or unsubstituted C1 to C30 alkyl group, a substituted or unsubstituted C3 to C30 cycloalkyl group, a substituted or unsubstituted C3 to C30 heterocycloalkyl group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a substituted or unsubstituted C2 to C30 alkoxycarbonyl group, a substituted or unsubstituted C2 to C30 alkoxycarbonylamino group, a substituted or unsubstituted C7 to C30 aryloxycarbonylamino group, a substituted or unsubstituted C1 to C30 sulfamoylamino group, a substituted or unsubstituted C2 to C30 alkenyl group, a substituted or unsubstituted C2 to C30 alkynyl group, a substituted or unsubstituted silyl group, a substituted or unsubstituted silyloxy group, a substituted or unsubstituted C1 to C30 acyl group, a substituted or unsubstituted C1 to C20 acyloxy group, a substituted or unsubstituted C1 to C20 acylamino group, a substituted or unsubstituted C1 to C30 sulfonyl group, a substituted or unsubstituted C1 to C30 alkylthiol group, a substituted or unsubstituted C1 to C30 heterocyclothiol group, a substituted or unsubstituted C6 to C30 arylthiol group, a substituted or unsubstituted C1 to C30 heteroarylthiol group, a substituted or unsubstituted C1 to C30 ureide group, a halogen, a halogen-containing group, a cyano group, a hydroxyl group, an amino group, a nitro group, a carboxyl group, a ferrocenyl group, or a combination thereof, and

* is a linking point and may be positioned at one of elements of the functional group.

The functional groups listed in the Group 1 may be, for example, one of the following substituted or unsubstituted functional groups listed in the following Group 2.

[Group 2]

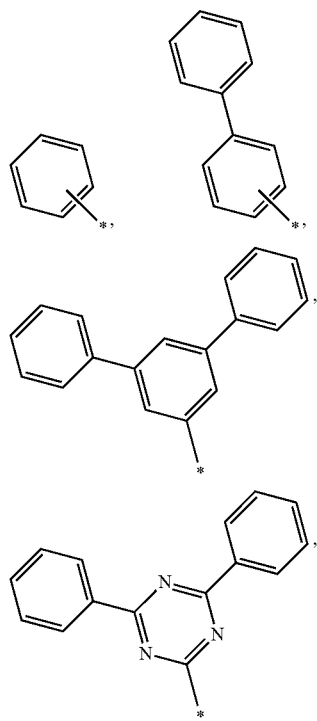

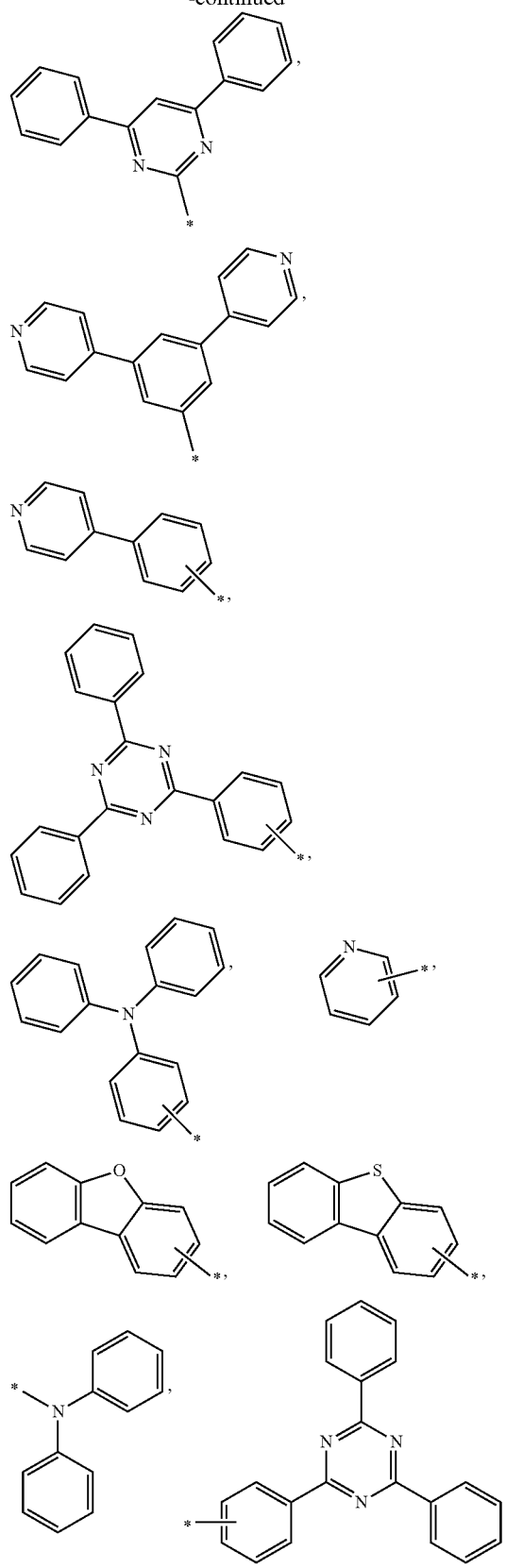

In the Group 2, * is a linking point and may be positioned at one of elements of the functional group.

The organic compound according to an example embodiment may be, for example, an organic compound listed in the following Group 3.
[Group 3]
1
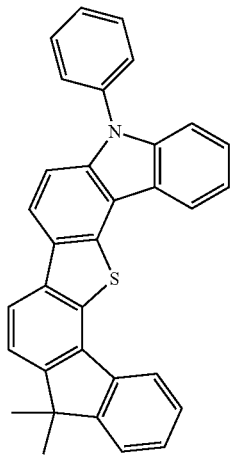
2
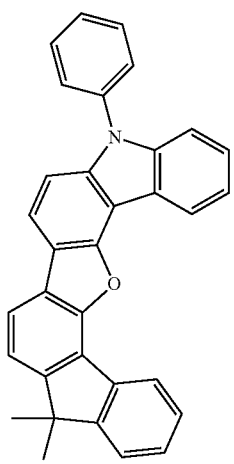
3
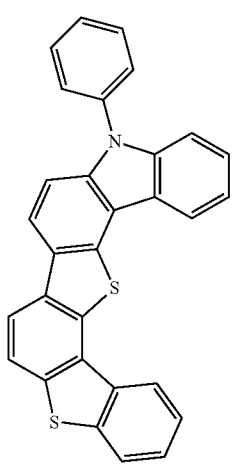
4
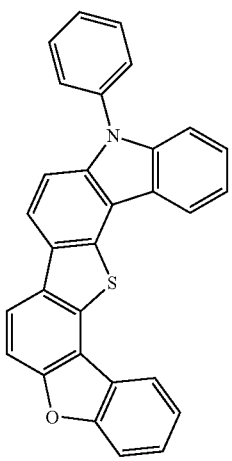
5
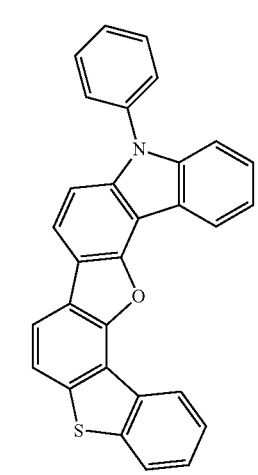
6
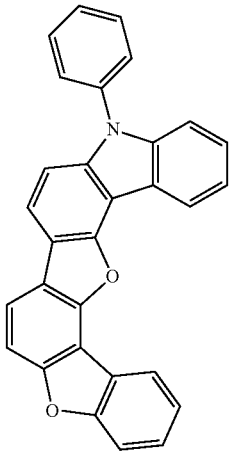

7
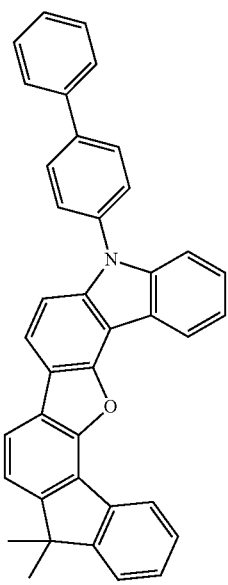
8
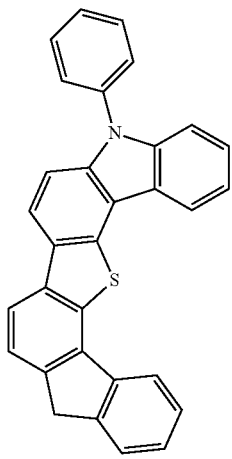
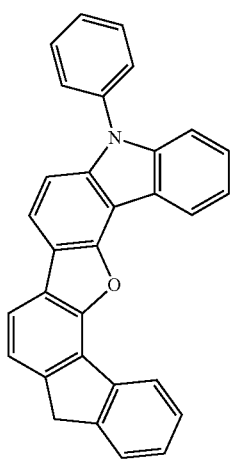
9
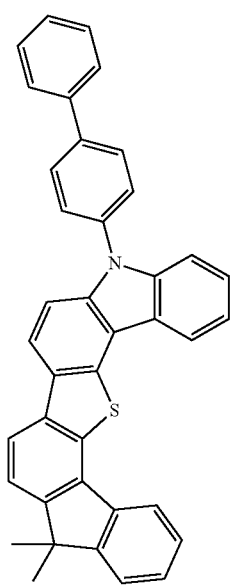
10
11
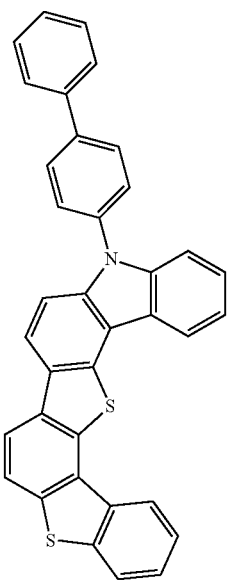

12
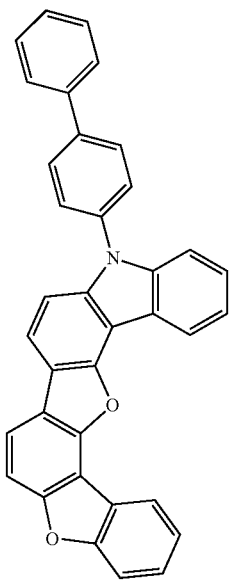
13
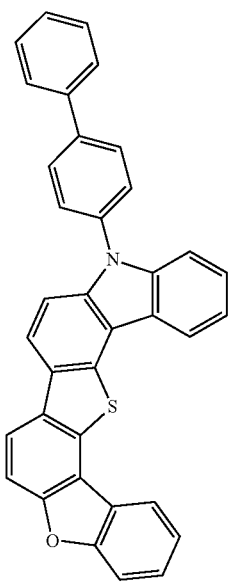
14
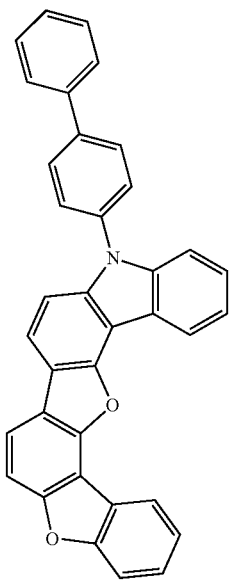
15
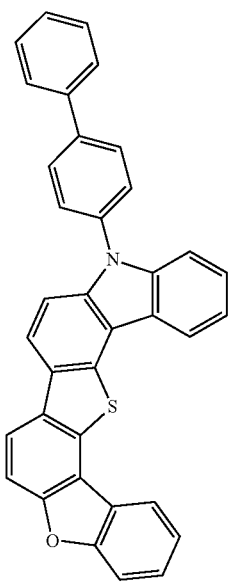

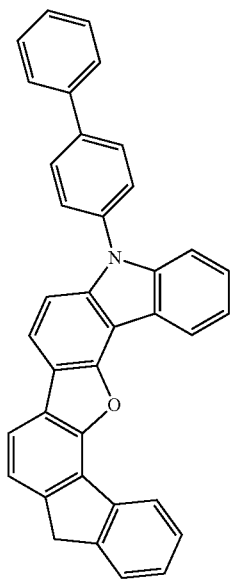
16
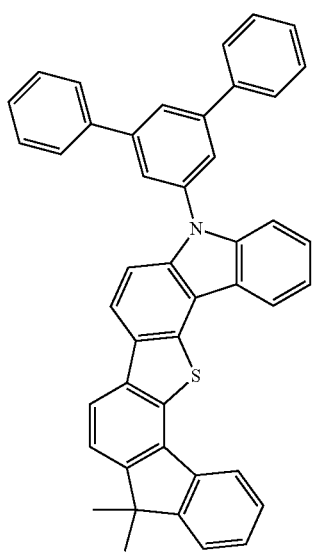
17
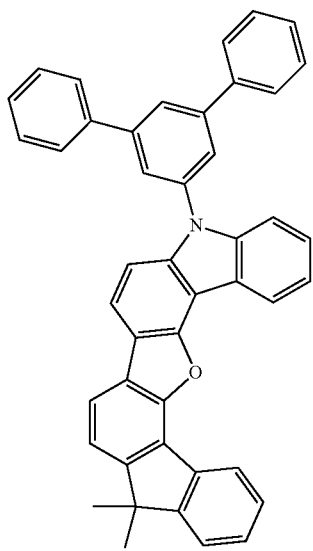
18
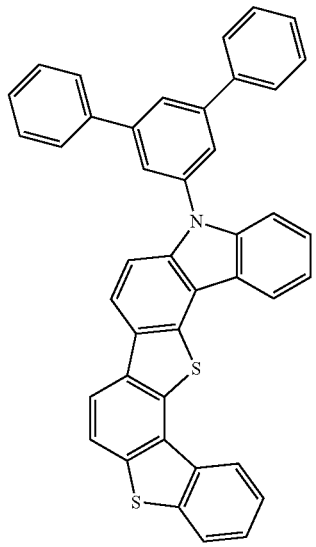
19
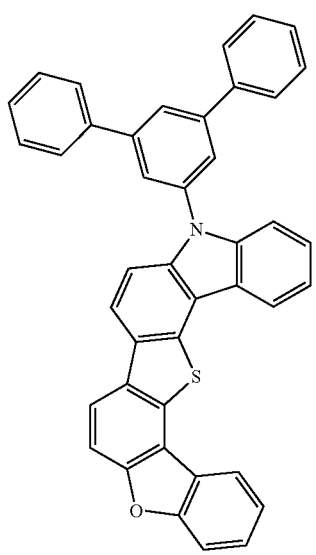
20
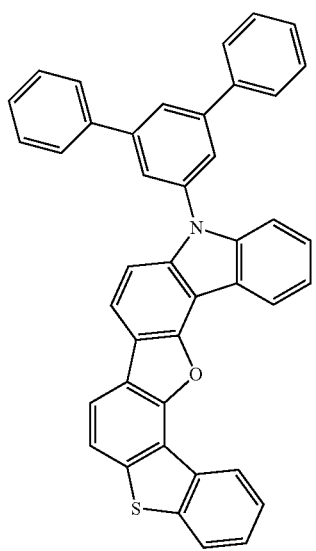
21

22
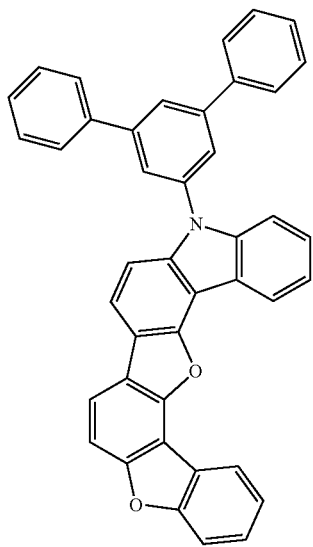
23
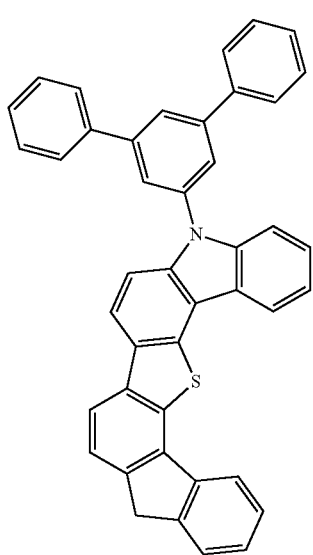
24
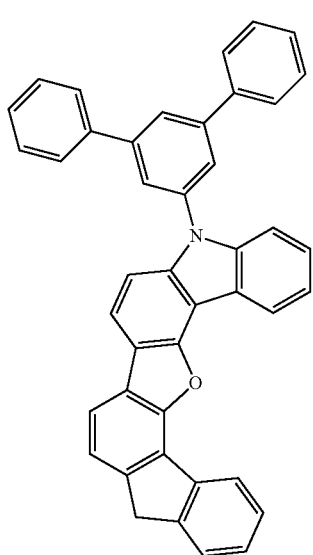
25
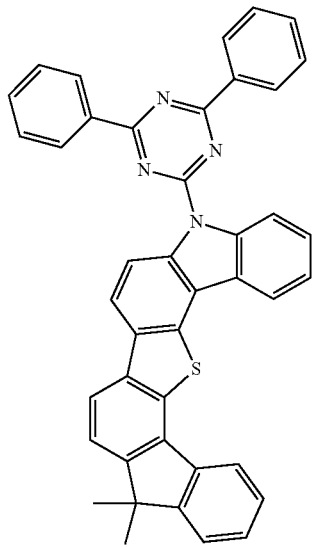
26
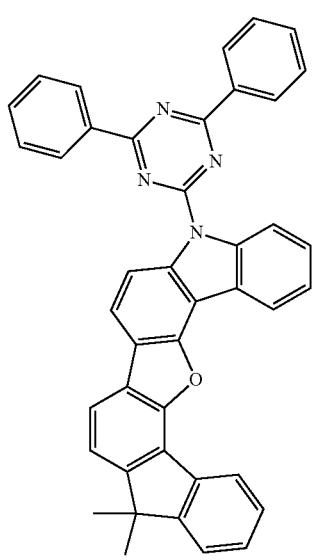
27
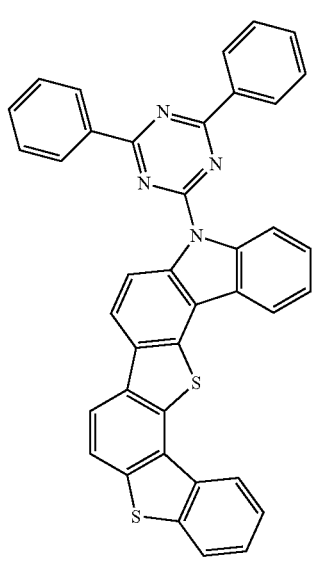

28
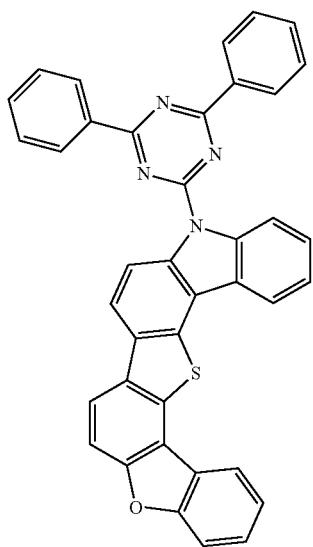
29
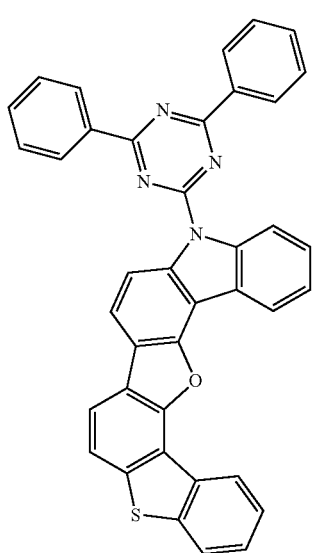
30
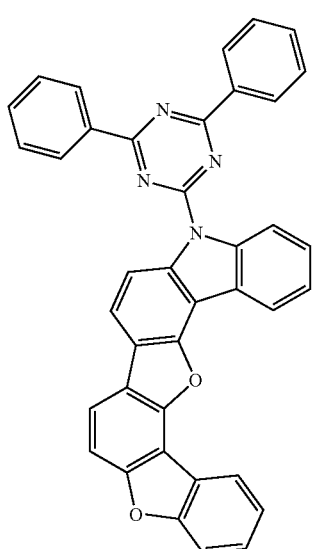
31
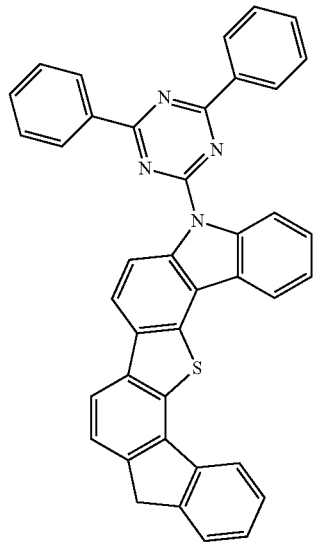
32
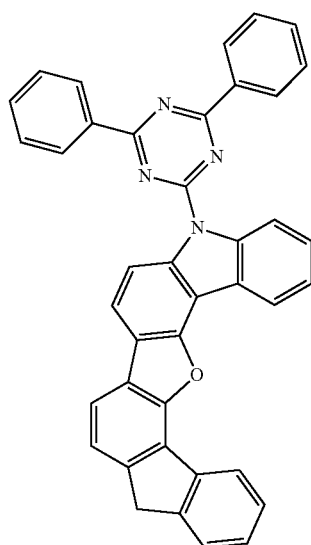
33
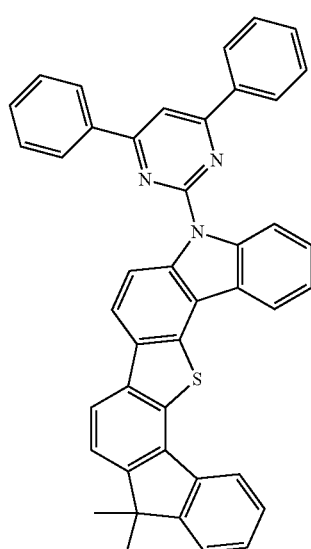

34
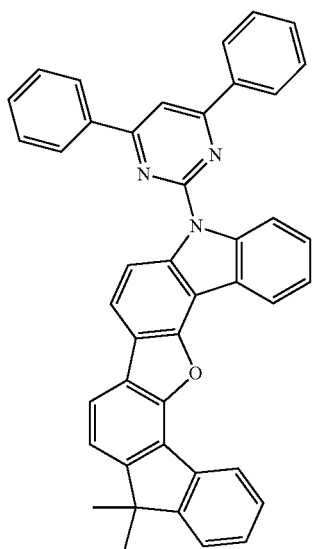
35
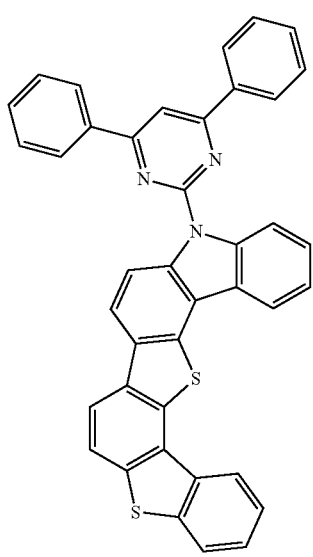
36
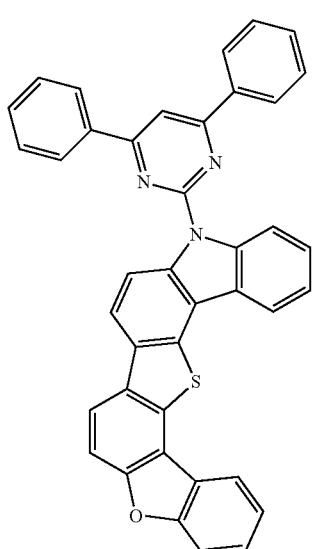
37
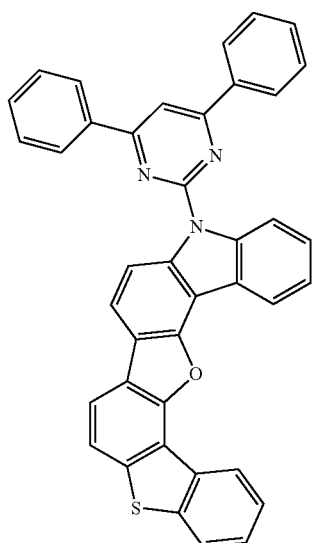
38
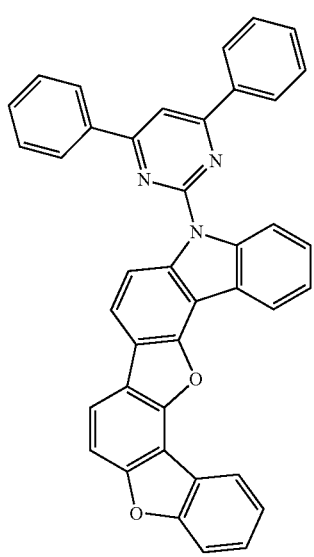
39
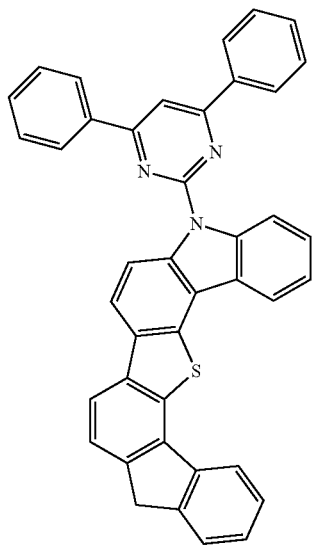

-continued
40
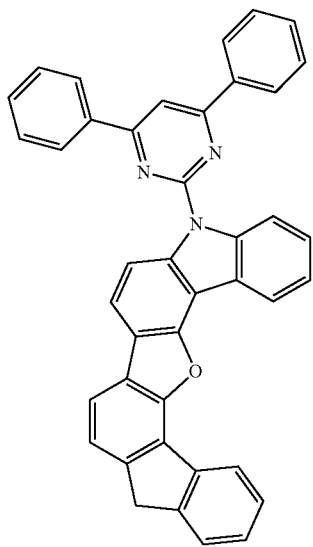
41
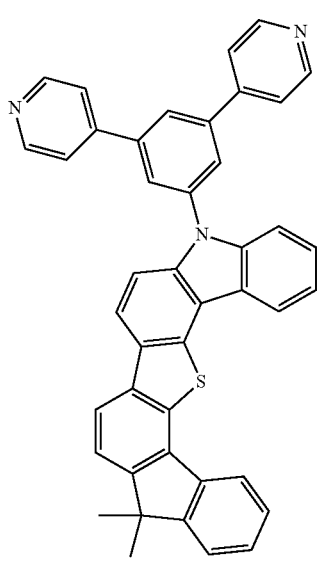
42
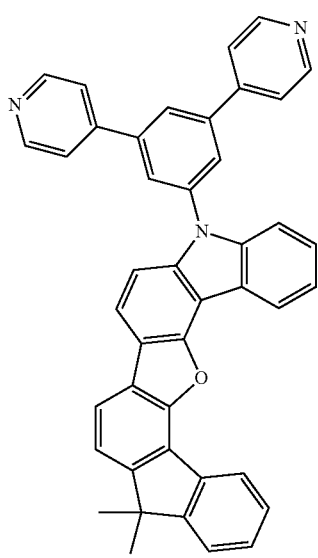
-continued
43
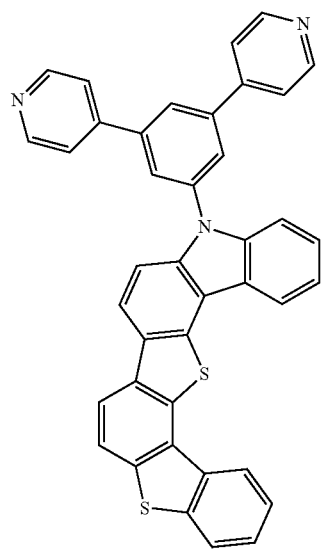
44
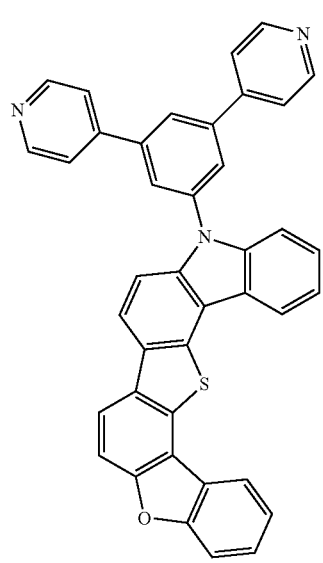
45
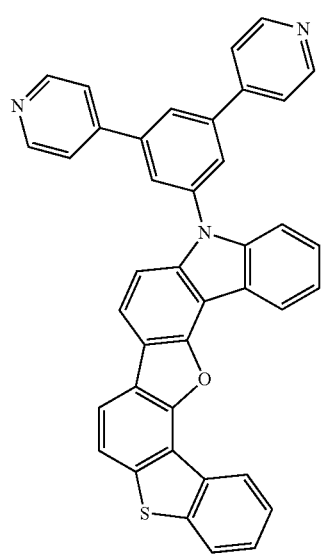

46
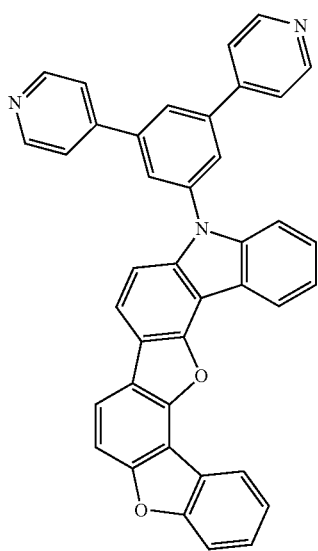
49
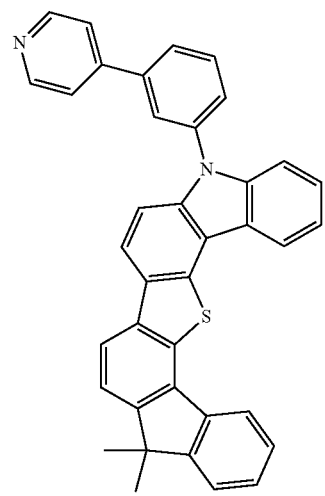
47
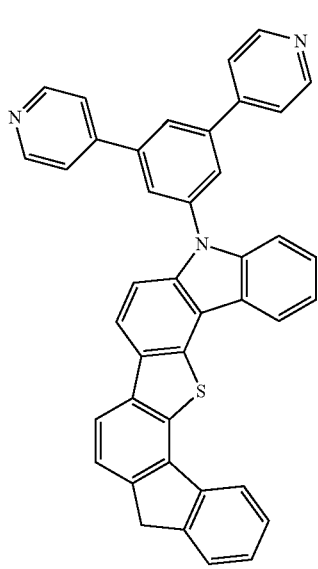
50
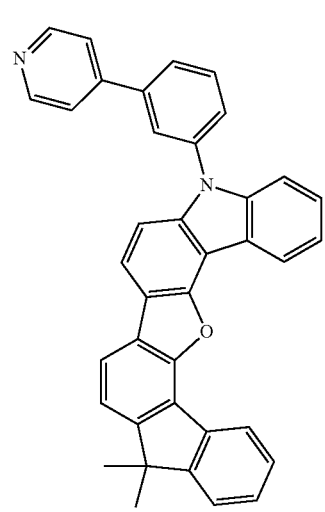
48
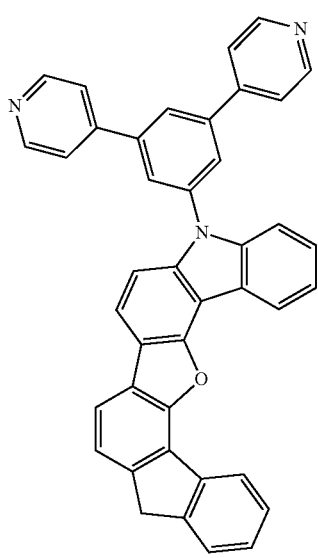
51
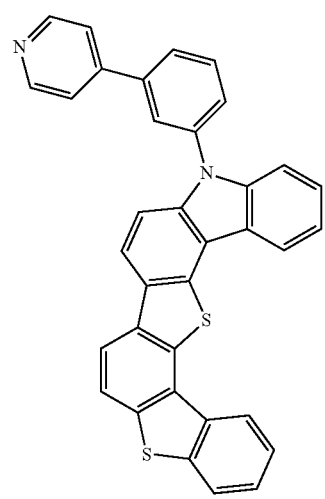

-continued
52
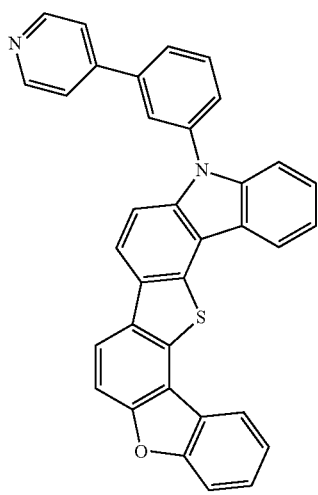
53
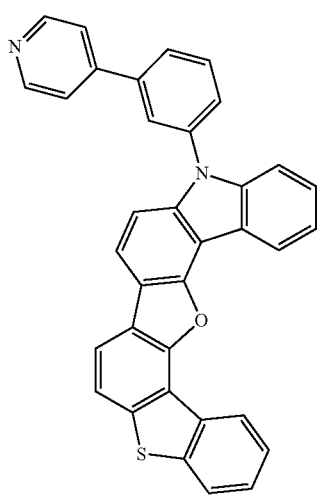
54
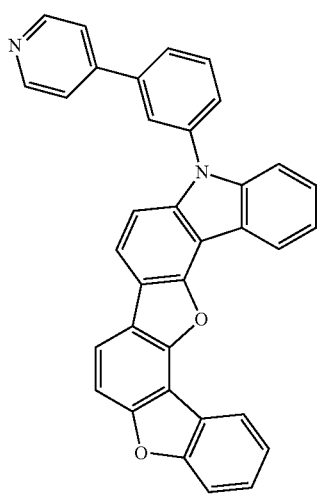
-continued
55
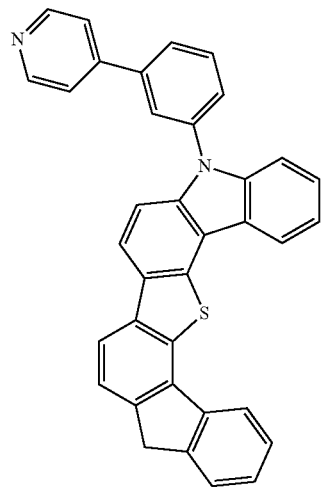
56
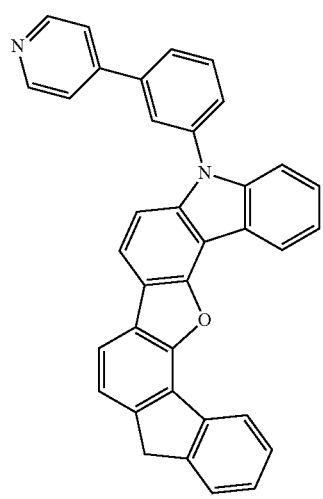
57
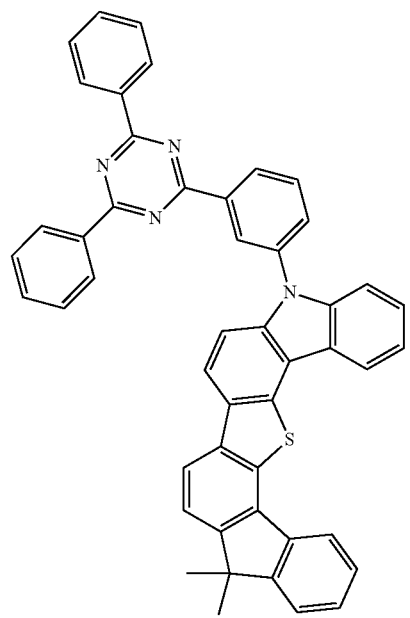

58
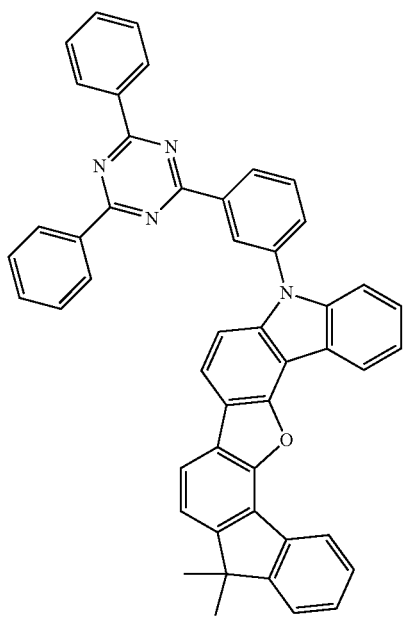
60
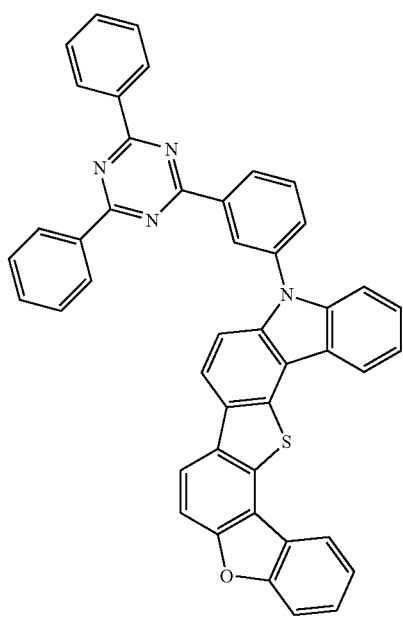
59
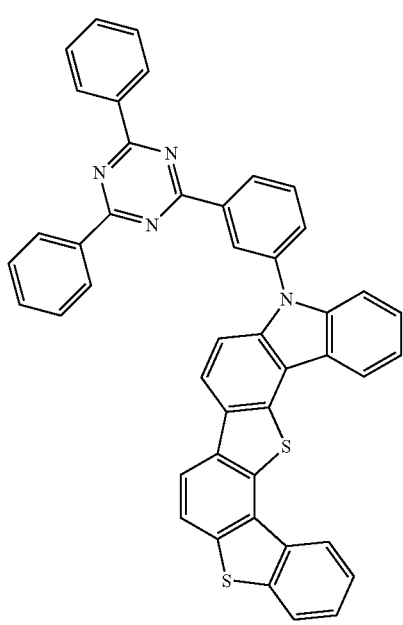
61
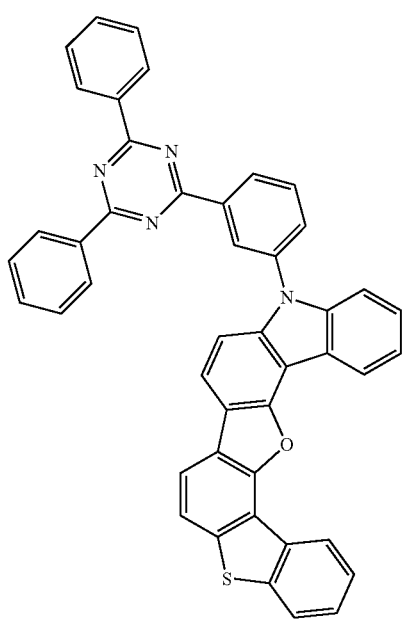

62
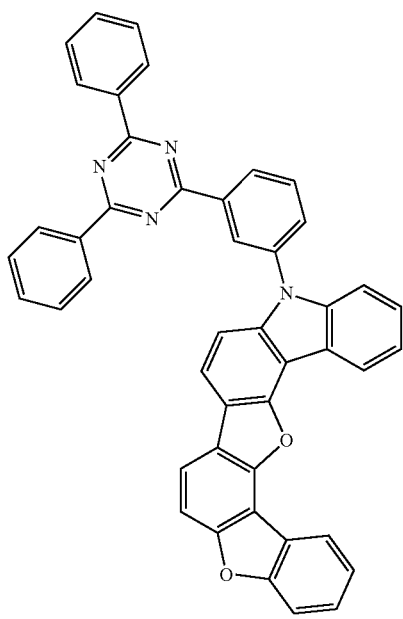
63
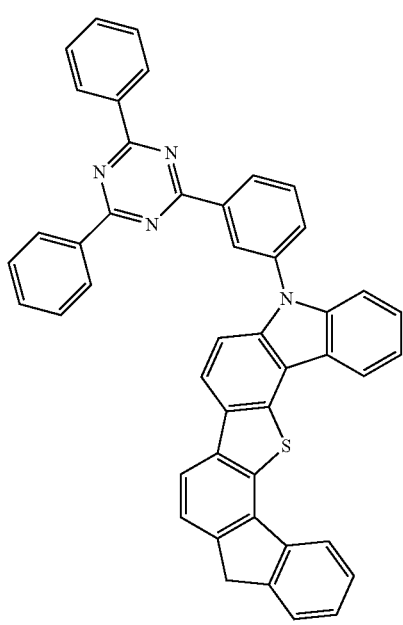
64
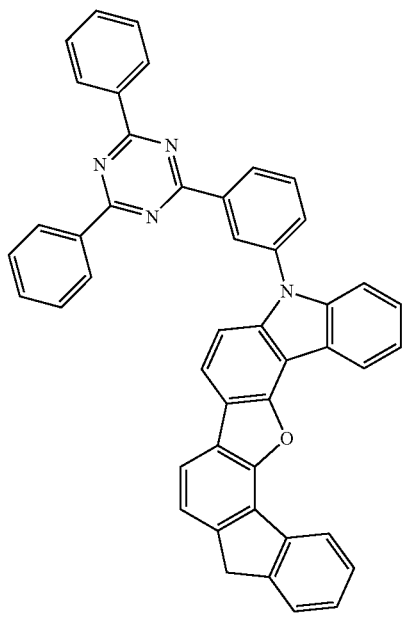
65
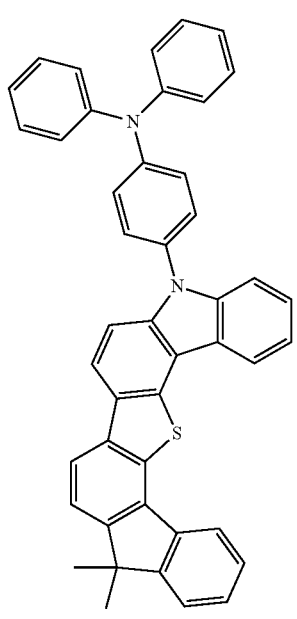

66
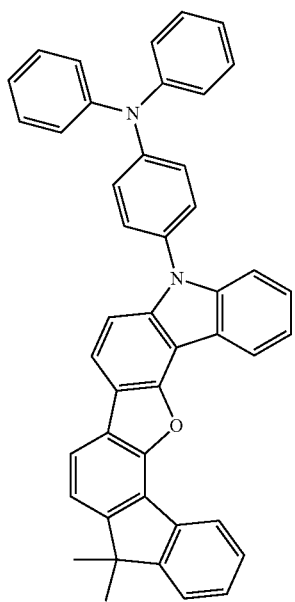
68
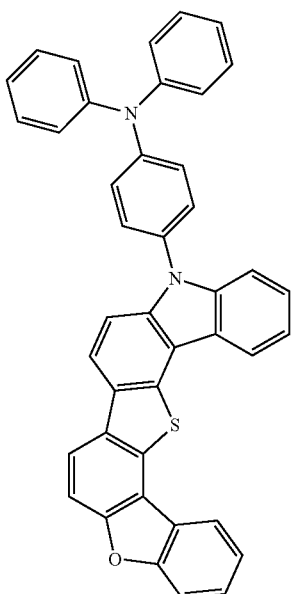
67
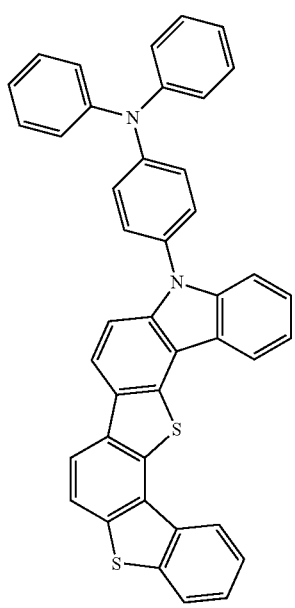
69
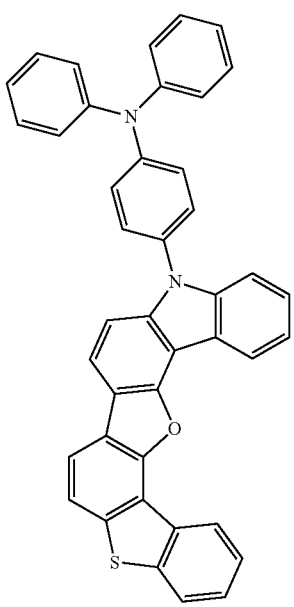

70
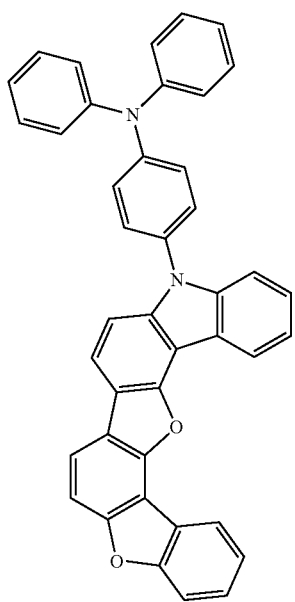
71
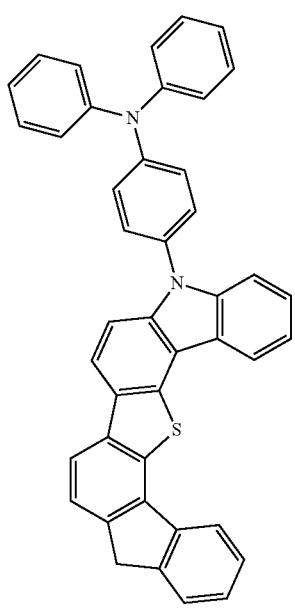
72
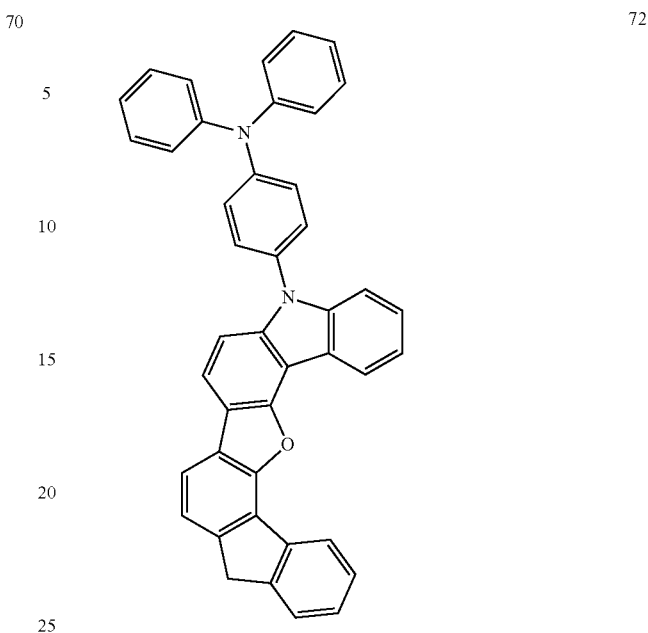
73
74
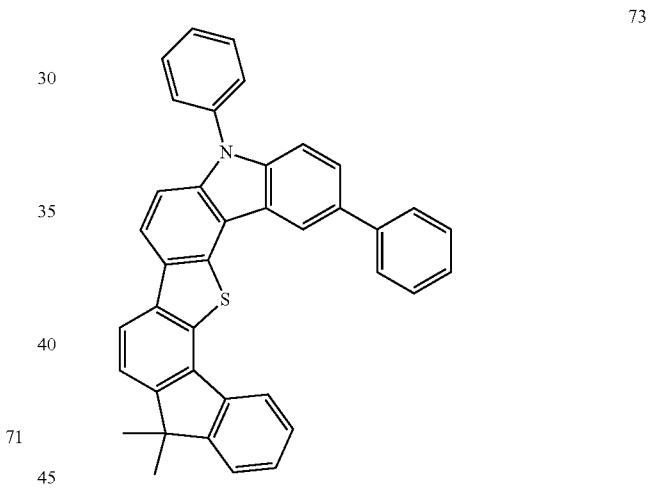
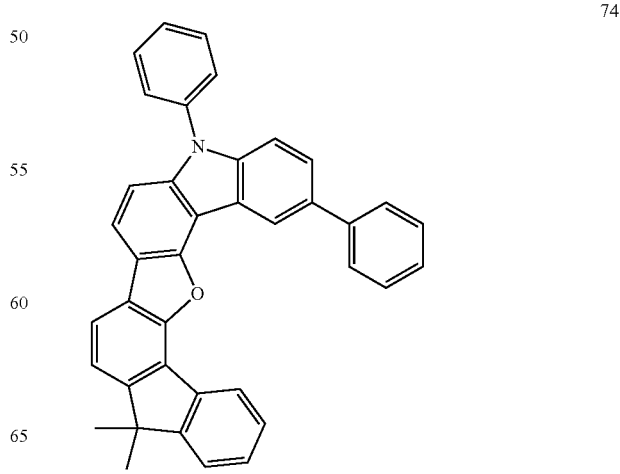

41
-continued
75
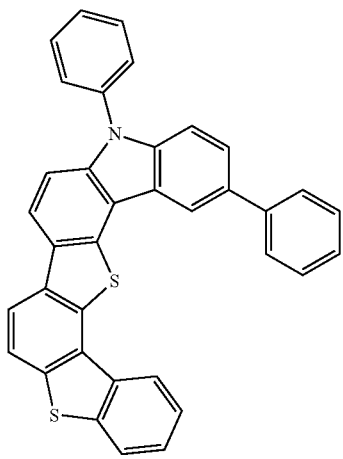
76
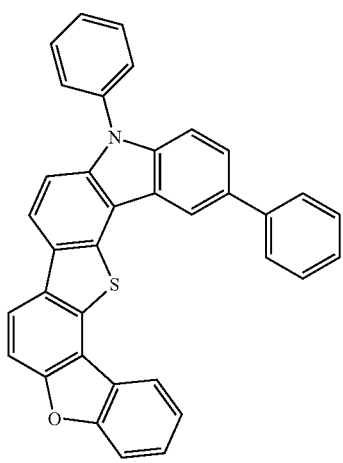
77
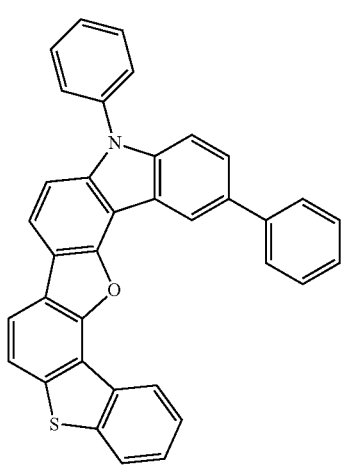
42
-continued
78
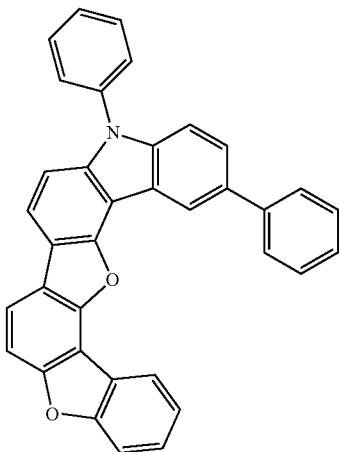
79
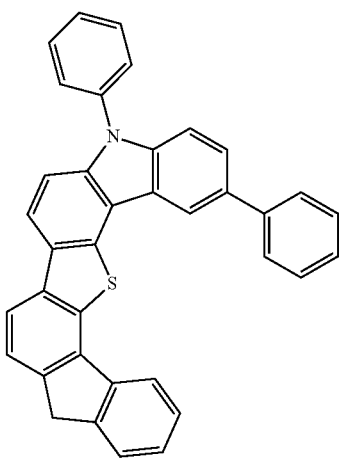
80
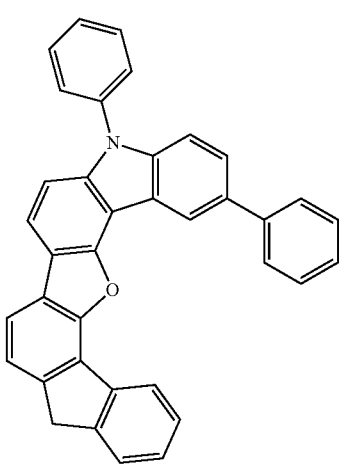

81
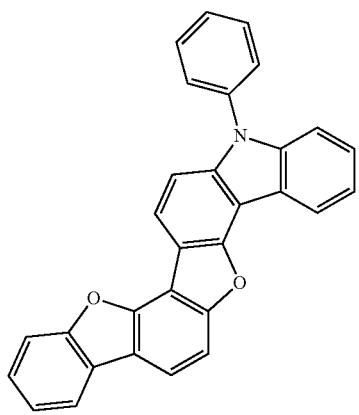
82
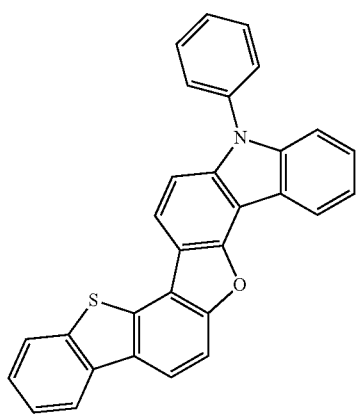
83
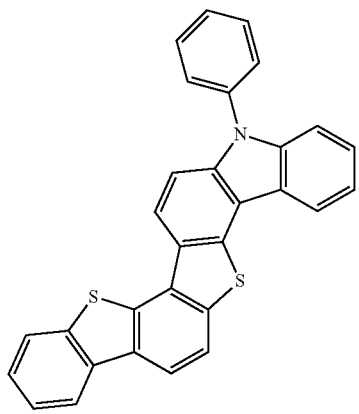
84
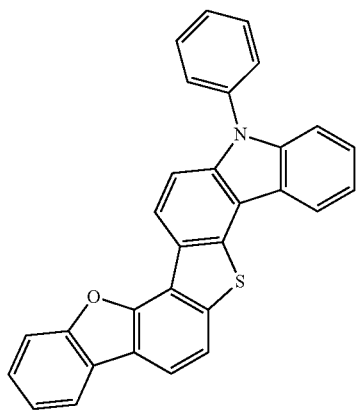
85
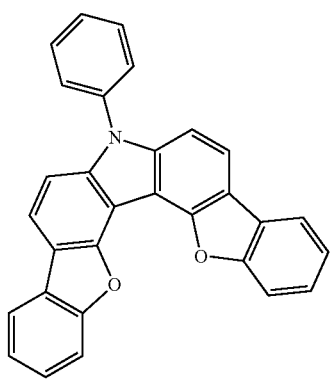
86
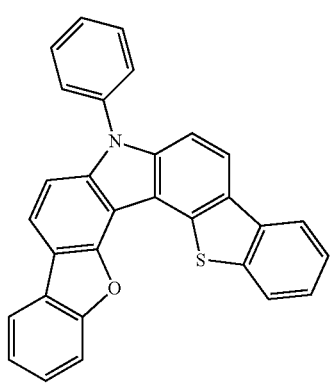
87
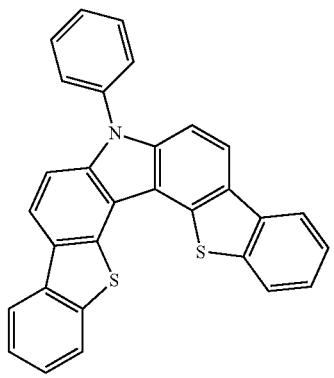
88
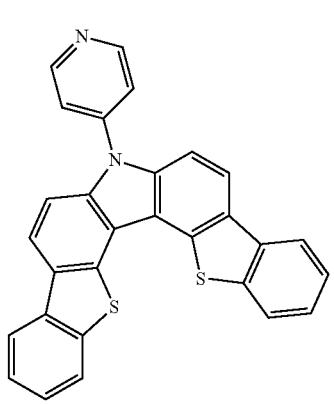

89
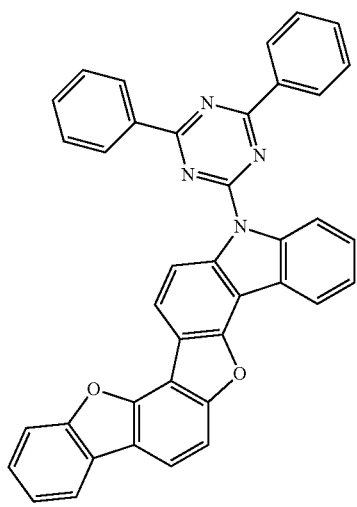
90
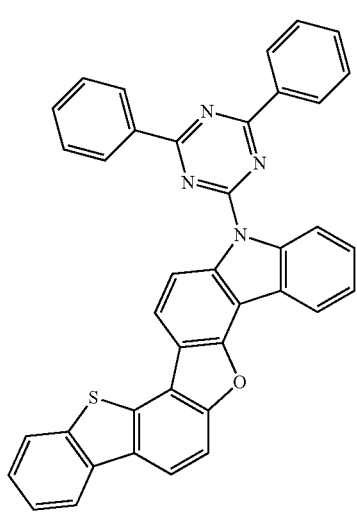
91
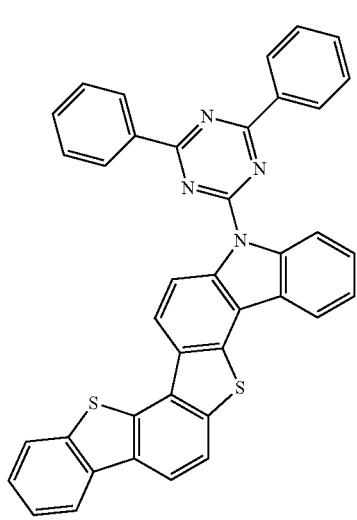
92
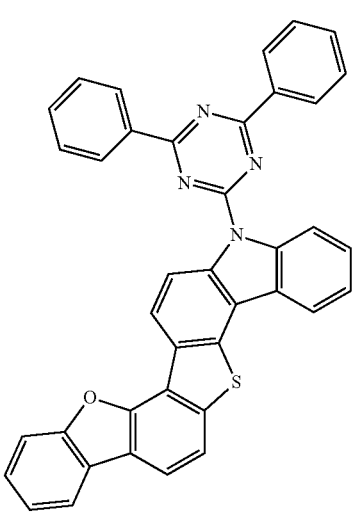
93
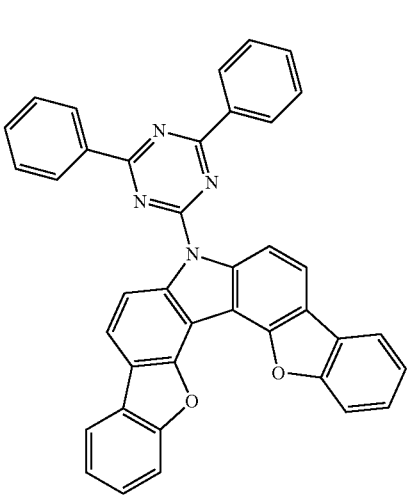
94
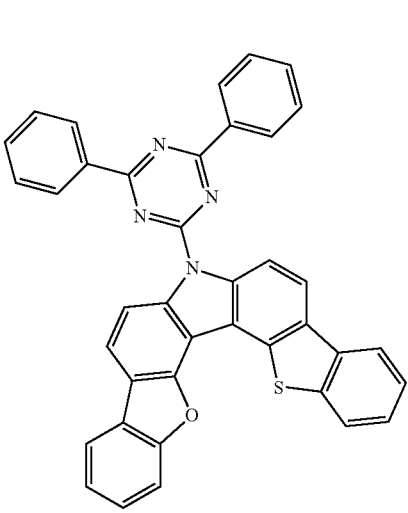

95
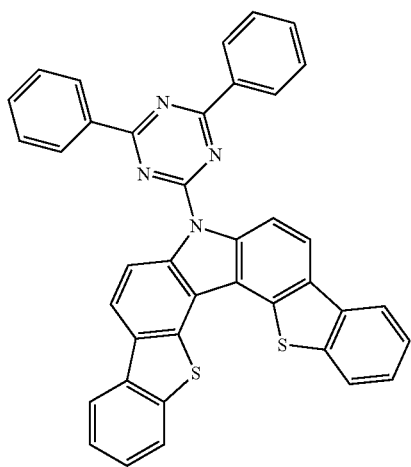
96
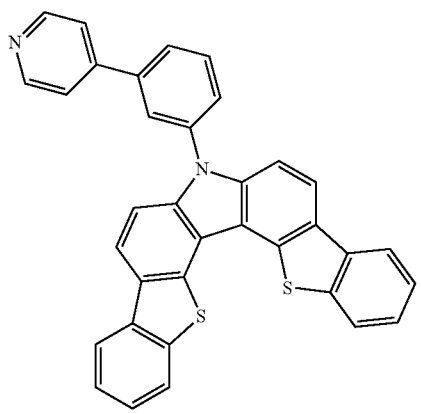
97
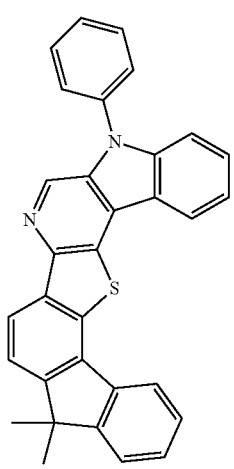
98
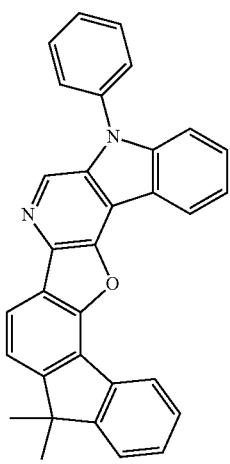
99
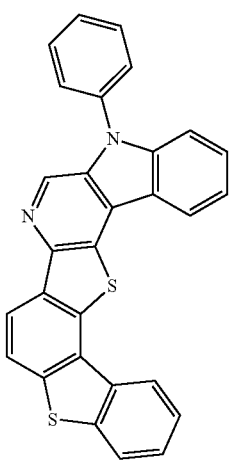
100
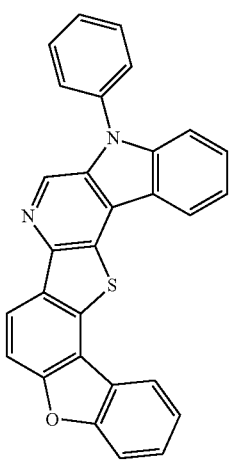

101
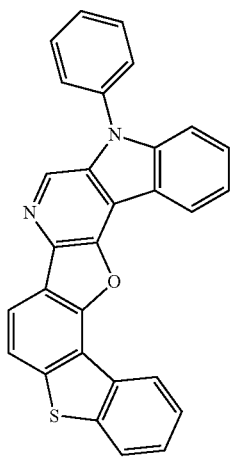
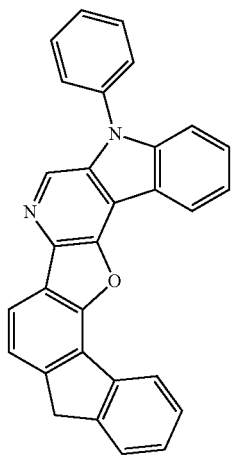
102
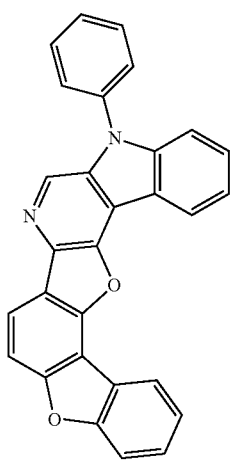
104
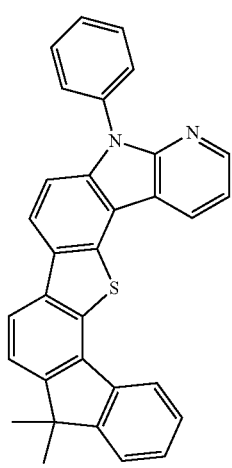
105
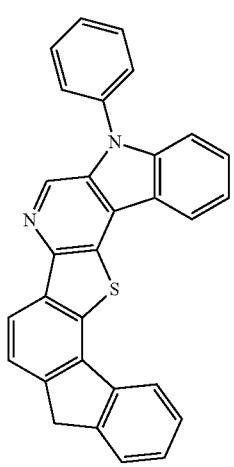
103
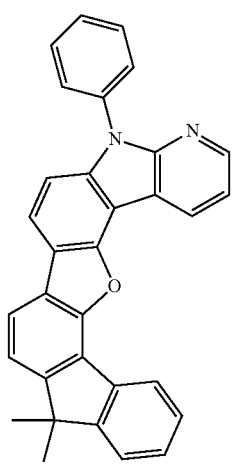
106

107
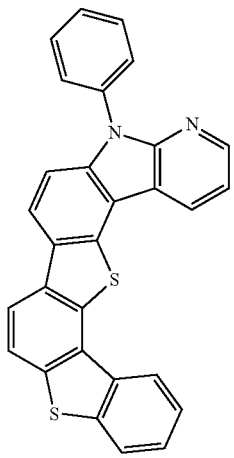
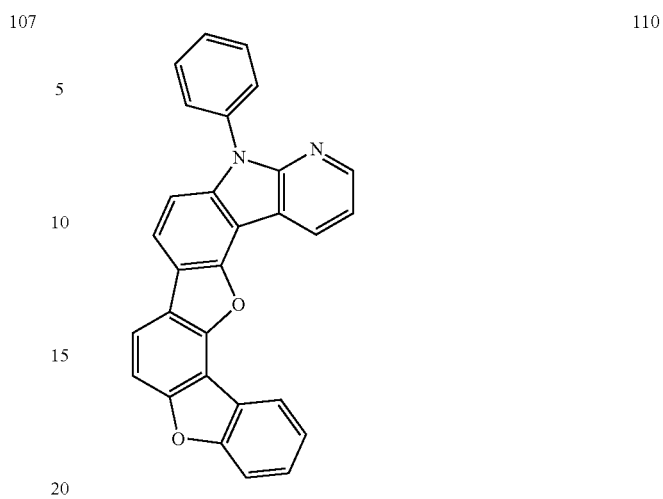
108
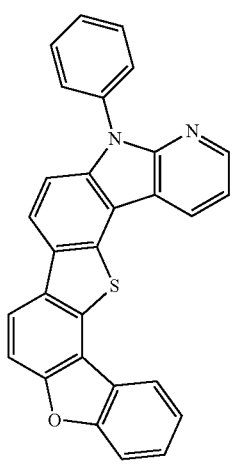
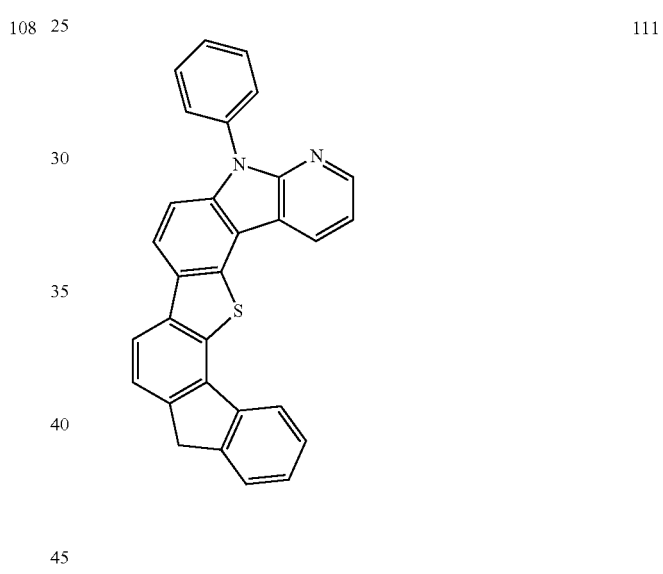
109
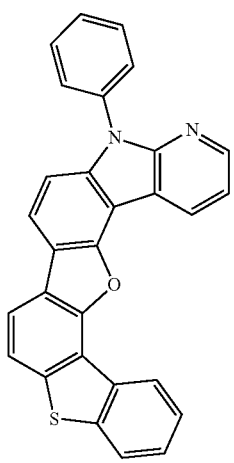
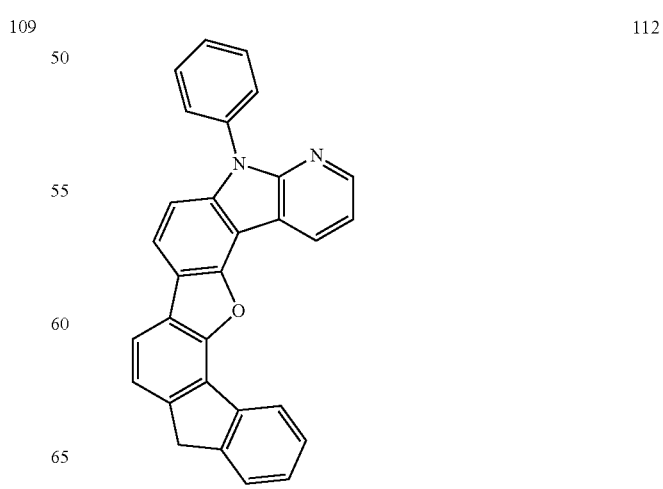
110
111
112

113
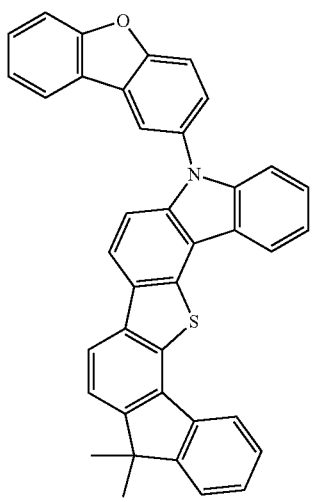
114
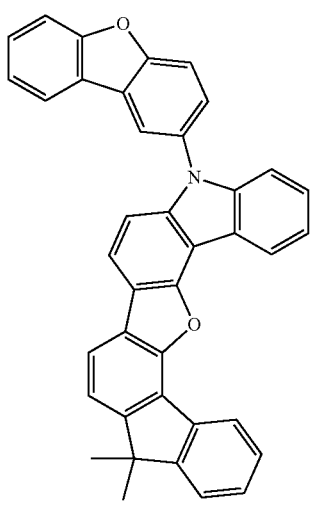
115
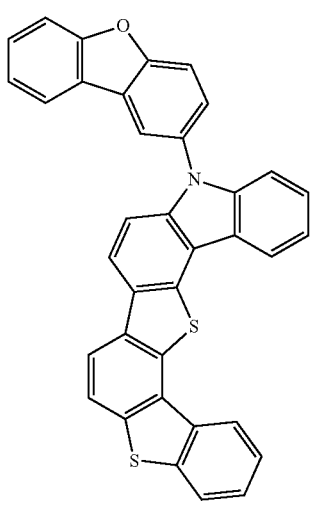
116
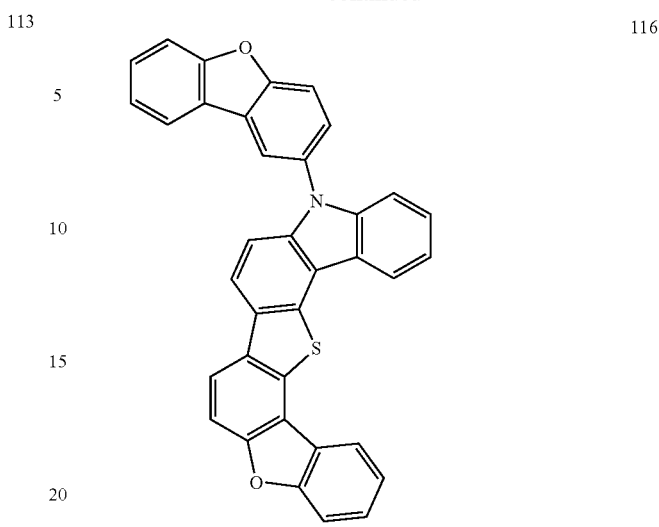
117
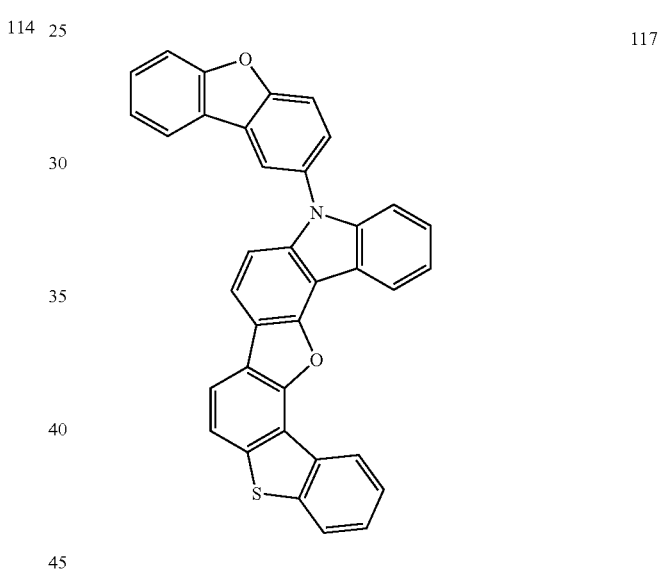
118
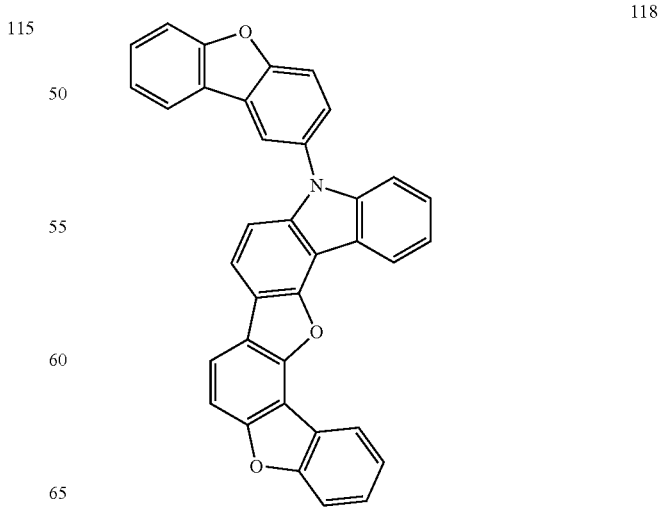

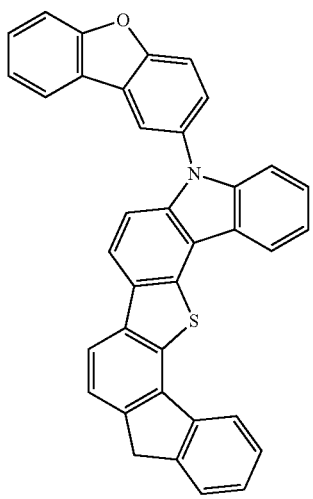
119
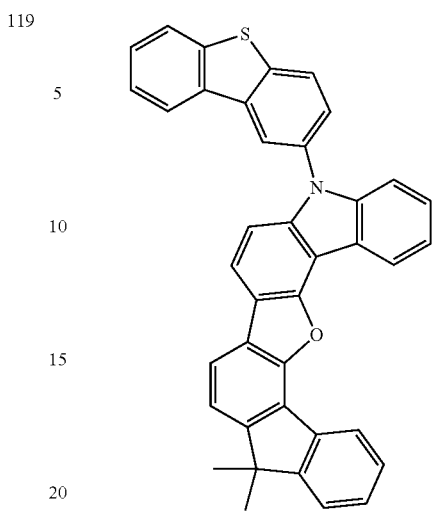
122
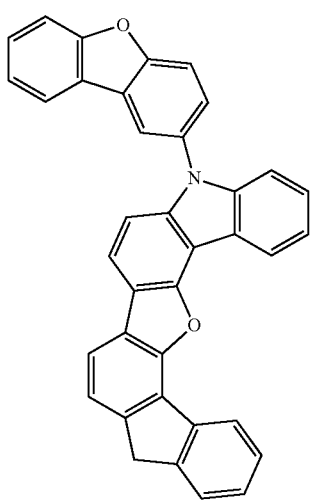
120
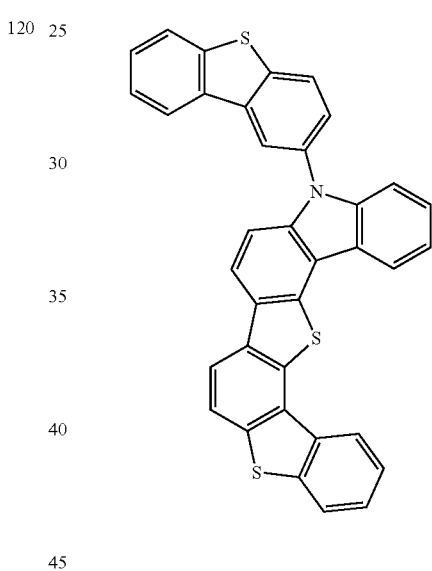
123
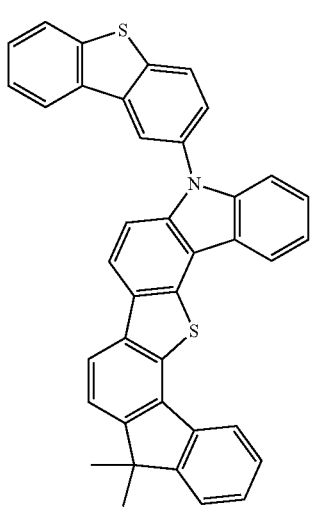
121
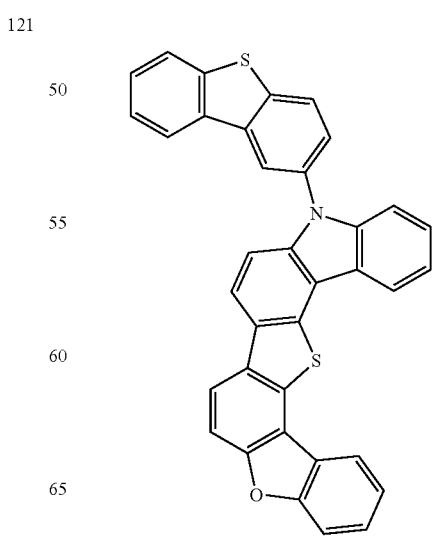
124

125
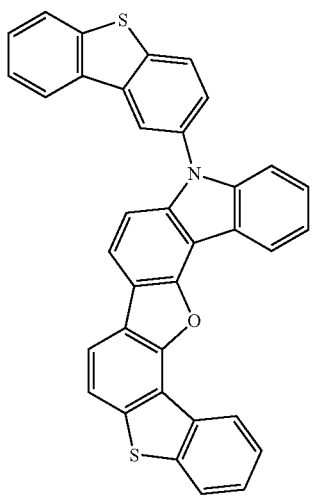
126
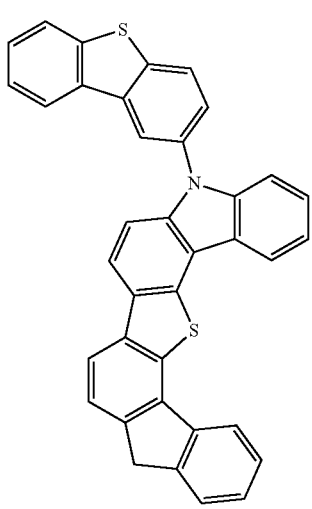
128
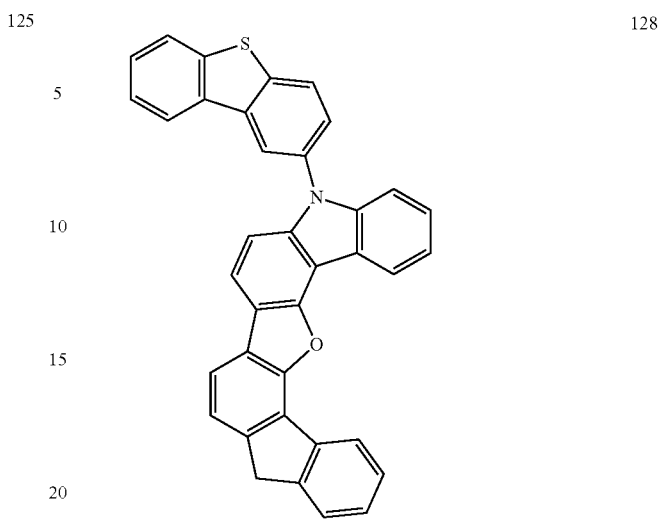
129
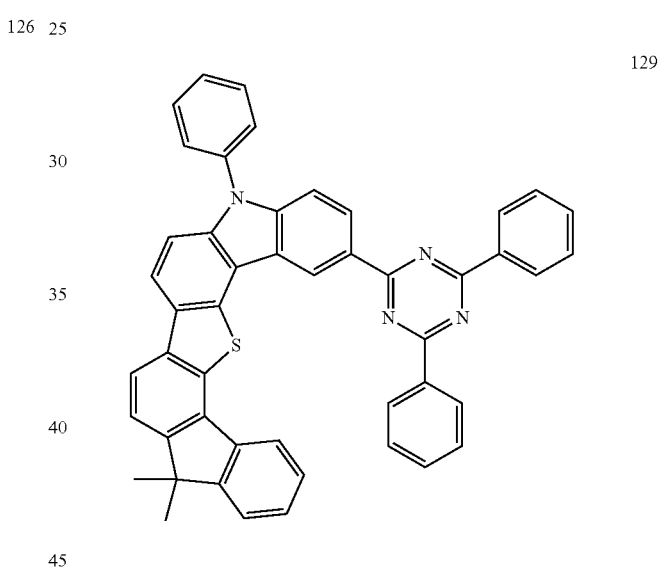
130
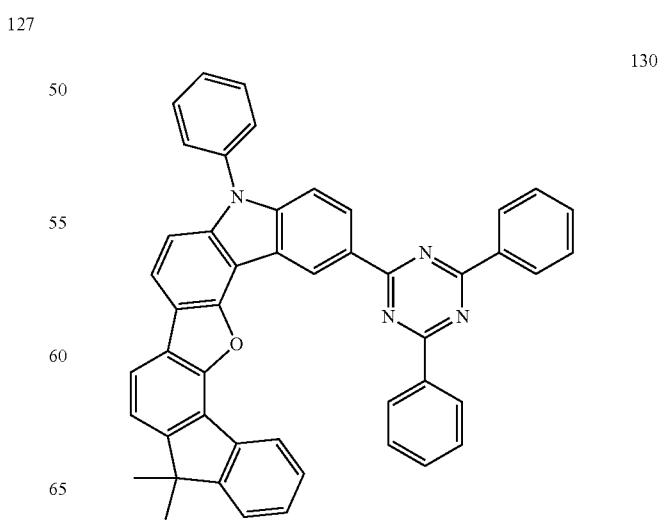

131
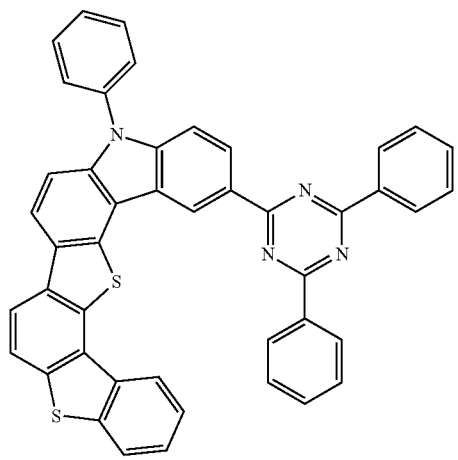
132
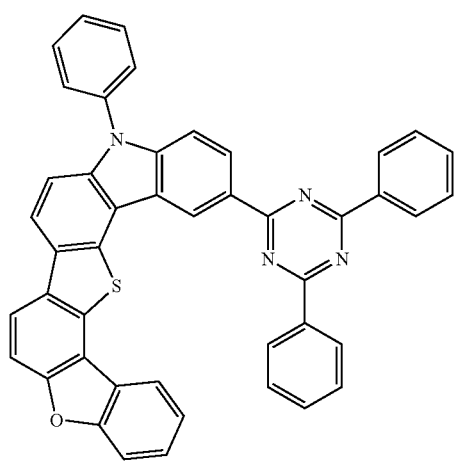
133
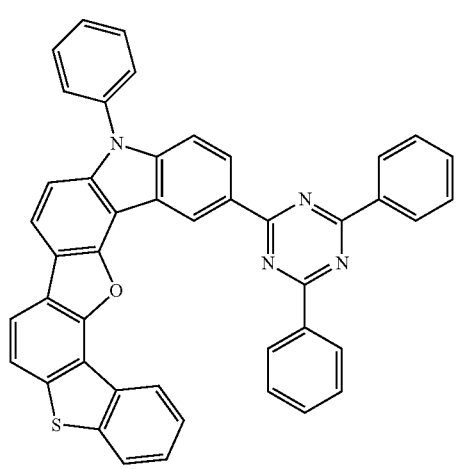
134
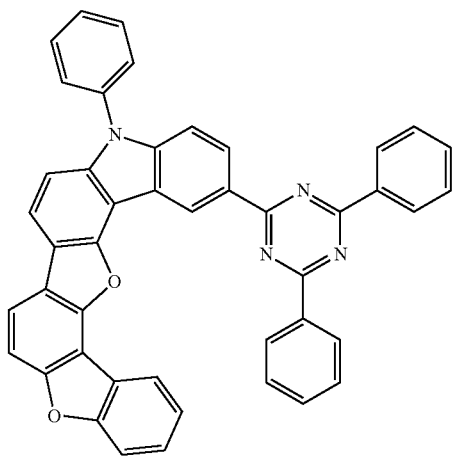
135
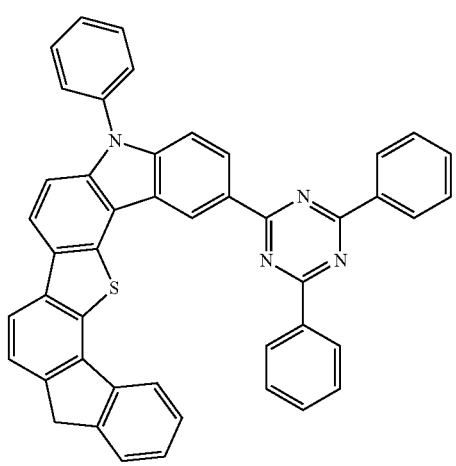
136
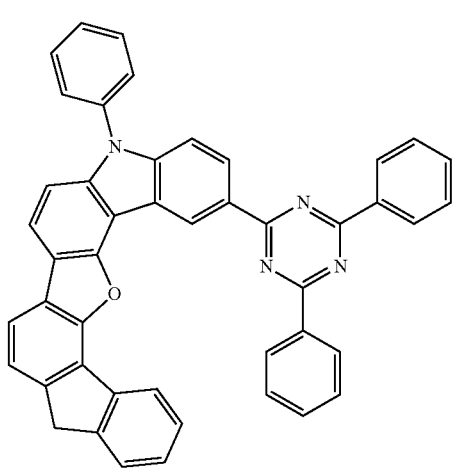

137
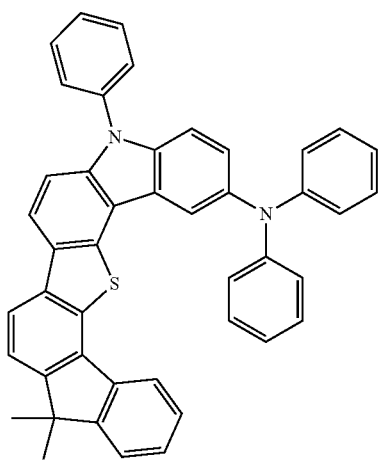
140
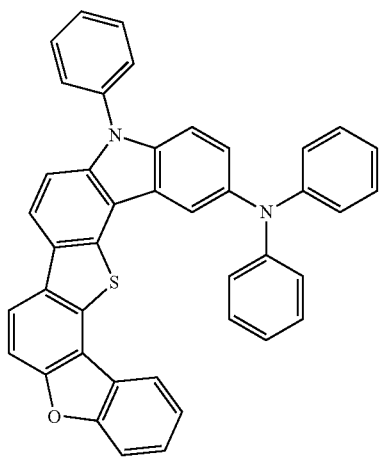
138
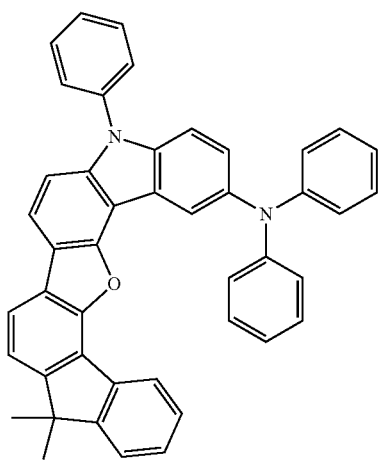
141
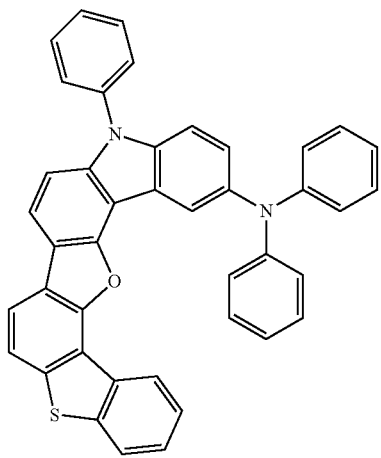
139
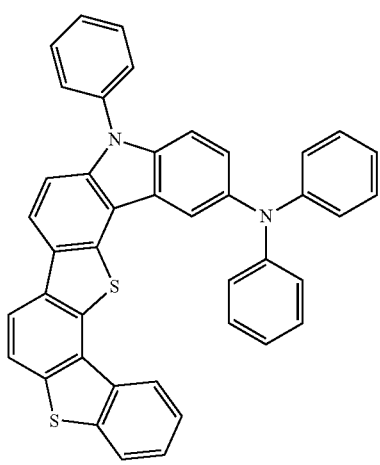
142
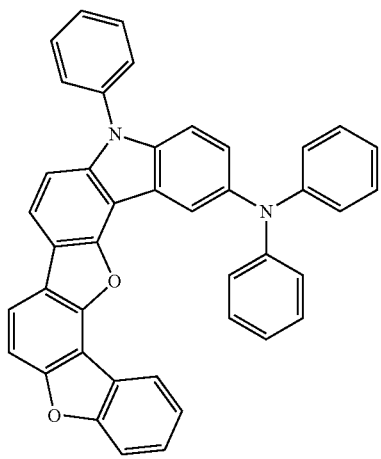

143
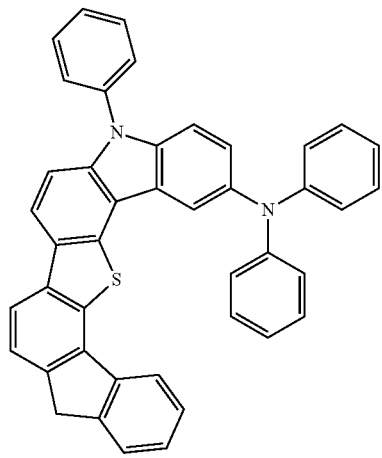
146
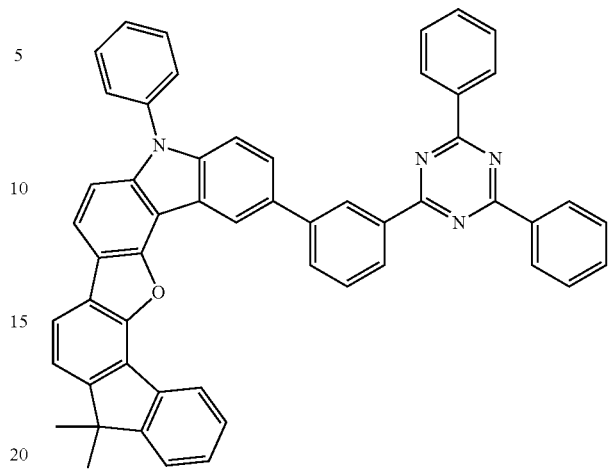
144
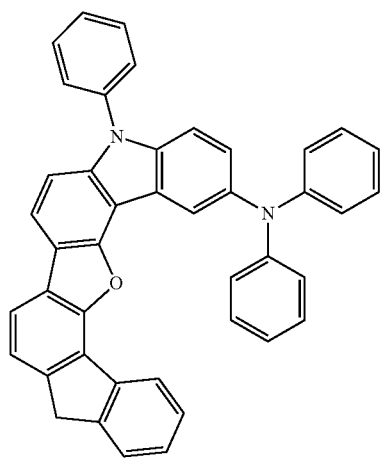
147
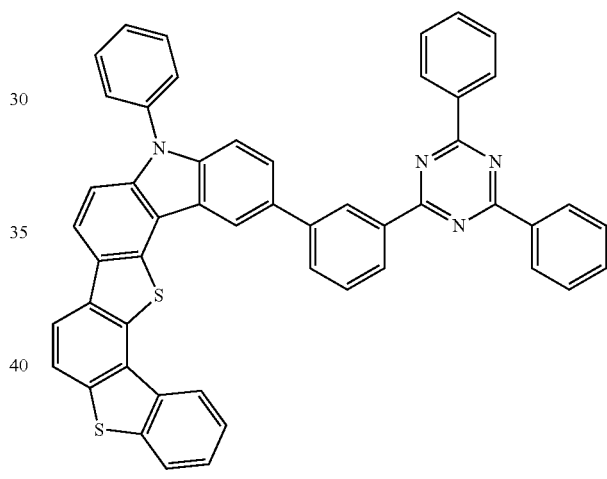
145
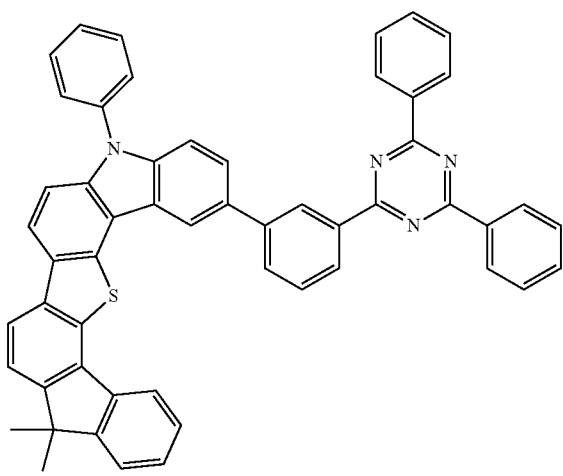
148
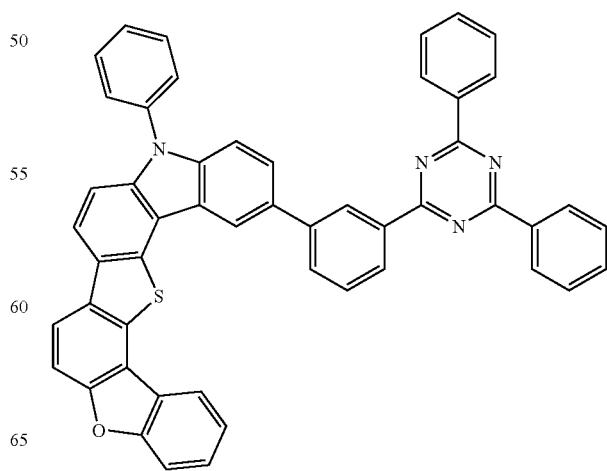

149
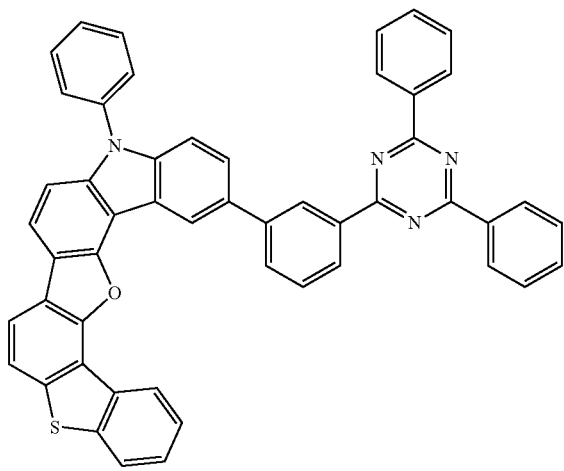
152
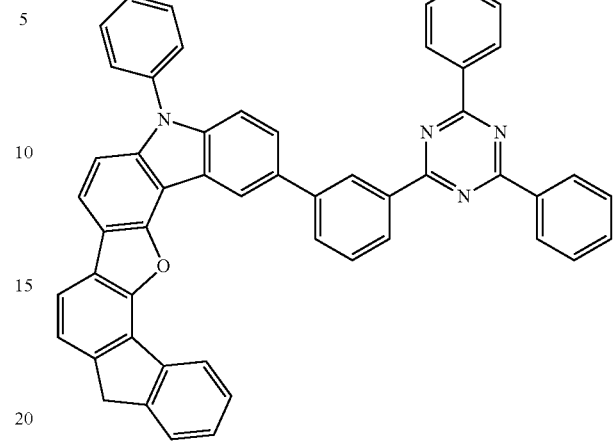
150
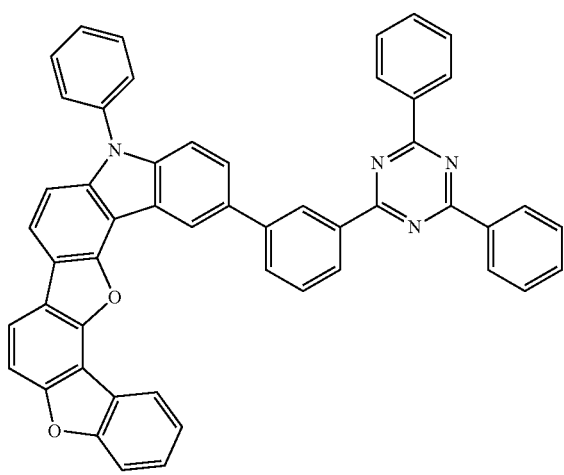
153
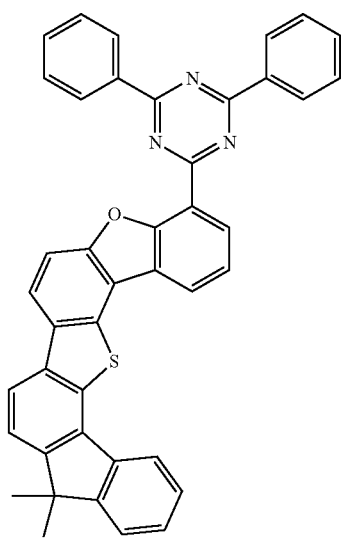
151
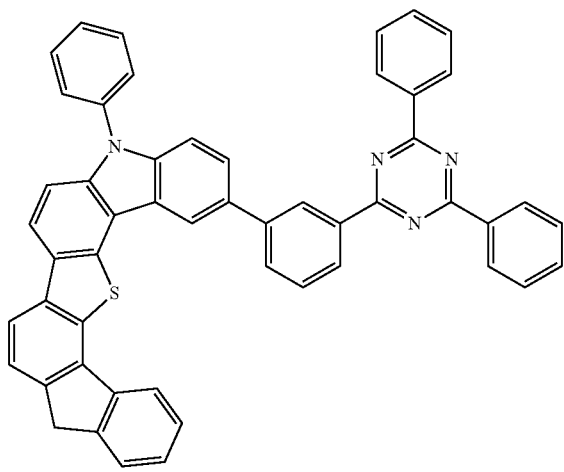
154
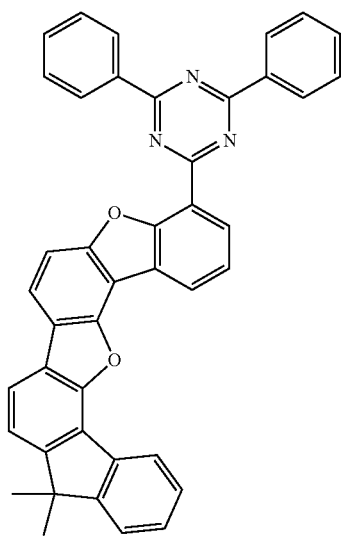

-continued
155
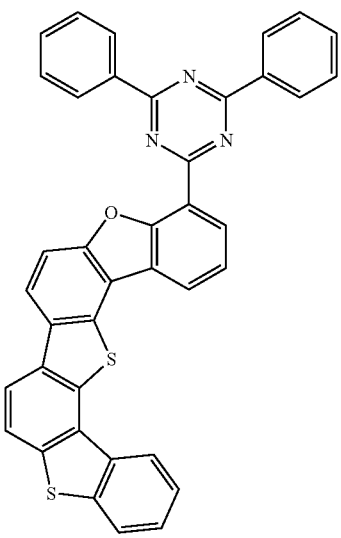
156
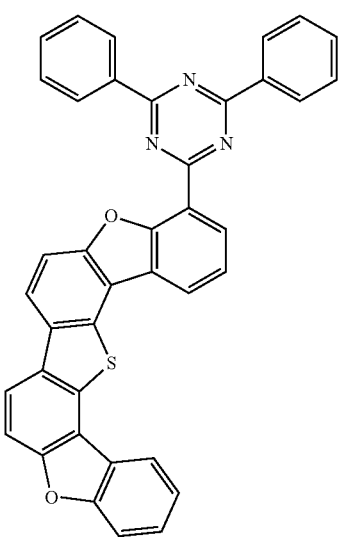
157
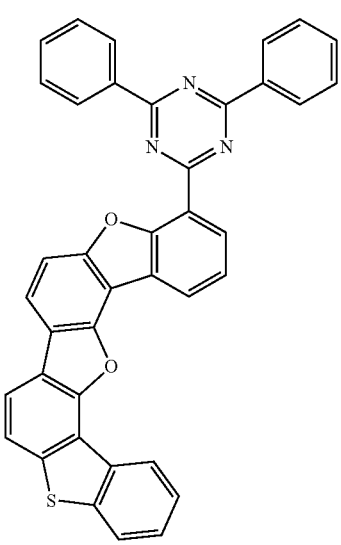
-continued
158
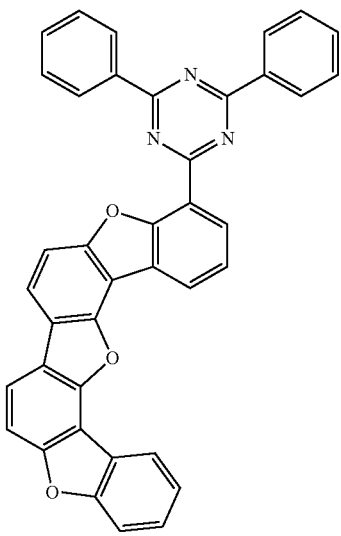
159
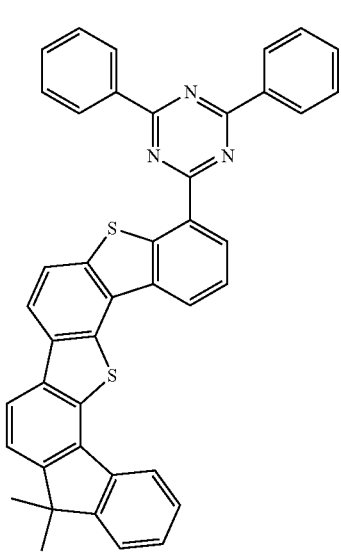
160
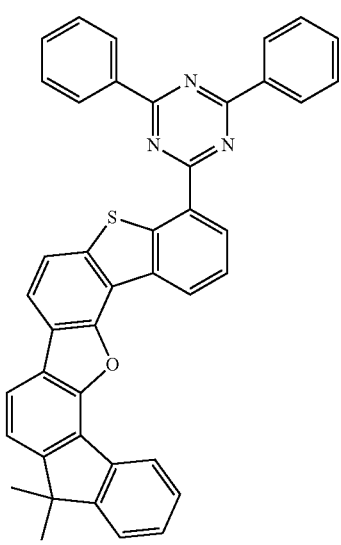

161 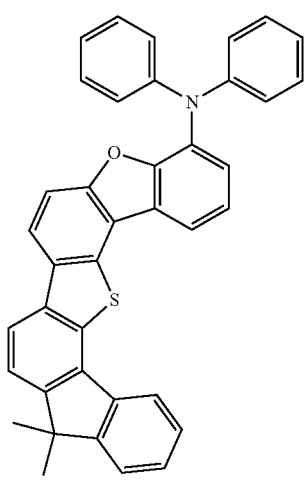
162 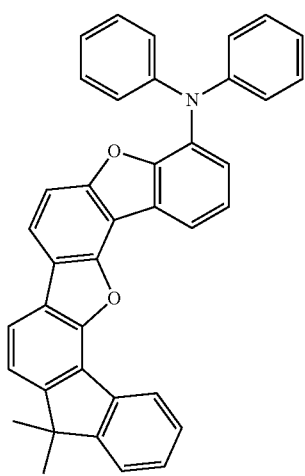
163 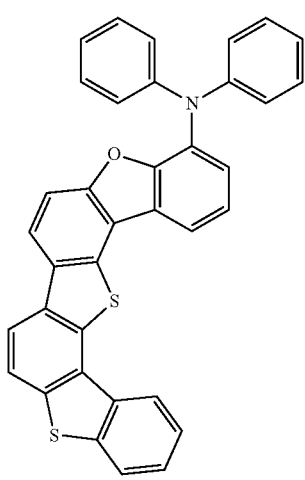
164 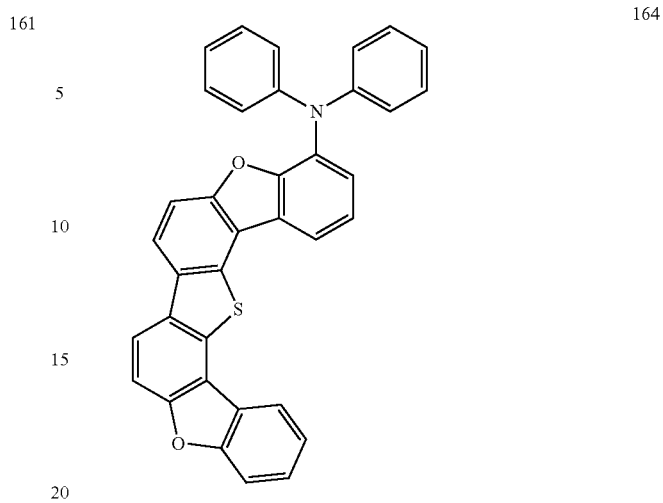
165 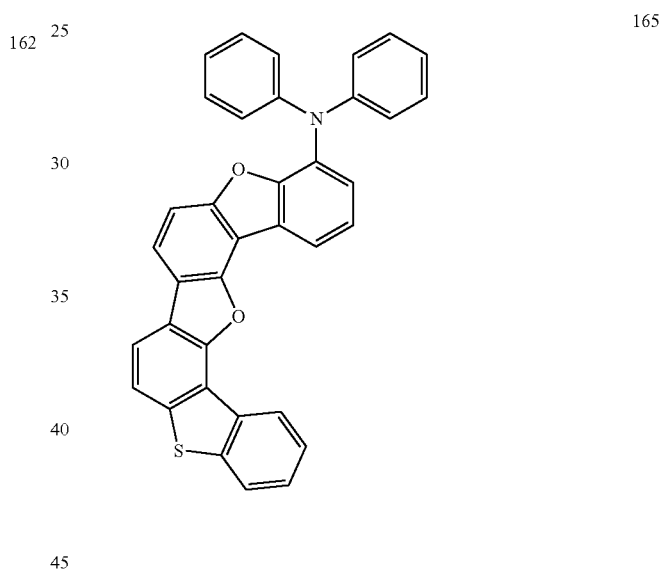
166 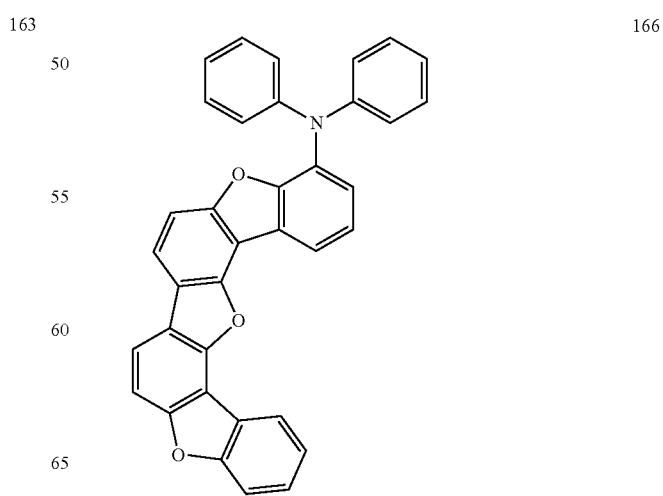

-continued

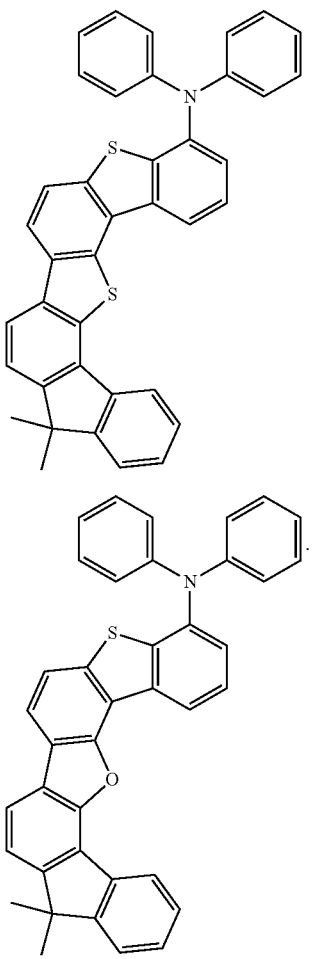

167

168

Hereinafter, an organic optoelectric device according to an example embodiment including an organic compound according to an embodiment is described.

According to the present example embodiment, the organic optoelectric device may be a suitable device to convert electrical energy into photoenergy or vice versa, and may be, for example, an organic photoelectric device, an organic light emitting diode, an organic solar cell, an organic photo-conductor drum, etc.

Herein, an organic light emitting diode as an example of an organic optoelectric device is described referring to the drawings.

FIGS. 1 and 2 illustrate cross-sectional views of organic light emitting diodes according to example embodiments.

In the example embodiment shown in FIG. 1, an organic light emitting diode 100 includes an anode 120 and a cathode 110 facing each other, and an organic layer 105 interposed between the anode 120 and cathode 110.

The anode 120 may be made of a conductor having a high work function to help hole injection, and may be, for example, metal, metal oxide, and/or a conductive polymer. The anode 120 may be, for example, a metal nickel, platinum, vanadium, chromium, copper, zinc, gold, and the like or an alloy thereof; a metal oxide such as zinc oxide, indium oxide, indium tin oxide (ITO), indium zinc oxide (IZO), and the like; a combination of metal and oxide such as ZnO and Al or $SnO_2$ and Sb; a conductive polymer such as poly(3-methylthiophene), poly(3,4-(ethylene-1,2-dioxy)thiophene) (PEDT), polypyrrole, and polyaniline, etc.

The cathode 110 may be made of a conductor having a low work function to help electron injection, and may be, for example, metal, metal oxide and/or a conductive polymer. The cathode 110 may be, for example, a metal or an alloy thereof such as magnesium, calcium, sodium, potassium, titanium, indium, yttrium, lithium, gadolinium, aluminum, silver, tin, lead, cesium, barium, and the like; a multi-layer structure material such as LiF/Al, $LiO_2$/Al, LiF/Ca, LiF/Al and $BaF_2$/Ca, etc.

The organic layer 105 may include an emission layer 130 including an above-described organic compound according to an embodiment.

The emission layer 130 may include for example, the organic compound alone, a mixture of at least two kinds of the organic compound, or a mixture of the organic compound and other compounds. When the organic compound is mixed with other compounds, for example, they may be mixed as a host and a dopant, and the organic compound may be, for example, a host. The host may be, for example, a phosphorescent host or fluorescent host, and may be, for example, a green phosphorescent host.

When the organic compound is included as a host, a dopant may be an inorganic, organic, or organic/inorganic compound, and may be selected from general dopants.

In the example embodiment shown in FIG. 2, an organic light emitting diode 200 further includes a hole auxiliary layer 140 as well as the emission layer 130. The hole auxiliary layer 140 may further increase hole injection and/or hole mobility between the anode 120 and emission layer 130 and may block electrons. The hole auxiliary layer 140 may be, for example, a hole transport layer (HTL), a hole injection layer (HIL), and/or an electron blocking layer, and may include at least one layer. The organic compound may be included in the emission layer 130 and/or the hole auxiliary layer 140.

In an example embodiment, an organic light emitting diode may further include an auxiliary electron transport layer, an electron transport layer (ETL), an electron injection layer (EIL), an auxiliary hole injection layer, a hole injection layer (HIL), and the like, as an organic thin layer 105 in FIG. 1 or FIG. 2. The organic compound may be included in the emission layer 130 and/or the hole auxiliary layer 140 or in the auxiliary electron transport layer (ETL), electron transport layer (ETL), electron injection layer (EIL), auxiliary hole transport layer (HTL), and/or hole injection layer (HIL).

The organic light emitting diodes 100 and 200 may be manufactured by, e.g., forming an anode or a cathode on a substrate, forming an organic layer in accordance with a dry coating method such as evaporation, sputtering, plasma plating, and ion plating, or a wet coating method such as spin coating, slit coating, dipping, flow coating, and inkjet printing; and forming a cathode or an anode thereon.

The organic light emitting diode may be applied to an organic light emitting diode (OLED) display.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Organic Compound

[Representative Reaction Scheme 1]
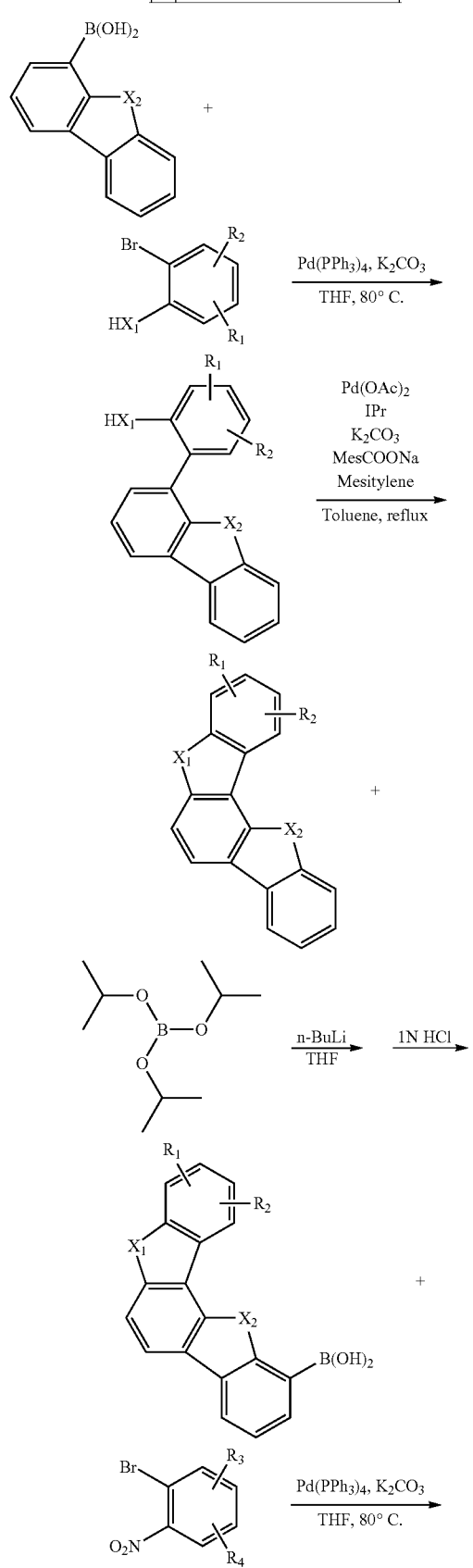
[Representative Reaction Scheme 2]
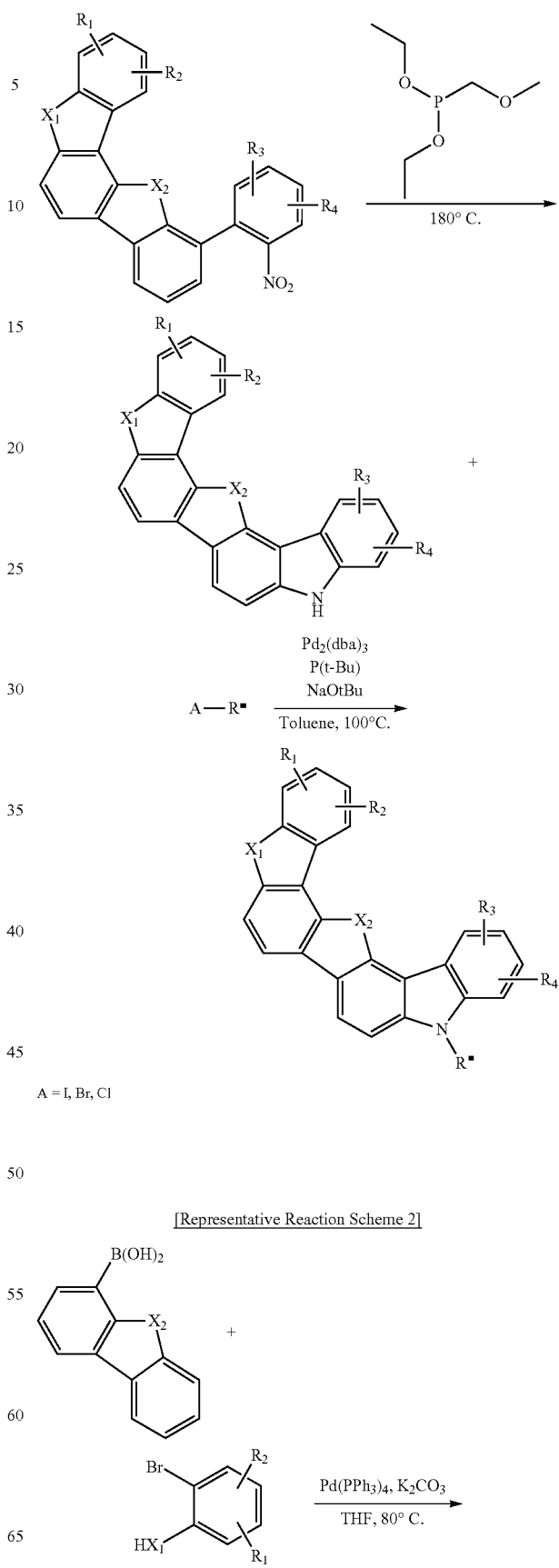
A = I, Br, Cl

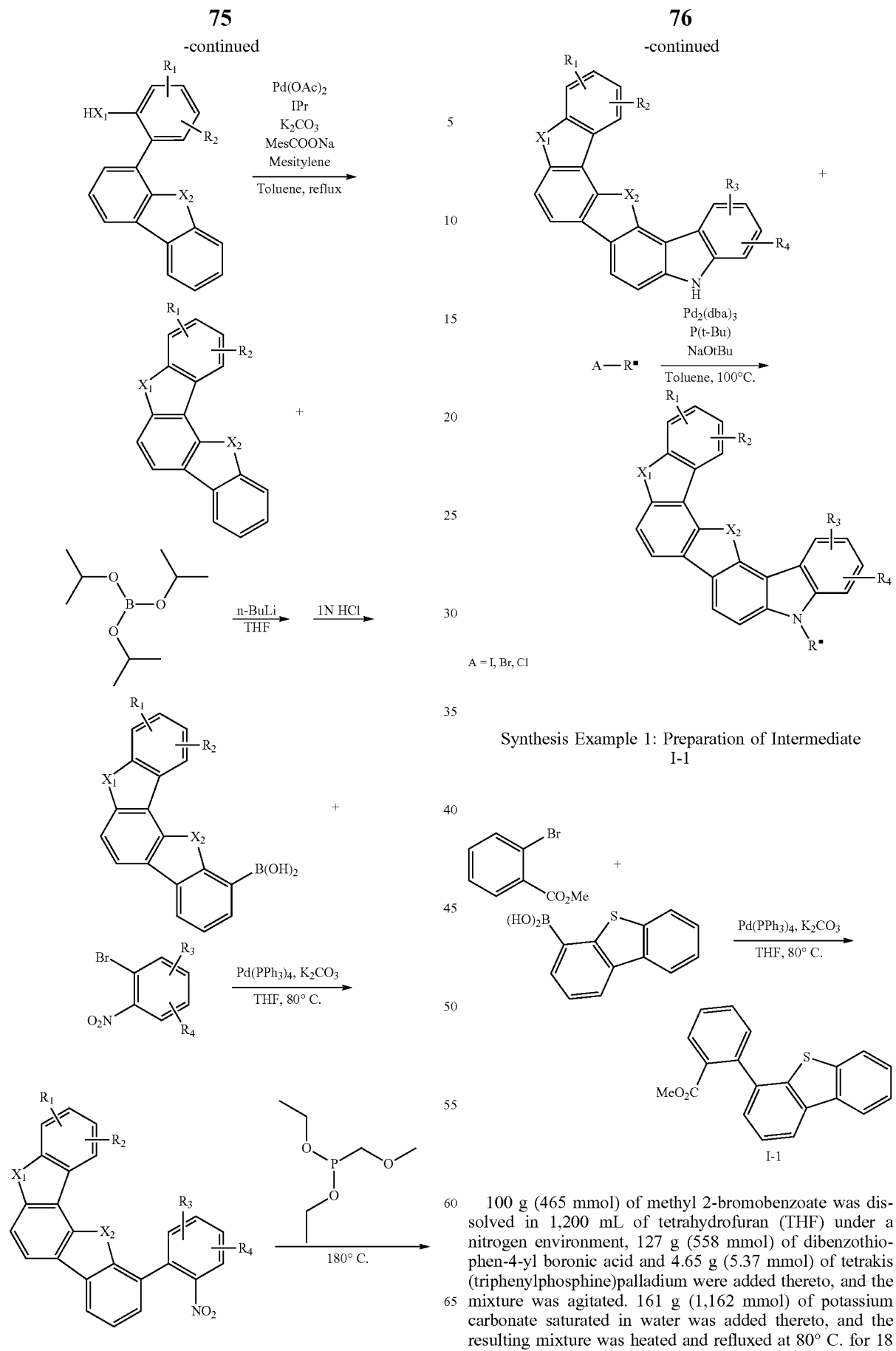

Synthesis Example 1: Preparation of Intermediate I-1

100 g (465 mmol) of methyl 2-bromobenzoate was dissolved in 1,200 mL of tetrahydrofuran (THF) under a nitrogen environment, 127 g (558 mmol) of dibenzothiophen-4-yl boronic acid and 4.65 g (5.37 mmol) of tetrakis(triphenylphosphine)palladium were added thereto, and the mixture was agitated. 161 g (1,162 mmol) of potassium carbonate saturated in water was added thereto, and the resulting mixture was heated and refluxed at 80° C. for 18 hours. When the reaction was complete, water was added to the reaction solution, the mixture was extracted with dichloromethane (DCM) and treated with anhydrous MgSO$_4$ to remove moisture, and the extract was filtered and concentrated under a reduced pressure. The obtained residue was separated and purified through flash column chromatography, obtaining 120 g (81%) of an intermediate I-1.

HRMS (70 eV, EI+): m/z calcd for C20H14O2S: 318.0715. found: 318.

Elemental Analysis: C, 75%; H, 4%

Synthesis Example 2: Preparation of Intermediate I-2

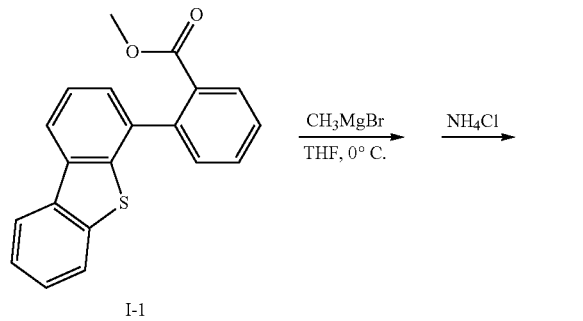

I-1

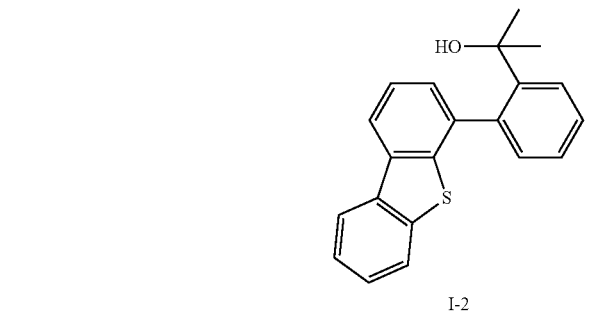

I-2

110 g (345 mmol) of the intermediate I-1 was dissolved in 3,500 mL of tetrahydrofuran (THF) under a nitrogen environment, and the solution was cooled down to 0° C. 288 mL (864 mmol) of 3.0 M methyl magnesium bromide dissolved in diethyl ether was slowly added thereto in a dropwise fashion for 1 hour. The mixture was agitated at room temperature for 19 hours. When the reaction was complete, 55.4 g (1,035 mmol) of ammonium chloride dissolved in 300 mL of water was added thereto to neutralize the reaction solution. The mixture was extracted with dichloromethane and treated with anhydrous MgSO$_4$ to remove moisture, and the extract was filtered and concentrated under reduced pressure, obtaining 108 g (98%) of an intermediate I-2.

HRMS (70 eV, EI+): m/z calcd for C21H18OS: 318.1078. found: 318.

Elemental Analysis: C, 79%; H, 6%

Synthesis Example 3: Preparation of Intermediate I-3

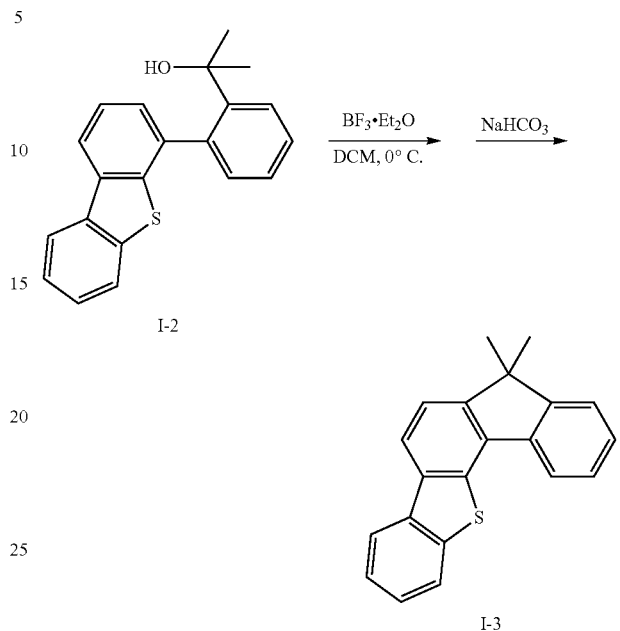

105 g (330 mmol) of the intermediate I-2 was dissolved in 900 mL of dichloromethane under a nitrogen environment, and the mixture was cooled down to 0° C. 70.3 g (495 mmol) of boron trifluoride diethyl etherate was slowly added in a dropwise fashion for one hour. Subsequently, the mixture was agitated at room temperature for 5 hours. When the reaction was complete, 41.6 g (495 mmol) of sodium bicarbonate dissolved in 450 mL of water was added to the reaction solution to neutralize the reaction solution. The mixture was extracted with dichloromethane and treated with anhydrous MgSO$_4$ to remove moisture, and the obtained residue was separated and purified through flash column chromatography, obtaining 79.3 g (80%) of an intermediate I-3.

HRMS (70 eV, EI+): m/z calcd for C21H16S: 300.0973. found: 300.

Elemental Analysis: C, 84%; H, 5%

Synthesis Example 4: Preparation of Intermediate I-4

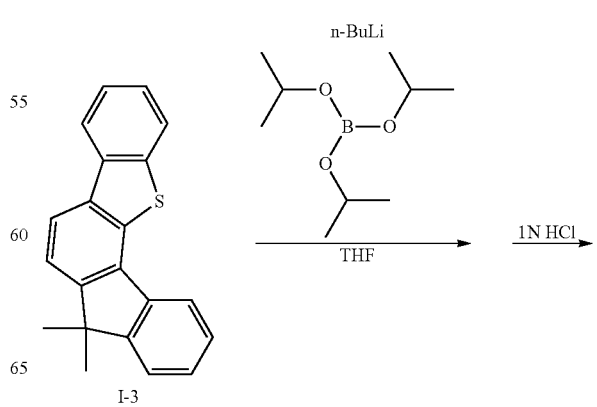

I-3

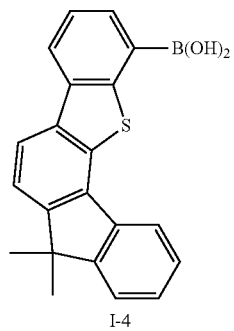

I-4

75 g (250 mmol) of the intermediate I-3 was dissolved in 2,500 mL of tetrahydrofuran (THF) under a nitrogen environment, and the mixture was cooled down to −78° C. 150 mL (375 mmol) of 2.5 M n-BuLi dissolved in hexane was slowly added thereto in a dropwise fashion for 10 minutes. Subsequently, the mixture was agitated at −78° C. for 6 hours, 70.5 g (375 mmol) of triisopropylborate was added thereto, and the mixture was agitated at room temperature for 16 hours. When the reaction was complete, 500 mL (500 mmol) of 1N HCl was added thereto to neutralize the reaction solution. The mixture was extracted with ethyl acetate (EA) and treated with anhydrous MgSO$_4$ to remove moisture, and the obtained residue was washed with hexane and dichloromethane to remove impurities, obtaining 68.0 g (79%) of an intermediate I-4.

HRMS (70 eV, EI+): m/z calcd for C21H17BO2S: 344.1042. found: 344.

Elemental Analysis: C, 73%; H, 5%

Synthesis Example 5: Preparation of Intermediate I-5

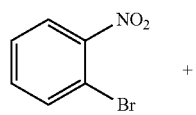

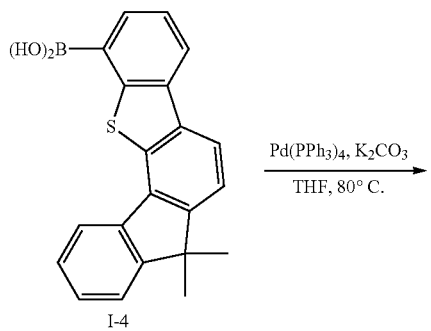

I-4

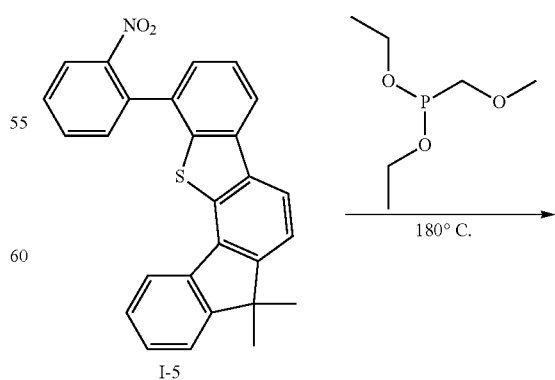

I-5

31.8 g (157 mmol) of 1-bromo-2-nitrobenzene was dissolved in 500 mL of tetrahydrofuran (THF) under a nitrogen environment, 65 g (189 mmol) of the intermediate I-4 and 1.81 g (1.57 mmol) of tetrakis(triphenylphosphine)palladium were added thereto, and the mixture was agitated. 54.2 g (393 mmol) of potassium carbonate saturated in water was added thereto, and the mixture was heated and refluxed at 80° C. for 13 hours. When the reaction was complete, water was added to the reaction solution, the mixture was extracted with dichloromethane, and the extract wad treated with anhydrous MgSO$_4$ to remove moisture and filtered and concentrated under a reduced pressure. The obtained residue was separated and purified through flash column chromatography, obtaining 61.5 g (93%) of an intermediate I-5.

HRMS (70 eV, EI+): m/z calcd for C27H19NO2S: 421.1136. found: 421.

Elemental Analysis: C, 77%; H, 5%

Synthesis Example 6: Preparation of Intermediate I-6

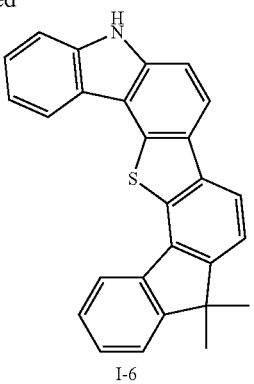

60 g (142 mmol) of the intermediate I-5 was dissolved in 300 mL of triethylphosphite under a nitrogen environment, and the solution was heated and refluxed at 180° C. for 5 hours. When the reaction was complete, water was added to the reaction solution, and the mixture for precipitation, and a precipitate produced therein was filtered. The obtained residue was separated and purified through flash column chromatography, obtaining 42.0 g (76%) of an intermediate I-6.

HRMS (70 eV, EI+): m/z calcd for C27H19NS: 389.1238. found: 389.

Elemental Analysis: C, 83%; H, 5%

Synthesis Example 7: Preparation of Intermediate I-7

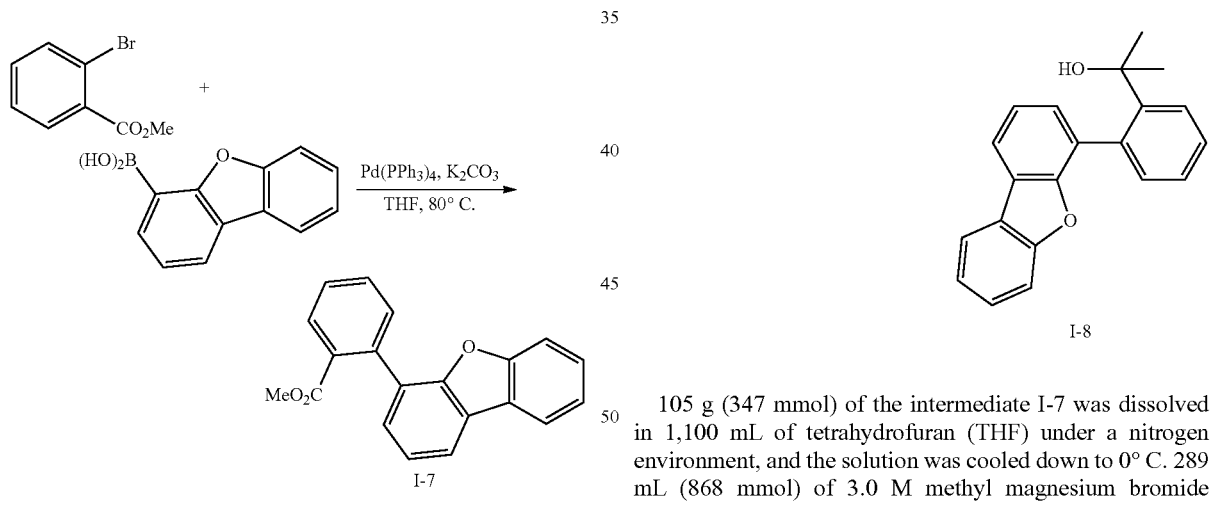

100 g (465 mmol) of methyl 2-bromobenzoate was dissolved in 1,100 mL of tetrahydrofuran (THF) under a nitrogen environment, 118 g (558 mmol) of dibenzofuran-4-yl boronic acid and 4.65 g (5.37 mmol) of tetrakis(triphenylphosphine)palladium were added thereto, and the mixture was agitated. 161 g (1,162 mmol) of potassium carbonate saturated in water was added thereto, and the mixture was heated and refluxed at 80° C. for 20 hours. When the reaction was complete, water was added to the reaction solution, the mixture was extracted with dichloromethane and treated with anhydrous MgSO4 to remove moisture, and the extract was filtered and concentrated under a reduced pressure. The obtained residue was separated and purified through flash column chromatography, obtaining 110 g (78%) of an intermediate I-7.

HRMS (70 eV, EI+): m/z calcd for C20H14O3: 302.0943. found: 302.

Elemental Analysis: C, 79%; H, 5%

Synthesis Example 8: Preparation of Intermediate I-8

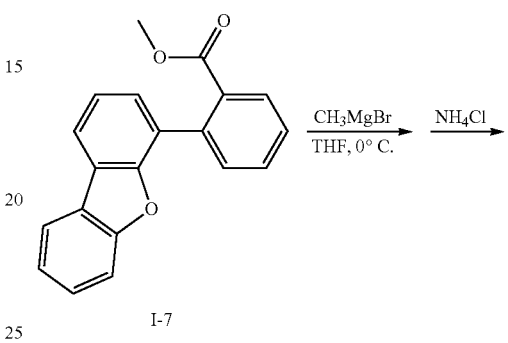

105 g (347 mmol) of the intermediate I-7 was dissolved in 1,100 mL of tetrahydrofuran (THF) under a nitrogen environment, and the solution was cooled down to 0° C. 289 mL (868 mmol) of 3.0 M methyl magnesium bromide dissolved in diethyl ether was slowly added thereto in a dropwise fashion for one hour. Then, the mixture was agitated at room temperature for 20 hours. When the reaction was complete, 55.7 g (1,041 mmol) of ammonium chloride dissolved in 300 mL of water was added thereto to neutralize the reaction solution. The resulting reaction solution was extracted with dichloromethane and treated with anhydrous MgSO4 to remove moisture, and the extract was filtered and concentrated under a reduced pressure, obtaining 97.6 g (93%) of an intermediate I-8.

HRMS (70 eV, EI+): m/z calcd for C21H18O2: 302.1307. found: 302.

Elemental Analysis: C, 83%; H, 6%

Synthesis Example 9: Preparation of Intermediate I-9

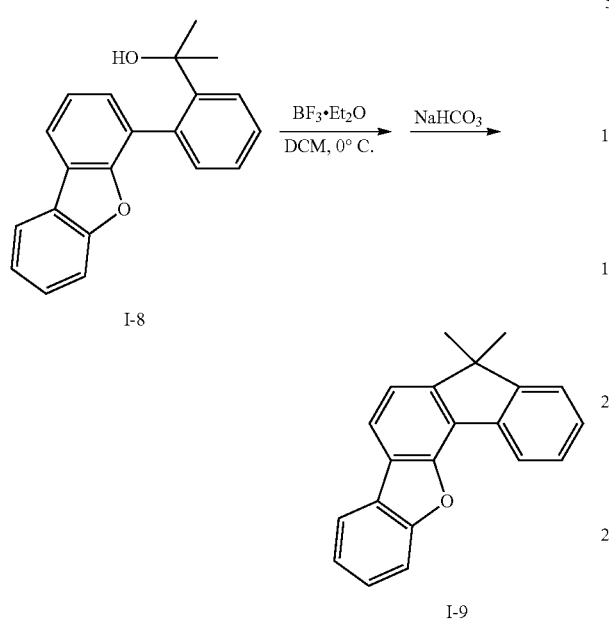

95 g (297 mmol) of the intermediate I-8 was dissolved in 500 mL of dichloromethane under a nitrogen environment, and the solution was cooled down to 0° C. 63.2 g (445 mmol) of boron trifluoride diethyl etherate was slowly added thereto in a dropwise fashion for one hour. Then, the mixture was agitated at room temperature for 5 hours. When the reaction was complete, 37.4 g (446 mmol) of sodium bicarbonate dissolved in 380 mL of water was added thereto to neutralize the reaction solution. The mixture was extracted with dichloromethane and treated with anhydrous MgSO$_4$ to remove moisture, and the obtained residue was separated and purified through column chromatography, obtaining 64.2 g 76%) of an intermediate I-9.

HRMS (70 eV, EI+): m/z calcd for C21H16O: 284.1201. found: 284.

Elemental Analysis: C, 89%; H, 6%

Synthesis Example 10: Preparation of Intermediate I-10

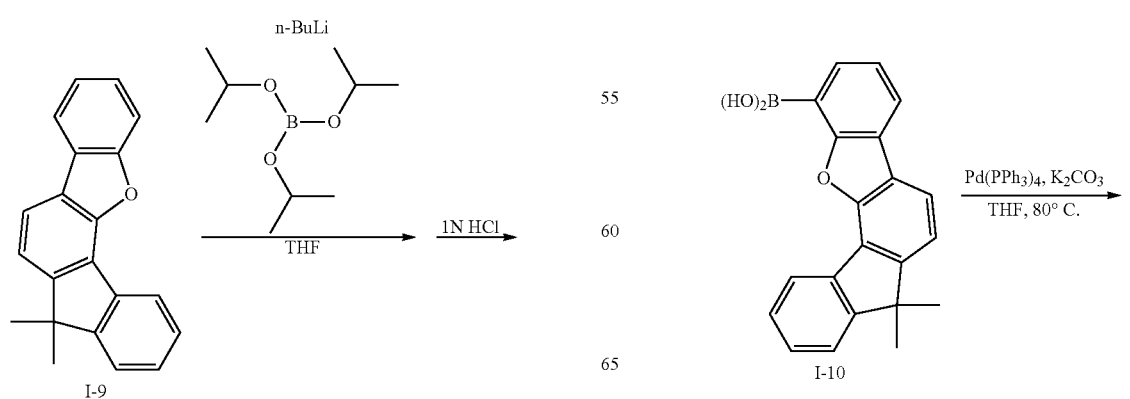

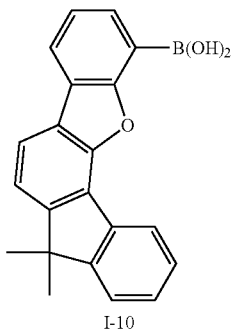

60 g (211 mmol) of the intermediate I-9 was dissolved in 600 mL of tetrahydrofuran (THF) under a nitrogen environment, and the solution was cooled down to −78° C. 127 mL (367 mmol) of 2.5 M n-BuLi dissolved in hexane was slowly added thereto in a dropwise fashion for 10 minutes. Then, the mixture was agitated at −78° C. for 6 hours, 69.0 g (367 mmol) of triisopropylborate was added thereto, and the mixture was agitated at room temperature for 13 hours. When the reaction was complete, 422 mL (422 mmol) of 1N HCl was added thereto to neutralize the reaction solution. The resultant was extracted with ethyl acetate (EA) and treated with anhydrous MgSO$_4$ to remove moisture, and the obtained residue was washed with hexane and dichloromethane to remove impurities, obtaining 53.3 g (77%) of an intermediate I-10.

HRMS (70 eV, EI+): m/z calcd for C21H17BO3: 328.1271. found: 328.

Elemental Analysis: C, 77%; H, 5%

Synthesis Example 11: Preparation of Intermediate I-11

-continued

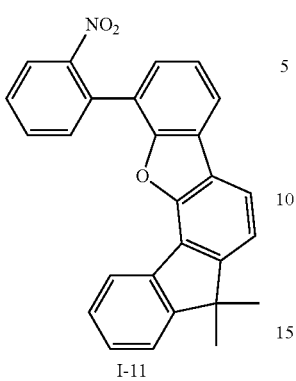
I-11

25.6 g (127 mmol) of 1-bromo-2-nitrobenzene was dissolved in 400 mL of tetrahydrofuran (THF) under a nitrogen environment, 50 g (152 mmol) of the intermediate I-10 and 1.47 g (1.27 mmol) of tetrakis(triphenylphosphine)palladium was added thereto, and the mixture was agitated. 43.9 g (318 mmol) of potassium carbonate saturated in water was added thereto, and the mixture was heated and refluxed at 80° C. for 15 hours. When the reaction was complete, water was added to the reaction solution, the mixture was extracted with dichloromethane and treated with anhydrous $MgSO_4$ to remove moisture, and the extract was filtered and concentrated under a reduced pressure. The obtained residue was separated and purified through flash column chromatography, obtaining 46.3 g (90%) of an intermediate I-11.

HRMS (70 eV, EI+): m/z calcd for C27H19NO3: 405.1365. found: 405.

Elemental Analysis: C, 80%; H, 5%

Synthesis Example 12: Preparation of Intermediate I-12

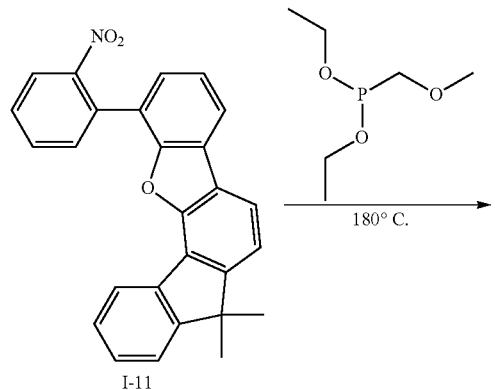

-continued

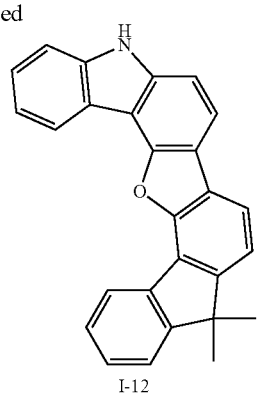
I-12

45 g (111 mmol) of the intermediate I-11 was dissolved in 250 mL of triethylphosphite under a nitrogen environment, and the solution was heated and refluxed at 180° C. for 7 hours. When the reaction was complete, water was added to the reaction solution for precipitation, and a precipitate produced therein was filtered. The obtained residue was separated and purified through flash column chromatography, obtaining 30.3 g (73%) of an intermediate I-12.

HRMS (70 eV, EI+): m/z calcd for C271-119NO: 373.1467. found: 373.

Elemental Analysis: C, 87%; H, 5%

Synthesis Example 13: Preparation of Intermediate I-13

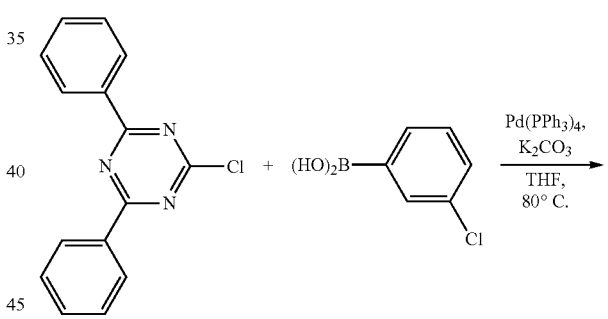

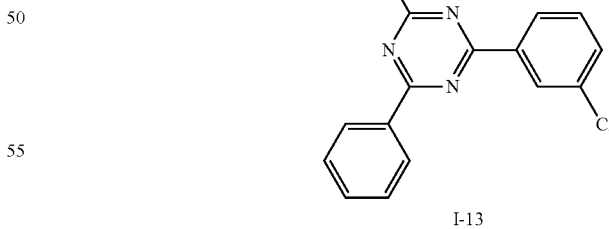
I-13

100 g (374 mmol) of 2-chloro-4,6-diphenyl-1,3,5-triazine was dissolved in 900 mL of tetrahydrofuran (THF) under a nitrogen environment, 70.1 g (448 mmol) of 3-chlorophenylboronic acid and 4.32 g (3.74 mmol) of tetrakis(triphenylphosphine)palladium were added thereto, and the mixture was agitated. 129 g (935 mmol) of potassium carbonate was added thereto, the mixture was heated and refluxed at 80° C. for 8 hours. When the reaction was complete, water was added to the reaction solution, the mixture was extracted with dichloromethane and treated with anhydrous $MgSO_4$ to remove moisture, and the extract was filtered and concentrated under a reduced pressure. The obtained residue was separated and purified through flash column chromatography, obtaining 117 g (91%) of an intermediate I-13.

HRMS (70 eV, EI+): m/z calcd for C21H14ClN3: 343.0876. found: 343.

Elemental Analysis: C, 73%; H, 4%

Example 1: Preparation of Compound 1

Example 2: Preparation of Compound 2

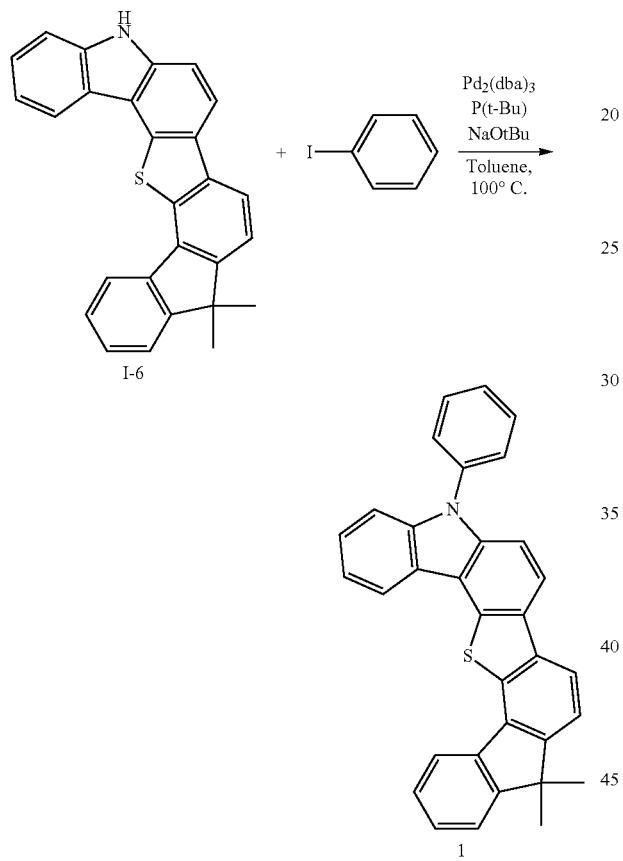

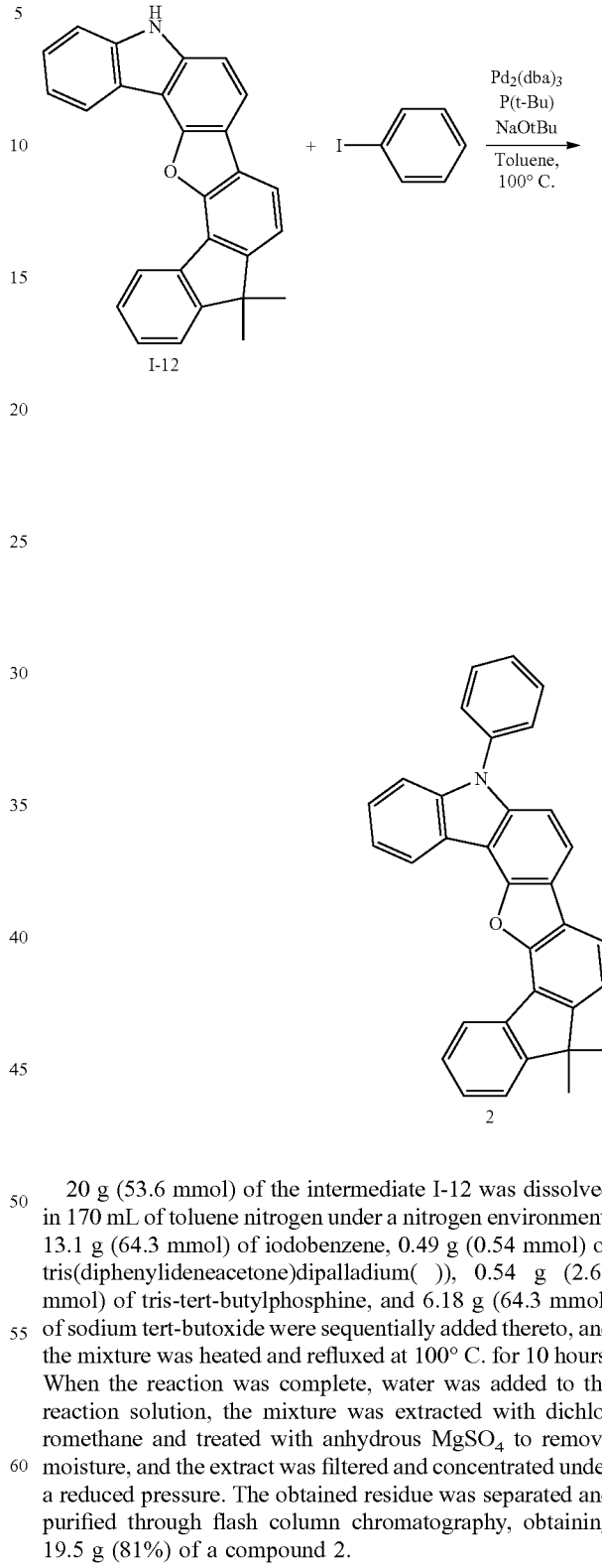

20 g (51.3 mmol) of the intermediate I-6 was dissolved in 200 mL of toluene under a nitrogen environment, 12.6 g (61.6 mmol) of iodobenzene, 0.47 g (0.51 mmol) of tris(diphenylideneacetone)dipalladium(0), 0.52 g, (2.57 mmol) of tris-tert-butylphosphine, and 5.92 g (61.6 mmol) of sodium tert-butoxide were sequentially added thereto, and the mixture was heated and refluxed at 100° C. for 8 hours. When the reaction was complete, water was added to the reaction solution, the mixture was extracted with dichloromethane and treated with anhydrous $MgSO_4$ to remove moisture, and the extract was filtered and concentrated under a reduced pressure. The obtained residue was separated and purified through flash column chromatography, obtaining 20.3 g (85%) of a compound 1.

HRMS (70 eV, EI+): m/z calcd for C33H23NS: 465.1551. found: 465.

Elemental Analysis: C, 85%; H, 5%

20 g (53.6 mmol) of the intermediate I-12 was dissolved in 170 mL of toluene nitrogen under a nitrogen environment, 13.1 g (64.3 mmol) of iodobenzene, 0.49 g (0.54 mmol) of tris(diphenylideneacetone)dipalladium( )), 0.54 g (2.68 mmol) of tris-tert-butylphosphine, and 6.18 g (64.3 mmol) of sodium tert-butoxide were sequentially added thereto, and the mixture was heated and refluxed at 100° C. for 10 hours. When the reaction was complete, water was added to the reaction solution, the mixture was extracted with dichloromethane and treated with anhydrous $MgSO_4$ to remove moisture, and the extract was filtered and concentrated under a reduced pressure. The obtained residue was separated and purified through flash column chromatography, obtaining 19.5 g (81%) of a compound 2.

HRMS (70 eV, EI+): m/z calcd for C33H23NO: 449.1780. found: 449.

Elemental Analysis: C, 88%; H, 5%

Example 3: Preparation of Compound 25

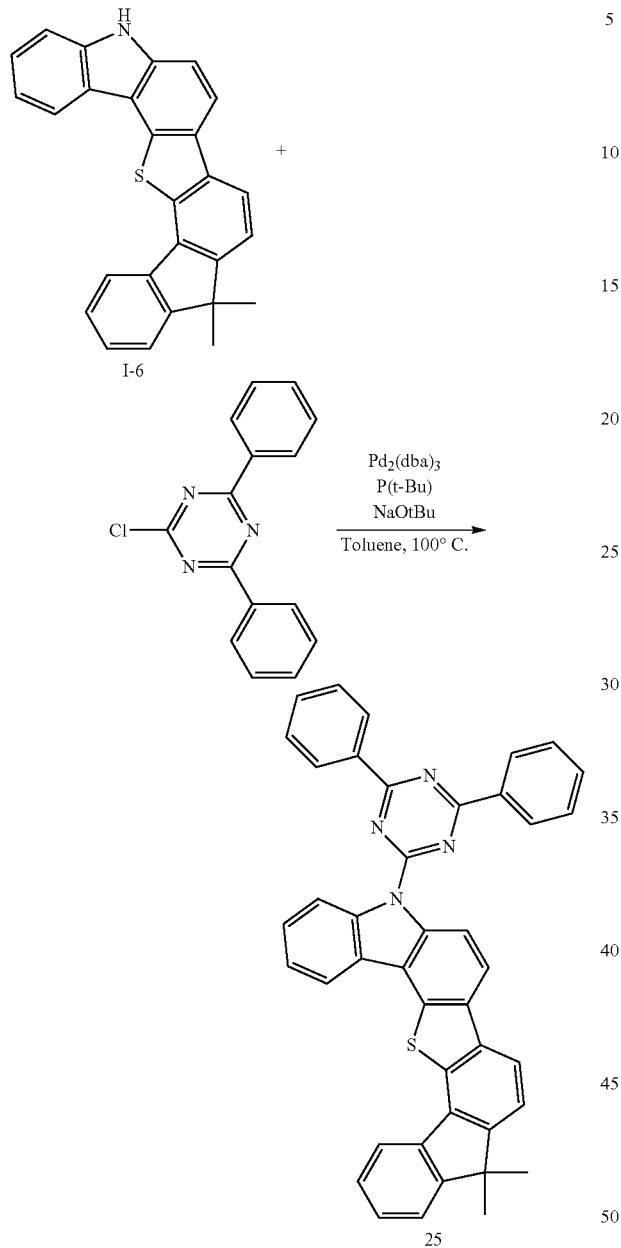

HRMS (70 eV, EI+): m/z calcd for $C_{42}H_{28}N_4S$: 620.2035. found: 620.
Elemental Analysis: C, 81%; H, 5%

Example 4: Preparation of Compound 26

20 g (51.3 mmol) of the intermediate I-6 was dissolved in 170 mL of toluene under a nitrogen environment, 13.7 g (51.3 mmol) of 2-chloro-4,6-diphenyl-1,3,5-triazine, 1.41 g (1.54 mmol) of tris(diphenylideneacetone)dipalladium(0), 1.56 g (7.70 mmol) of tris-tert-butylphosphine, and 5.92 g (61.6 mmol) of sodium tert-butoxide were sequentially added thereto, and the mixture was heated and refluxed at 100° C. for 15 hours. When the reaction was complete, water was added to the reaction solution, the mixture was extracted with dichloromethane and treated with anhydrous MgSO4 to remove moisture, and the extract was filtered and concentrated under a reduced pressure. The obtained residue was separated and purified through flash column chromatography, obtaining 25.5 g (80%) of a compound 25.

20 g (53.6 mmol) of the intermediate I-12 was dissolved in 170 mL of toluene under a nitrogen environment, 14.3 g (53.6 mmol) of 2-chloro-4,6-diphenyl-1,3,5-triazine, 1.47 g (1.61 mmol) of tris(diphenylideneacetone)dipalladium(0), 1.63 g (8.04 mmol) of tris-tert-butylphosphine, and 6.18 g (64.3 mmol) of sodium tert-butoxide were sequentially added thereto, and the mixture was heated and refluxed at 100° C. for 18 hours. When the reaction was complete, water was added to the reaction solution, the mixture was extracted with dichloromethane and treated with anhydrous $MgSO_4$ to remove moisture, and the extract was filtered and concentrated under a reduced pressure. The obtained residue was separated and purified through flash column chromatography, obtaining 25.0 g (77%) of a compound 26.

HRMS (70 eV, EI+): m/z calcd for C42H28N4O: 604.2263. found: 604.

Elemental Analysis: C, 83%; H, 5%

Example 5: Preparation of Compound 57

20 g (51.3 mmol) of the intermediate I-6 was dissolved in 190 mL of toluene under a nitrogen environment, 17.6 g (51.3 mmol) of the intermediate I-13, 1.41 g (1.54 mmol) of tris(diphenylideneacetone)dipalladium(0), 1.56 g (7.70 mmol) of tris-tert-butylphosphine, and 5.92 g (61.6 mmol) of sodium tert-butoxide were sequentially added thereto, and the mixture was heated and refluxed at 100° C. for 16 hours. When the reaction was complete, water was added to the reaction solution, the mixture was extracted with dichloromethane and treated with anhydrous MgSO4 to remove moisture, and the extract was filtered and concentrated under a reduced pressure. The obtained residue was separated and purified through flash column chromatography, obtaining 27.9 g (78%) of a compound 57.

HRMS (70 eV, EI+): m/z calcd for C48H32N4S: 696.2348. found: 696.

Elemental Analysis: C, 83%; H, 5%

Example 6: Preparation of Compound 58

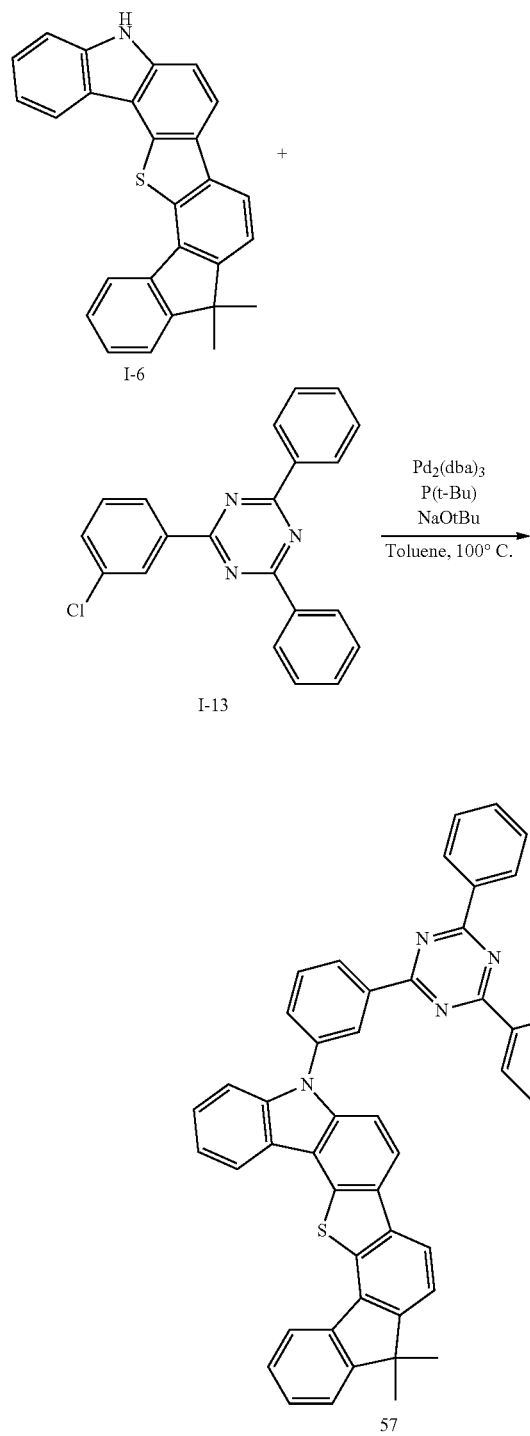

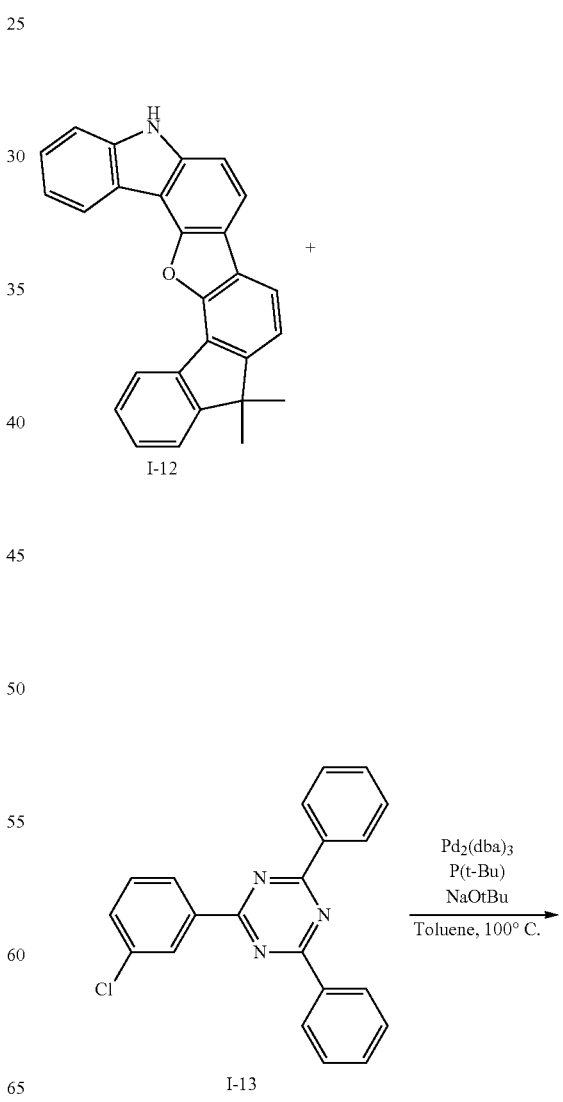

-continued

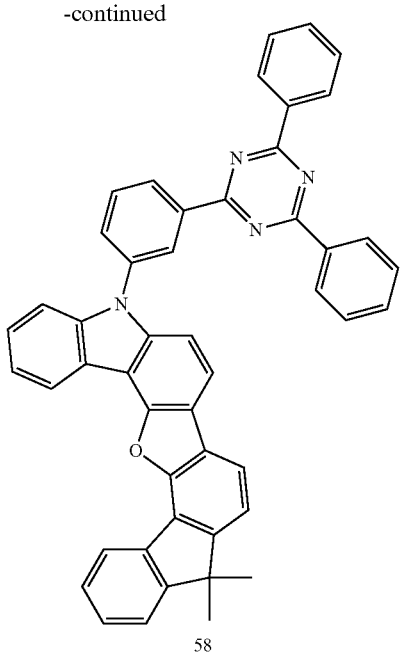

58

20 g (53.6 mmol) of the intermediate I-12 was dissolved in 200 mL of toluene under a nitrogen environment, 18.4 g (53.6 mmol) of the intermediate I-13, 1.47 g (1.61 mmol) of tris(diphenylideneacetone)dipalladium(0), 1.63 g (8.04 mmol) of tris-tert-butylphosphine, and 6.18 g (64.3 mmol) of sodium tert-butoxide were sequentially added thereto, and the mixture was heated and refluxed at 100° C. for 21 hours. When the reaction was complete, water was added to the reaction solution, the mixture was extracted with dichloromethane and treated with anhydrous $MgSO_4$ to remove moisture, and the extract was filtered and concentrated under a reduced pressure. The obtained residue was separated and purified through flash column chromatography, obtaining 27.4 g (75%) of a compound 58.

FIRMS (70 eV, EI+): m/z calcd for C48H32N4O: 680.2576. found: 680.

Elemental Analysis: C, 85%; H, 5%

Manufacture of Organic Light Emitting Diode

Example 7

The compound 1 obtained in Example 1 was used as a host, and Ir(PPy)$_3$ was used as a dopant to manufacture an organic light emitting diode. 1,000 Å-thick ITO was used as an anode, and 1,000 Å-thick aluminum (Al) was used as a cathode.

Specifically, an organic light emitting diode was manufactured by manufacturing the anode by cutting an ITO glass substrate having 15 Ω/cm² of sheet resistance into a size of 50 mm×50 mm×0.7 mm and cleaning with a ultrasonic wave in acetone, isopropyl alcohol, and pure water respectively for 15 minutes and with UV ozone for 30 minutes. On the substrate upper, a 800 Å-thick hole transport layer (HTL) was formed by depositing N4,N4'-di(naphthalen-1-yl)-N4, N4'-diphenylbiphenyl-4,4'-diamine (NPB) (80 nm) at a vacuum degree of 650×10⁻⁷ Pa at a deposition speed ranging from 0.1 to 0.3 nm/s. Subsequently, a 300 Å-thick emission layer was formed by vacuum-depositing the compound 1 obtained in Example 1 under the same vacuum deposition condition in Example 1 and simultaneously depositing Ir(PPy)$_3$ as a phosphorescent dopant. 7 wt % of the phosphorescent dopant was deposited by adjusting a depositing rate of the phosphorescent dopant based on 100 wt % of the total amount of the emission layer. On the emission layer, a 50 Å-thick hole blocking layer was formed by using bis(2-methyl-8-quinolinolate)-4-(phenylphenolato)aluminum (BAlq) under the same deposition condition. Subsequently, a 200 Å-thick electron transport layer (ETL) was formed by depositing Alq3 under the same vacuum deposition condition. LiF and Al were sequentially deposited to from a cathode on the electron transport layer (ETL), manufacturing an organic photoelectric device.

The organic photoelectric device has a structure of ITO/NPB (80 nm)/EML (compound 1 (93 wt %)+Ir(PPy)$_3$ (7 wt %), 30 nm)/Balq (5 nm)/Alq3 (20 nm)/LiF (1 nm)/Al (100 nm).

Example 8

An organic light emitting diode was manufactured according to the same method as Example 7 except for using the compound 2 of Example 2 instead of the compound 1 of Example 1.

Example 9

An organic light emitting diode was manufactured according to the same method as Example 7 except for using the compound 25 of Example 3 instead of the compound 1 of Example 1.

Example 10

An organic light emitting diode was manufactured according to the same method as Example 7 except for using the compound 26 of Example 4 instead of the compound 1 of Example 1.

Example 11

An organic light emitting diode was manufactured according to the same method as Example 7 except for using the compound 57 of Example 5 instead of the compound 1 of Example 1.

Example 12

An organic light emitting diode was manufactured according to the same method as Example 7 except for using the compound 58 of Example 6 instead of the compound 1 of Example 1.

Comparative Example 1

An organic light emitting diode was manufactured according to the same method as Example 7 except for using CBP instead of the compound 1 of Example 1. The CBP has the structure shown below.

Comparative Example 2

An organic light emitting diode was manufactured according to the same method as Example 7 except for using HOST1 instead of the compound 1 of Example 1. The HOST1 has the structure shown below.

Comparative Example 3

An organic light emitting diode was manufactured according to the same method as Example 7 except for using HOST2 instead of the compound 1 of Example 1. The HOST2 has the structure shown below.

Structures of the NPB, BAlq, CBP, Ir(PPy)3, HOST1 and HOST2 used for manufacture the organic light emitting diode are as follows.

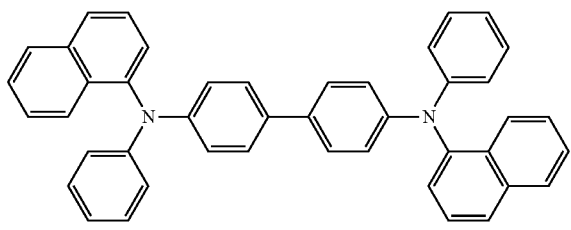

[NPB]

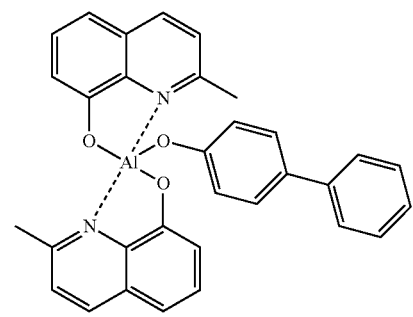

[BAlq]

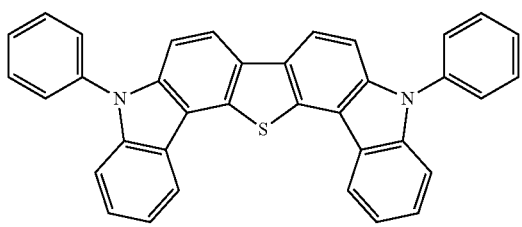

[HOST1]

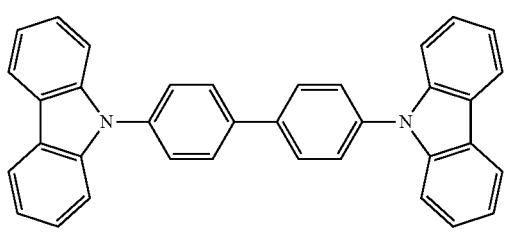

[CBP]

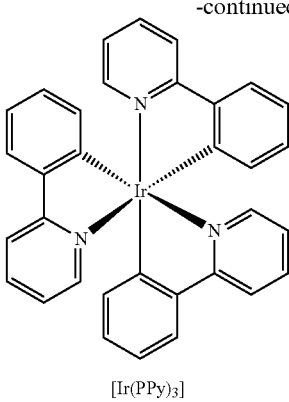

[Ir(PPy)3]

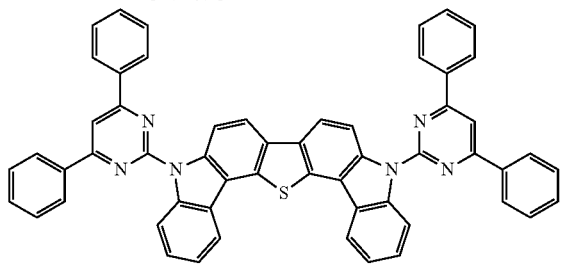

[HOST2]

Measurement of Performance of Organic Light Emitting Diode

Current density and luminance changes depending on a voltage and luminous efficiency of each organic light emitting diode according to Examples 7 to 12 and Comparative Examples 1 to 3 were measured. The measurements were specifically performed in the following method, and the results are provided in the following Table 1.

(1) Measurement of Current Density Change Depending on Voltage Change

Current values flowing in the unit device of the manufactured organic light emitting diodes were measured for, while increasing the voltage from 0 V to 10 V using a current-voltage meter (Keithley 2400), and the measured current values were divided by an area to provide the results.

(2) Measurement of Luminance Change depending on Voltage Change

Luminance of the manufactured organic light emitting diodes was measured for luminance, while increasing the voltage from 0 V to 10 V using a luminance meter (Minolta Cs-1000A).

(3) Measurement of Luminous Efficiency

Current efficiency (cd/A) at the same current density (10 mA/cm$^2$) were calculated by using the luminance, current density, and voltages (V) from the items (1) current density change depending on voltage change and (2) luminance change depending on voltage change.

TABLE 1

| Device | Compound used in emission layer | Driving voltage (V) | Color (EL color) | Efficiency (cd/A) |
|---|---|---|---|---|
| Example 7 | Compound 1 | 4.5 | Green | 55.0 |
| Example 8 | Compound 2 | 4.6 | Green | 53.2 |
| Example 9 | Compound 25 | 4.3 | Green | 66.8 |
| Example 10 | Compound 26 | 4.3 | Green | 64.6 |
| Example 11 | Compound 57 | 4.4 | Green | 58.9 |
| Example 12 | Compound 58 | 4.5 | Green | 56.5 |

TABLE 1-continued

| Device | Compound used in emission layer | Driving voltage (V) | Color (EL color) | Efficiency (cd/A) |
|---|---|---|---|---|
| Comparative Example 1 | CBP | 4.8 | Green | 31.4 |
| Comparative Example 2 | HOST1 | 5.0 | Green | 45.0 |
| Comparative Example 3 | HOST2 | 4.8 | Green | 52.1 |

Referring to Table 1, materials for the emission layers in Examples 7 to 12 increased luminous efficiency but decreased a driving voltage compared with materials for the emission layers according to Comparative Examples 1 to 3. The results suggest that a device having a low voltage but high efficiency may be manufactured.

By way of summation and review, examples of the organic optoelectric device may include an organic photoelectric device, an organic light emitting diode, an organic solar cell, and an organic photo-conductor drum, and the like.

Among them, the organic light emitting diode (OLED) has recently drawn attention due to an increase in demand for flat panel displays. The organic light emitting diode converts electrical energy into light by applying current to an organic light emitting material, and has a structure in which an organic layer is interposed between an anode and a cathode. The organic layer may include an emission layer and optionally an auxiliary layer, and the auxiliary layer may include at least one selected from, for example, a hole injection layer, a hole transport layer, an electron blocking layer, an electron transport layer, an electron injection layer, and a hole blocking layer in order to improve efficiency and stability of an organic light emitting diode.

Performance of an organic light emitting diode may be affected by characteristics of the organic layer, and among them, may be significantly affected by characteristics of an organic material of the organic layer. An organic material with increased hole and electron mobility and simultaneously increased electrochemical stability would be useful for an organic light emitting diode applied to a large-size flat panel display.

As described above, embodiments may provide an organic compound capable of realizing an organic optoelectric device having improved driving voltage and efficiency. Embodiments may also provide an organic optoelectric device including the organic compound. Embodiments may also provide a display device including the organic optoelectric device. Embodiments may provide organic optoelectric device having high efficiency and long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic compound represented by a combination of a moiety represented by the following Chemical Formula 1, a moiety represented by the following Chemical Formula 2, and a moiety represented by the following Chemical Formula 3:

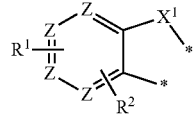

[Chemical Formula 1]

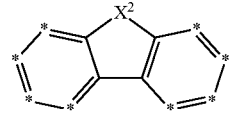

[Chemical Formula 2]

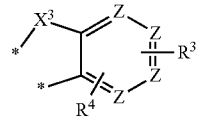

[Chemical Formula 3]

wherein, in the Chemical Formulae 1 to 3,
$X^1$ and $X^3$ are independently $NR^a$, $CR^bR^c$, $SiR^dR^e$, O, S, SO, or $SO_2$, provided that when one of $X^1$ and $X^3$ is $NR^a$, the other of $X^1$ and $X^3$ is not $NR^a$,
$X^2$ is O, S, SO, or $SO_2$,
each Z is independently $CR^f$ or N,
two *'s of the Chemical Formula 1 are bonded with adjacent two *'s of the Chemical Formula 2 to form a fused ring,
two *'s of the Chemical Formula 3 are bonded with another adjacent two *'s of the Chemical Formula 2 to form a fused ring,
*'s not forming a fused ring in the Chemical Formula 2 are independently $CR^g$ or N, and
$R^1$ to $R^4$ and $R^a$ to $R^g$ are independently hydrogen, deuterium, a substituted or unsubstituted C1 to C30 alkyl group, a substituted or unsubstituted C3 to C30 cycloalkyl group, a substituted or unsubstituted C3 to C30 heterocycloalkyl group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a substituted or unsubstituted C2 to C30 alkoxycarbonyl group, a substituted or unsubstituted C2 to C30 alkoxycarbonylamino group, a substituted or unsubstituted C7 to C30 aryloxycarbonylamino group, a substituted or unsubstituted C1 to C30 sulfamoylamino group, a substituted or unsubstituted C2 to C30 alkenyl group, a substituted or unsubstituted C2 to C30 alkynyl group, a substituted or unsubstituted silyl group, a substituted or unsubstituted silyloxy group, a substituted or unsubstituted C1 to C30 acyl group, a substituted or unsubstituted C1 to C20 acyloxy group, a substituted or unsubstituted C1 to C20 acylamino group, a substituted or unsubstituted C1 to C30 sulfonyl group, a substituted or unsubstituted C1 to C30 alkylthiol group, a substituted or unsubstituted C1 to C30 heterocyclothiol group, a substituted or unsubstituted C6 to C30 arylthiol group, a substituted or unsubstituted C1 to C30 heteroarylthiol group, a substituted or unsubstituted C1 to C30 ureide group, a halogen, a halogen-containing group, a cyano group, a hydroxyl group, an amino group, a nitro group, a carboxyl group, a ferrocenyl group, or a combination thereof.

2. The organic compound as claimed in claim 1, wherein the organic compound is represented by one of the following Chemical Formulae 4 to 6:

[Chemical Formula 4]

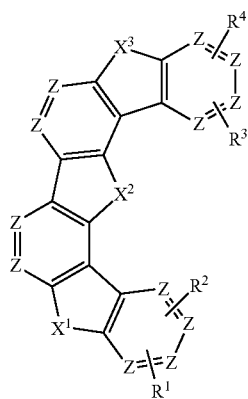

[Chemical Formula 5]

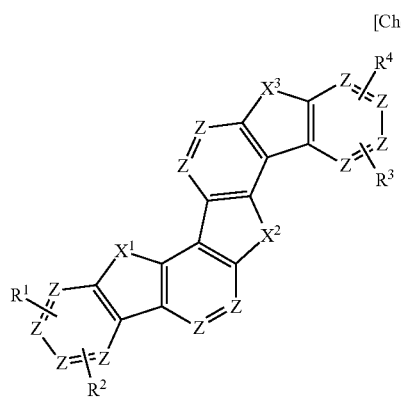

[Chemical Formula 6]

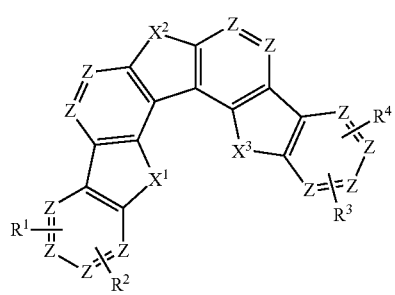

wherein, in the Chemical Formulae 4 to 6, $X^1$ and $X^3$ are independently $NR^a$, $CR^bR^c$, $SiR^dR^e$, O, S, SO, or $SO_2$, provided that when one of $X^1$ of $X^1$ and $X^3$ is not $NR^a$, $X^2$ is O, S, SO, or $SO_2$, each Z is independently $CR^f$ or N, and $R^1$ to $R^4$ and $R^a$ to $R^f$ are independently hydrogen, deuterium, a substituted or unsubstituted C1 to C30 alkyl group, a substituted or unsubstituted C3 to C30 cycloalkyl group, a substituted or unsubstituted C3 to C30 heterocycloalkyl group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, a substituted or unsubstituted C7 to C30 alkoxy group, a substituted or unsubstituted C2 to C30 alkoxycarbonyl group, a substituted or unsubstituted C2 to C30 alkoxycarbonylamino group, a substituted or unsubstituted C7 to C30 aryloxycarbonylamino group, a substituted or unsubstituted C1 to C30 sulfamoylamino group, a substituted or unsubstituted C2 to C30 alkenyl group, a substituted or unsubstituted C2 to C30 alkynyl group, a substituted or unsubstituted silyl group, a substituted or unsubstituted silyloxy group, a substituted or unsubstituted C1 to C30 acyl group, a substituted or unsubstituted C1 to C20 acyloxy group, a substituted or unsubstituted C1 to C20 acylamino group, a substituted or unsubstituted C1 to C30 sulfonyl group, a substituted or unsubstituted C1 to C30 alkylthiol group, a substituted or unsubstituted C1 to C30 heterocyclothiol group, a substituted or unsubstituted C6 to C30 arylthiol group, a substituted or unsubstituted C1 to C30 heteroarylthiol group, a substituted or unsubstituted C1 to C30 ureide group, a halogen, a halogen-containing group, a cyano group, a hydroxyl group, an amino group, a nitro group, a carboxyl group, a ferrocenyl group, or a combination thereof.

3. The organic compound as claimed in claim 2, wherein the organic compound represented by the Chemical Formula 4 is represented by one of the following Chemical Formulae 4a to 4c, the organic compound represented by the Chemical Formula 5 is represented by one of the following Chemical Formulae 5a to 5c, and the organic compound represented by the Chemical Formula 6 is represented by one of the following Chemical Formulae 6b and 6c:

[Chemical Formula 4a]

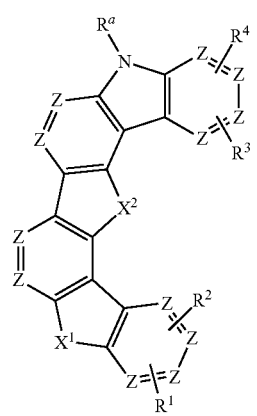

101
-continued

[Chemical Formula 4b]
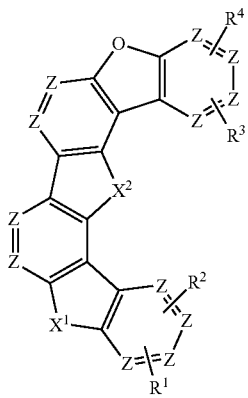

[Chemical Formula 4c]
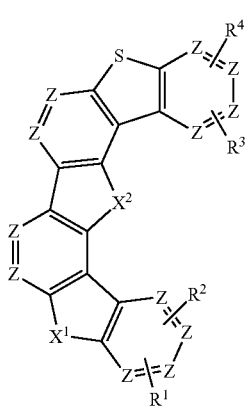

[Chemical Formula 5a]
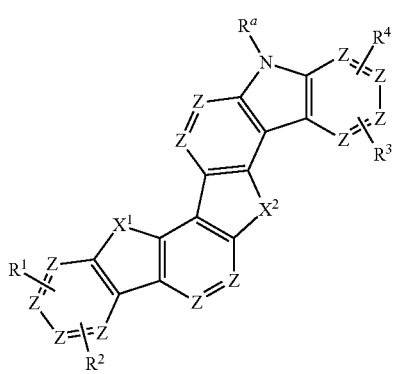

[Chemical Formula 5b]
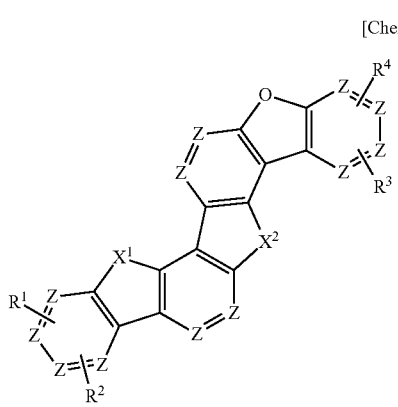

102
-continued

[Chemical Formula 5c]
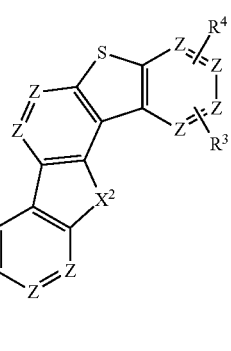

[Chemical Formula 6b]
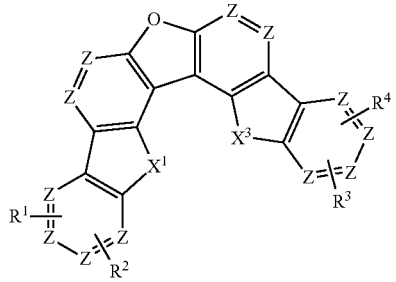

[Chemical Formula 6c]
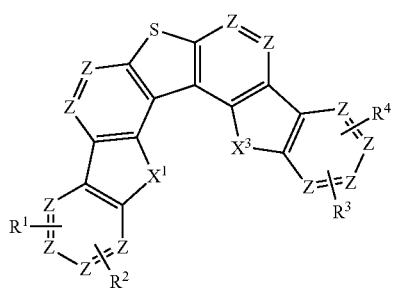

wherein, in the Chemical Formulae 4a to 6c, $X^1$ and $X^3$ are independently $CR^bR^c$, $SiR^dR^e$, O, S, SO, or $SO_2$, $X^2$ is O, S, SO, or $SO_2$, each Z is independently $CR^f$ or N, and $R^1$ to $R^4$ and $R^a$ to $R^f$ are independently hydrogen, deuterium, a substituted or unsubstituted C1 to C30 alkyl group, a substituted or unsubstituted C3 to C30 cycloalkyl group, a substituted or unsubstituted C3 to C30 heterocycloalkyl group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a substituted or unsubstituted C2 to C30 alkoxycarbonyl group, a substituted or unsubstituted C2 to C30 alkoxycarbonylamino group, a substituted or unsubstituted C7 to C30 aryloxycarbonylamino group, a substituted or unsubstituted C1 to C30 sulfamoylamino group, a substituted or unsubstituted C2 to C30 alkenyl group, a substituted or unsubstituted C2 to C30 alkynyl group, a substituted or unsubstituted silyl group, a substituted or unsubstituted silyloxy group, a substituted or unsubstituted C1 to C30 acyl group, a substituted or unsubstituted C1 to C20 acyloxy group, a substituted or unsubstituted C1 to C20 acylamino group, a substituted or unsubstituted C1 to C30 sulfonyl group, a substituted or unsubstituted C1 to C30 alkylthiol group, a substituted or unsubstituted C1 to C30 heterocyclothiol group, a substituted or unsubstituted C6 to C30 arylthiol group, a substituted or unsubstituted C1 to C30 heteroarylthiol group, a substituted or unsubstituted C1 to C30 ureide group, a halogen, a halogen-containing group, a cyano group, a hydroxyl group, an amino group, a nitro group, a carboxyl group, a ferrocenyl group, or a combination thereof.

4. The organic compound as claimed in claim 1, wherein $R^1$ to $R^4$ and $R^a$ to $R^f$ are independently hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, or a combination thereof.

5. The organic compound as claimed in claim 4, wherein at least one of $R^1$ to $R^4$ and $R^a$ to $R^f$ is a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, or a combination thereof.

6. The organic compound as claimed in claim 5, wherein at least one of $R^1$ to $R^4$ and $R^a$ to $R^f$ is one of the substituted or unsubstituted functional groups listed in the following Group 1:

[Group 1]

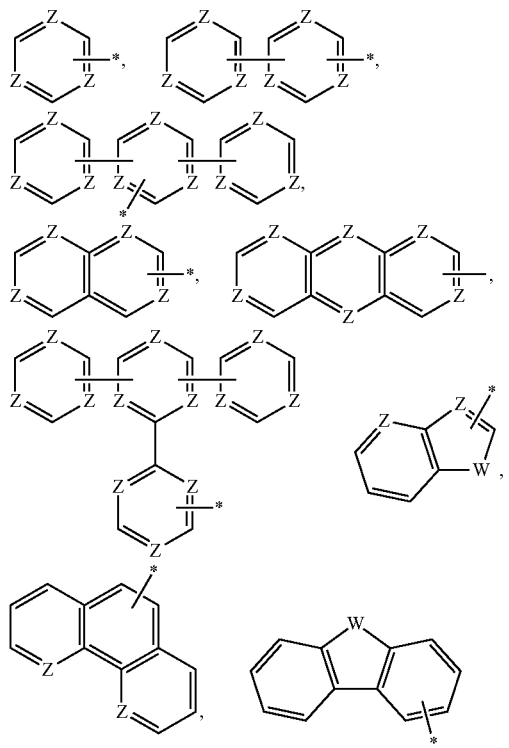

-continued

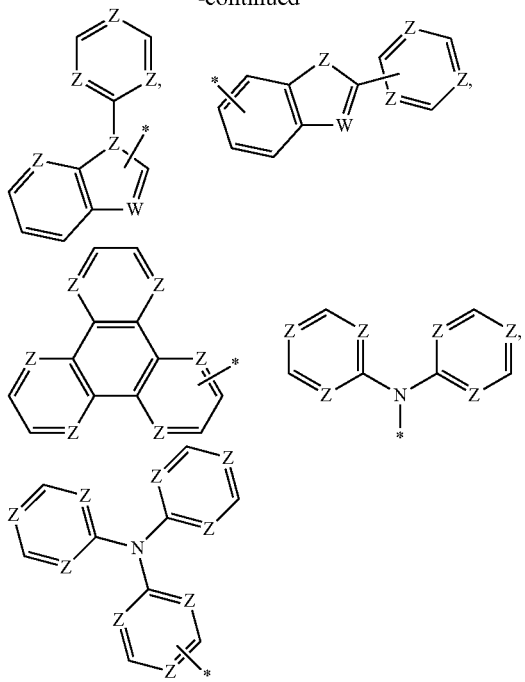

wherein, in the Group 1,
each Z is independently N, C, or $CR^h$,
each W is independently N, O, S, SO, $SO_2$, $NR^i$, $CR^j$, or $CR^kR^l$,
wherein $R^h$ to $R^l$ are independently hydrogen, deuterium,
  a substituted or unsubstituted C1 to C30 alkyl group, a substituted or unsubstituted C3 to C30 cycloalkyl group, a substituted or unsubstituted C3 to C30 heterocycloalkyl group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a substituted or unsubstituted C2 to C30 alkoxycarbonyl group, a substituted or unsubstituted C2 to C30 alkoxycarbonylamino group, a substituted or unsubstituted C7 to C30 aryloxycarbonylamino group, a substituted or unsubstituted C1 to C30 sulfamoylamino group, a substituted or unsubstituted C2 to C30 alkenyl group, a substituted or unsubstituted C2 to C30 alkynyl group, a substituted or unsubstituted silyl group, a substituted or unsubstituted silyloxy group, a substituted or unsubstituted C1 to C30 acyl group, a substituted or unsubstituted C1 to C20 acyloxy group, a substituted or unsubstituted C1 to C20 acylamino group, a substituted or unsubstituted C1 to C30 sulfonyl group, a substituted or unsubstituted C1 to C30 alkylthiol group, a substituted or unsubstituted C1 to C30 heterocyclothiol group, a substituted or unsubstituted C6 to C30 arylthiol group, a substituted or unsubstituted C1 to C30 heteroarylthiol group, a substituted or unsubstituted C1 to C30 ureide group, a halogen, a halogen-containing group, a cyano group, a hydroxyl group, an amino group, a nitro group, a carboxyl group, a ferrocenyl group, or a combination thereof, and
* is a linking point, and is positioned at one of elements of the functional group.

7. The organic compound as claimed in claim 6, wherein the functional groups listed in the Group 1 is one of the substituted or unsubstituted functional groups listed in the Group 2:

[Group 2]

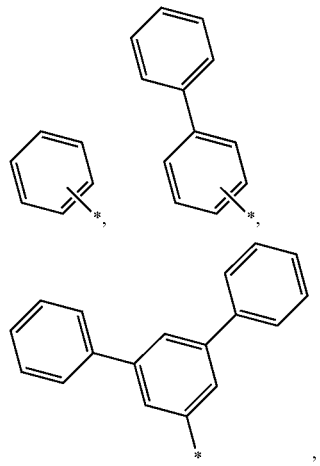

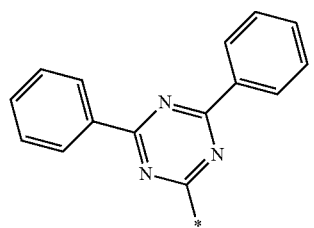

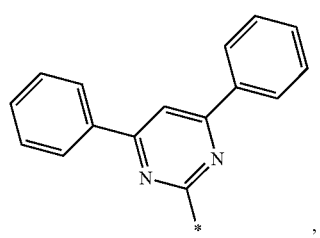

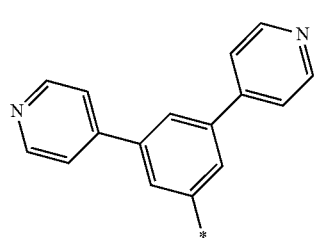

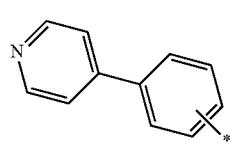

-continued

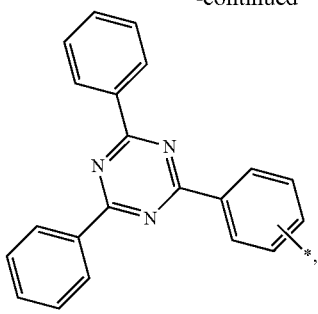

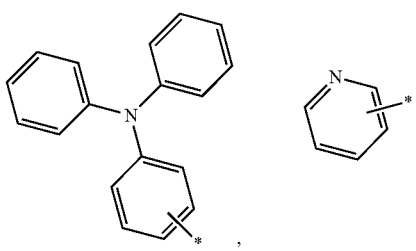

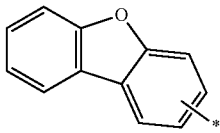 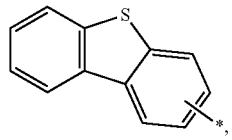

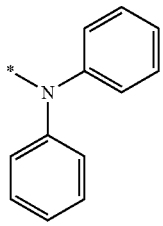 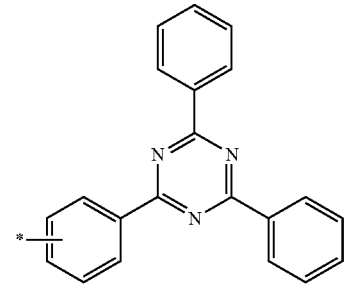

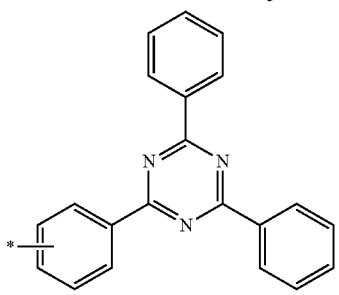

wherein, in the Group 2,

* is a linking point and is positioned at one of elements of the functional group.

8. The organic compound as claimed in claim 1, wherein the organic compound is one of organic compounds listed in the following Group 3:

[Group 3]
1
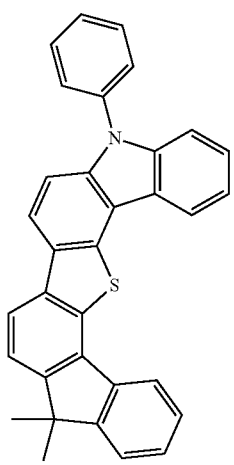
2
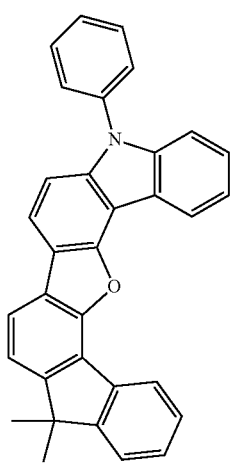
3
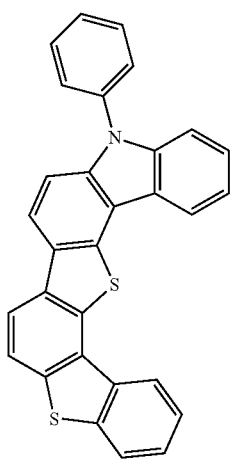
4
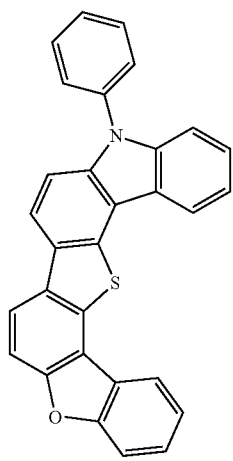
5
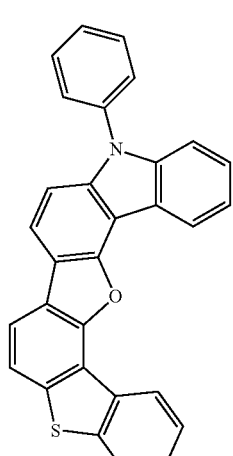
6
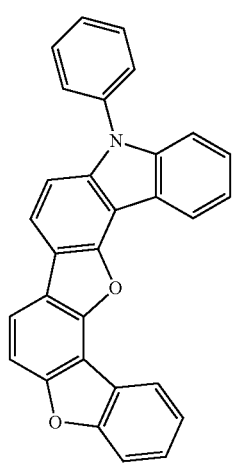

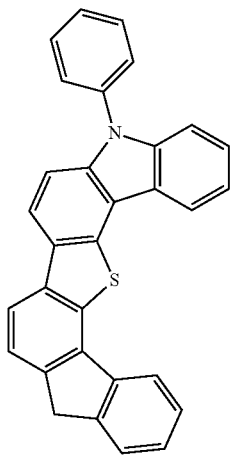
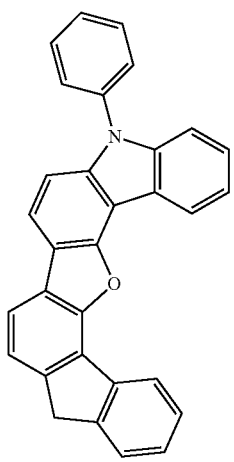
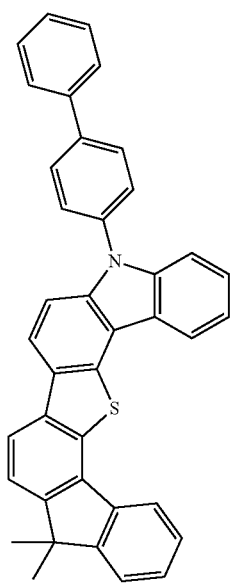
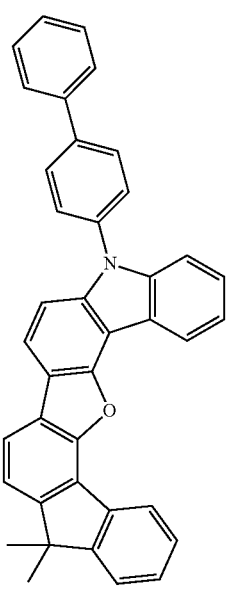
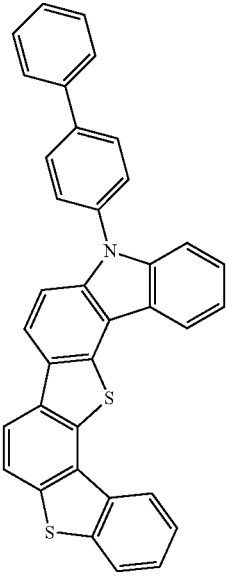

12
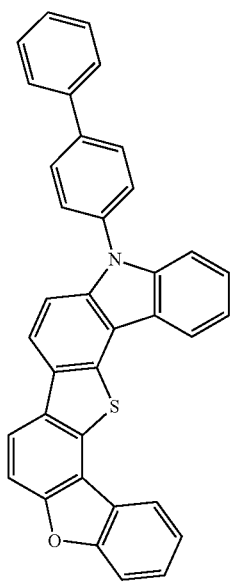
13
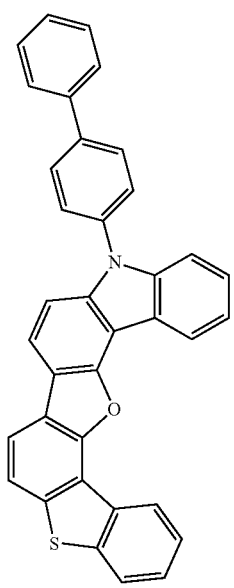
14
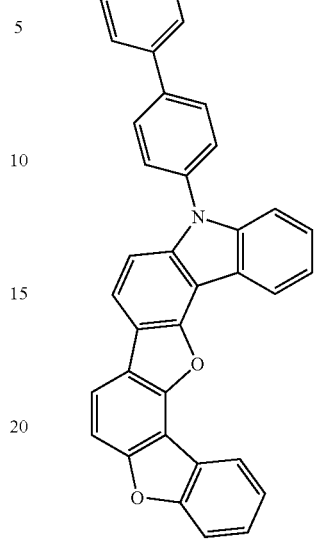
15
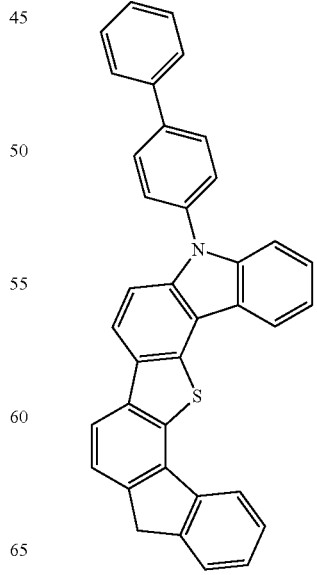

16
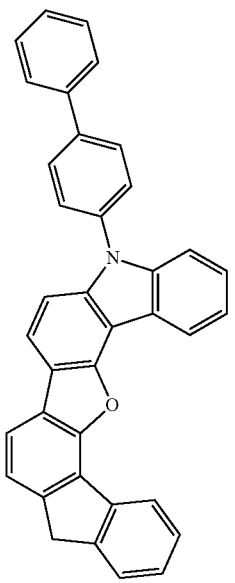
17
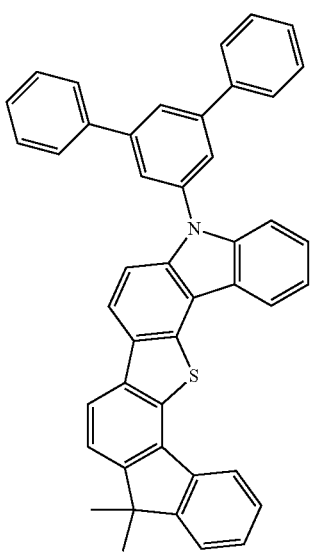
18
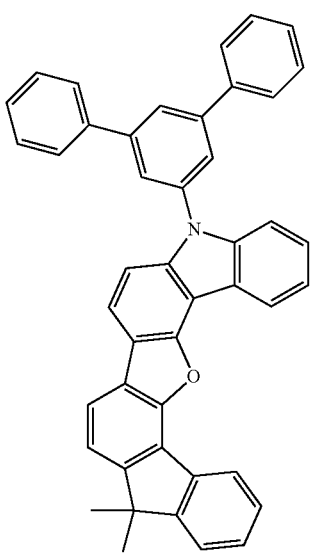
19
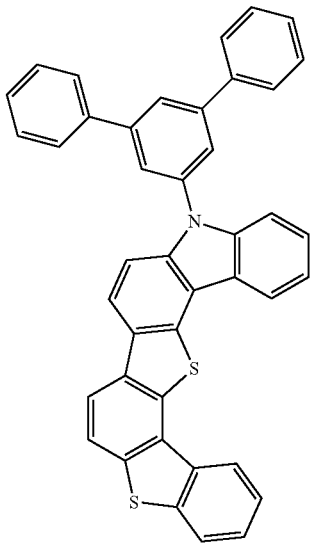
20
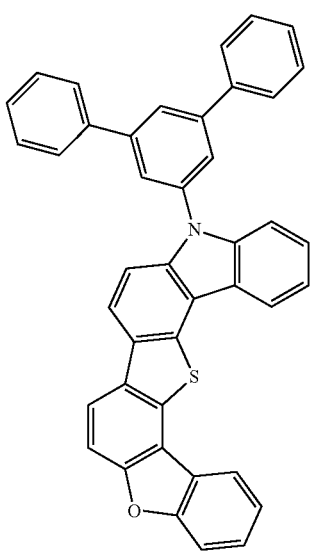
21
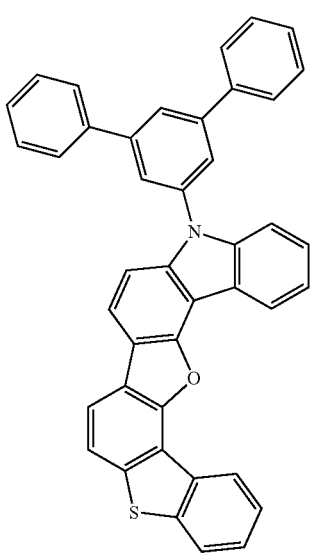

22
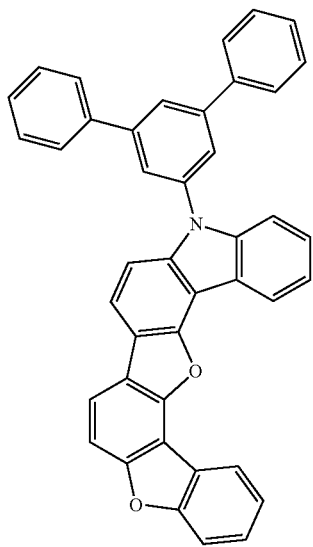
23
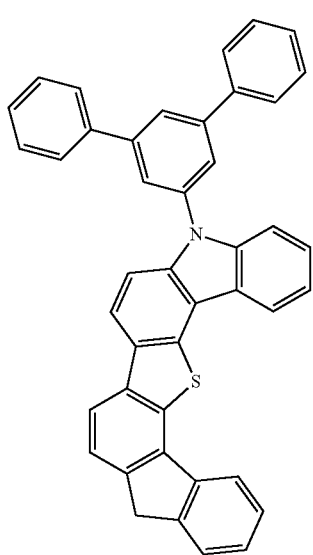
24
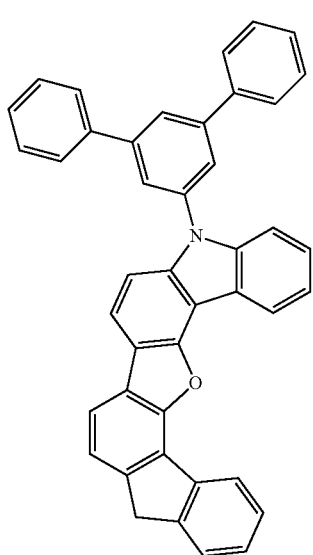
25
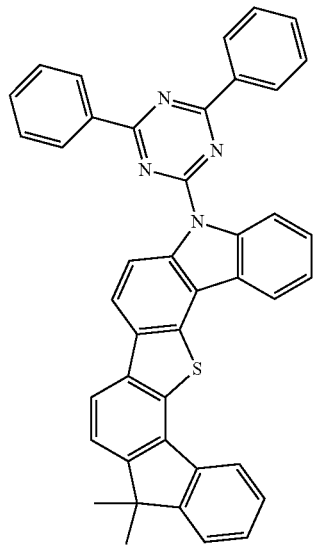
26
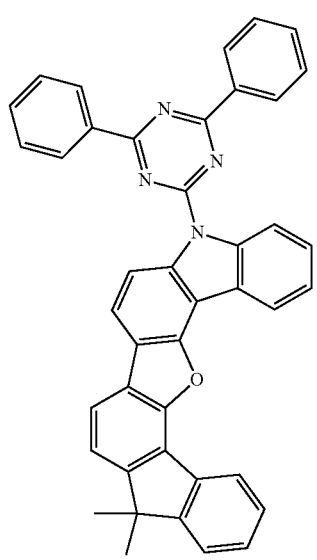
27
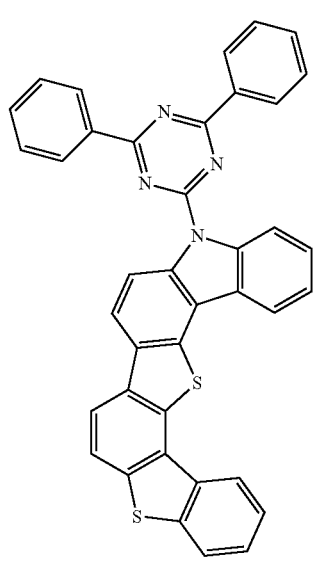

28
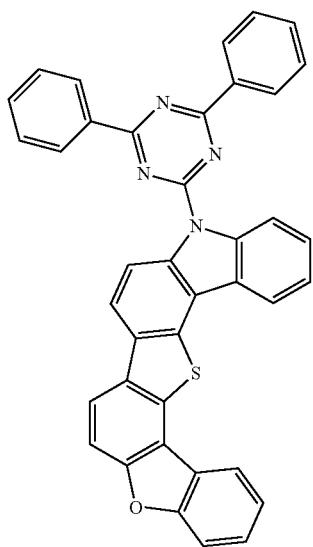
29
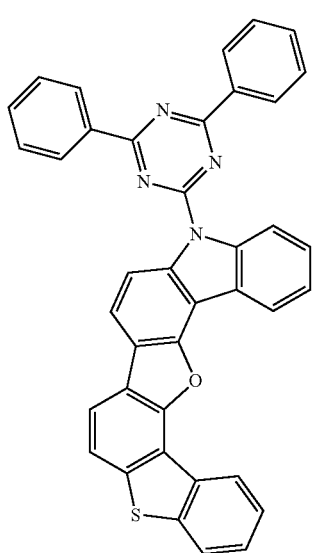
30
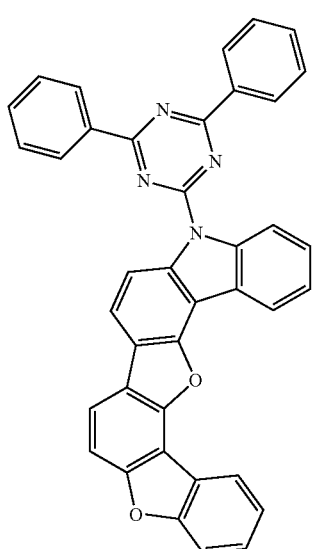
31
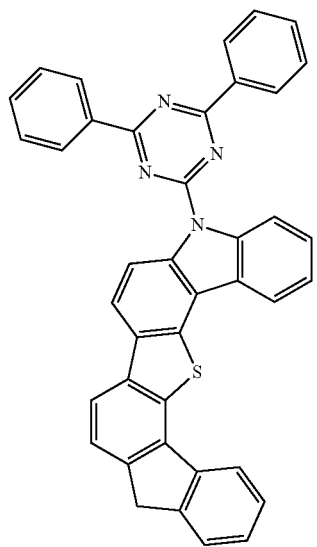
32
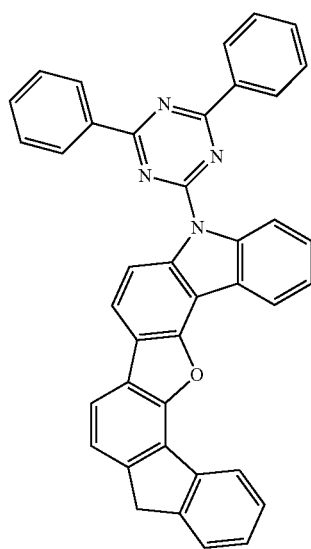
33
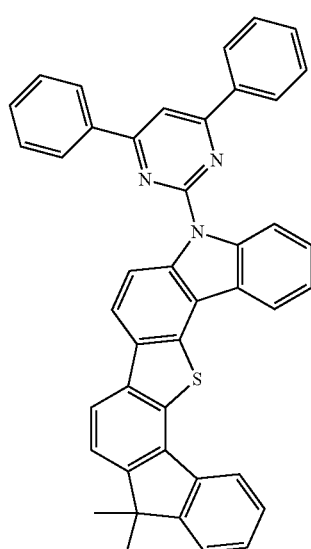

-continued
34
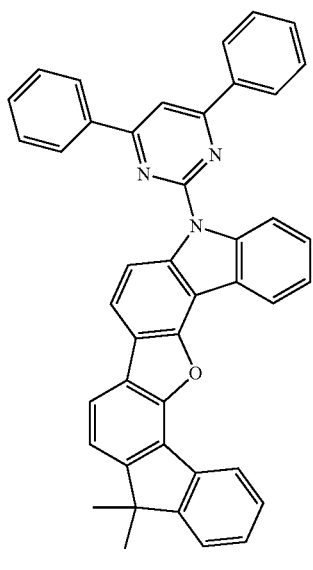
35
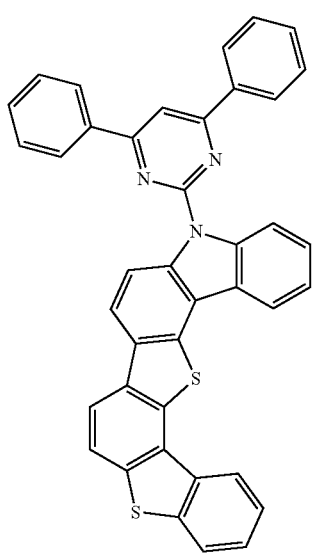
36
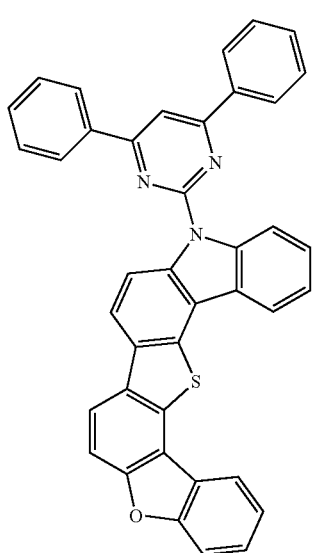
-continued
37
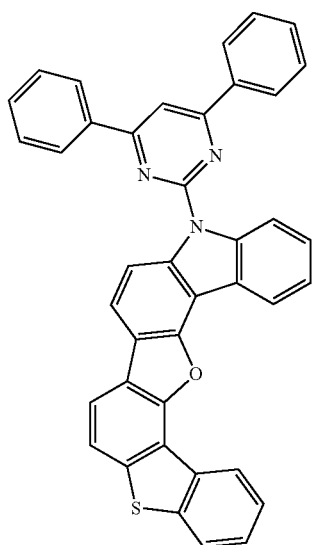
38
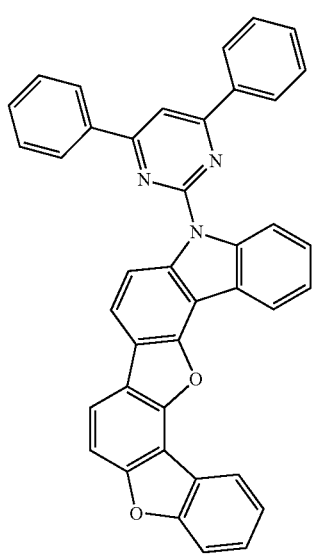
39
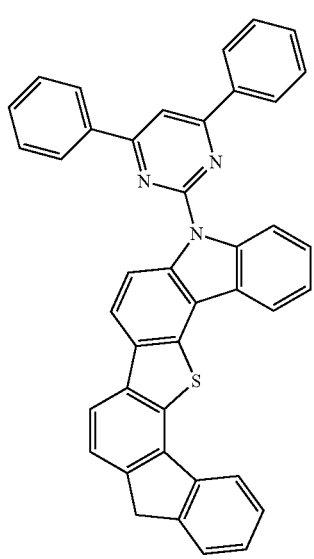

121 -continued
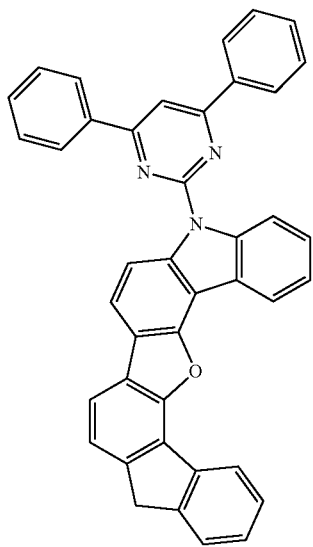
40
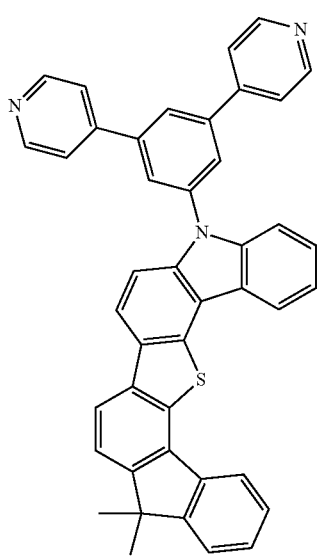
41
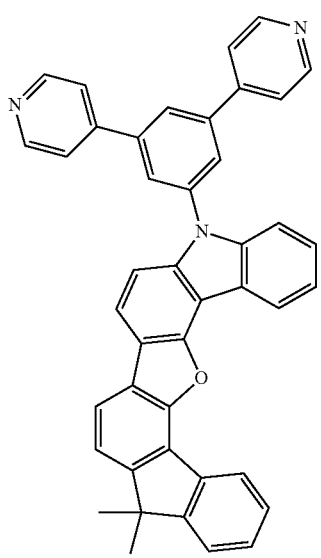
42
122 -continued
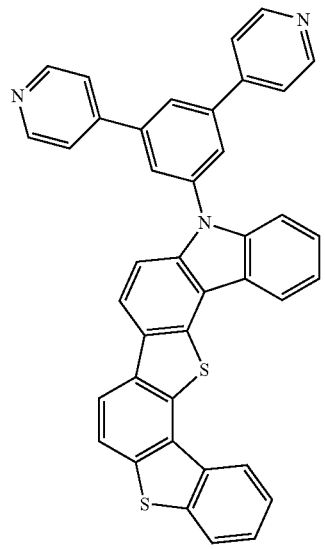
43
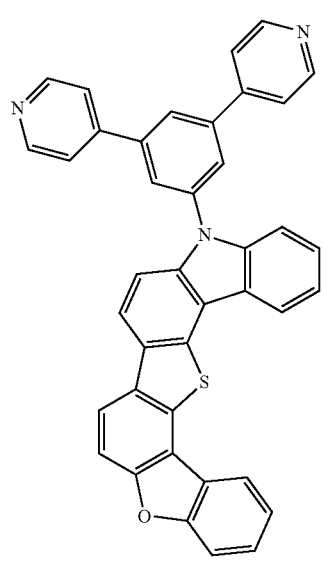
44
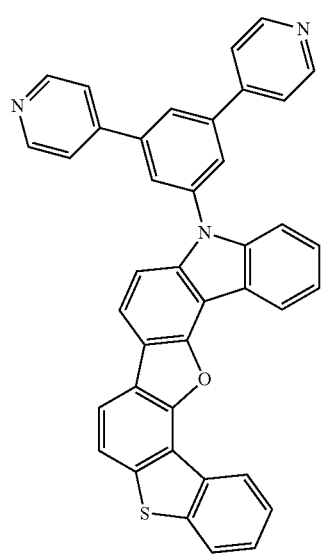
45

46
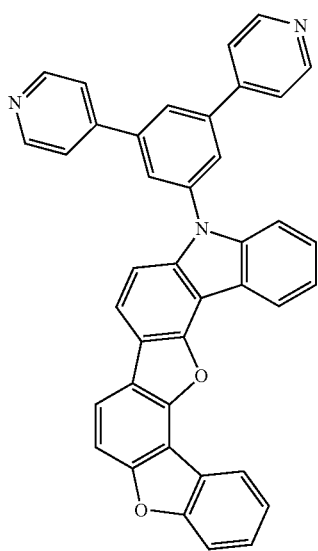
47
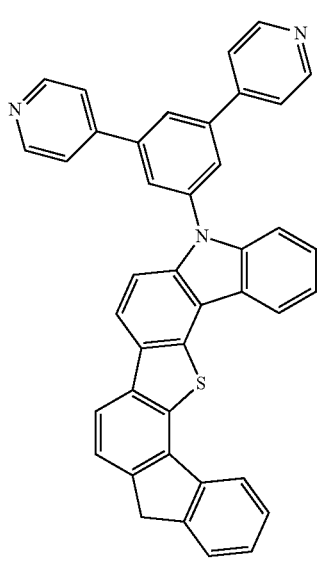
48
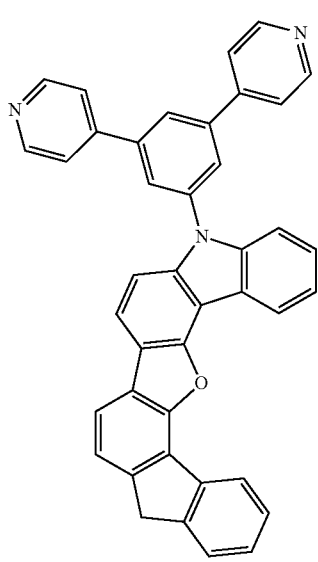
49
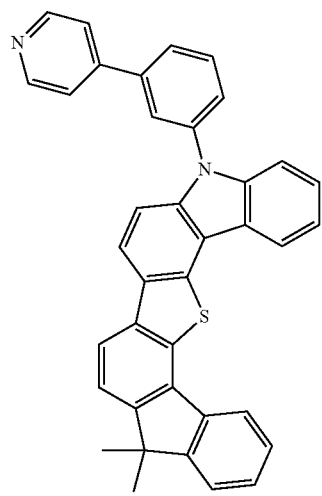
50
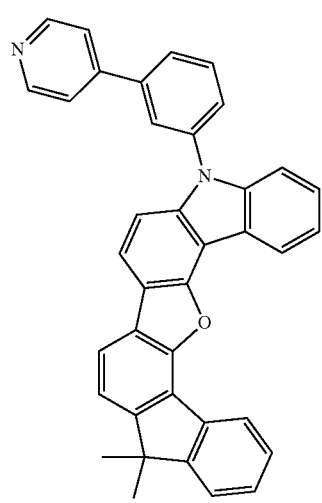
51
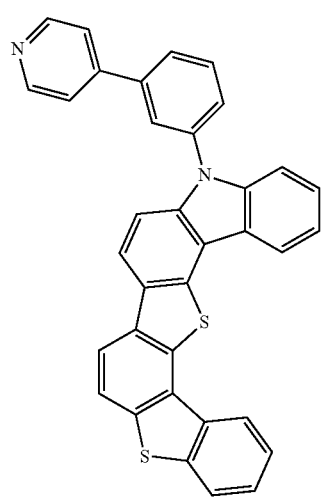

125
-continued
52
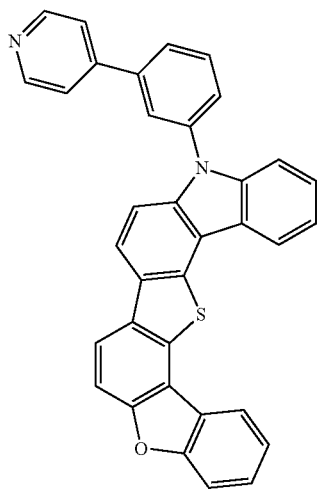
53
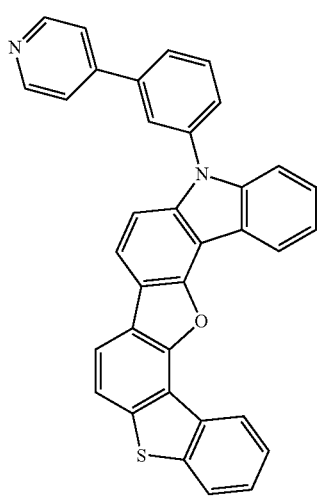
54
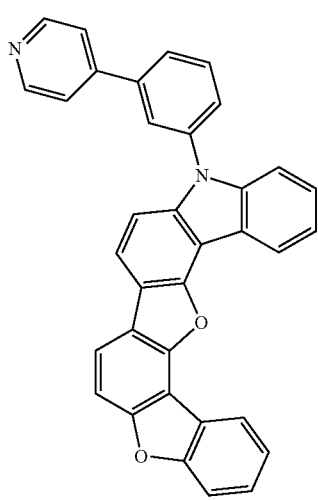
126
-continued
55
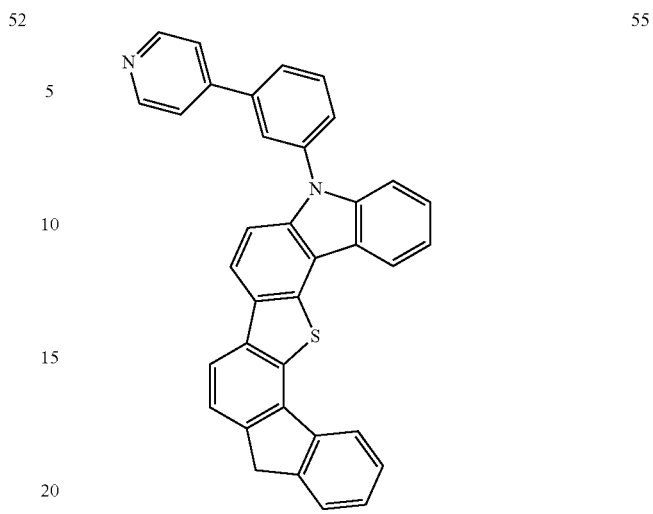
56
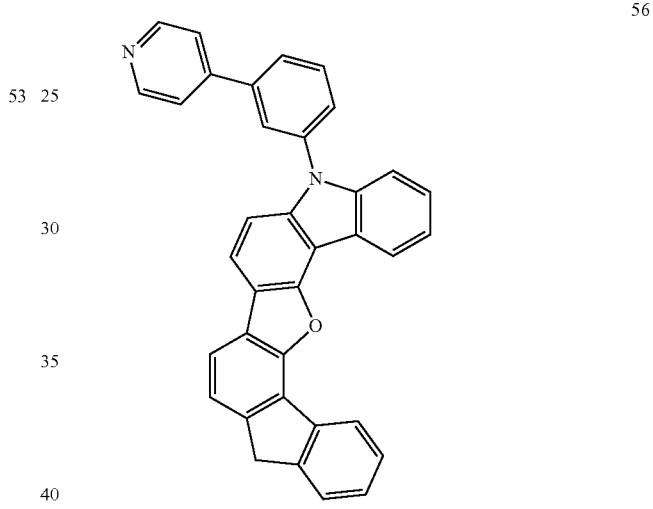
57
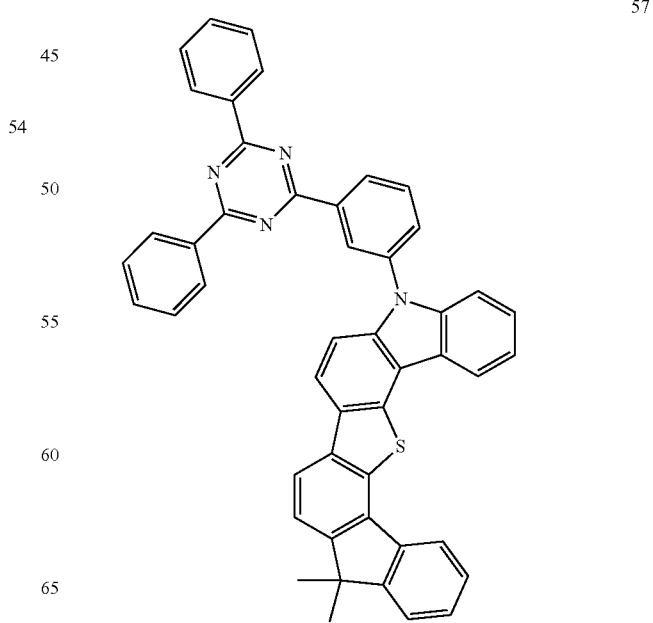

58
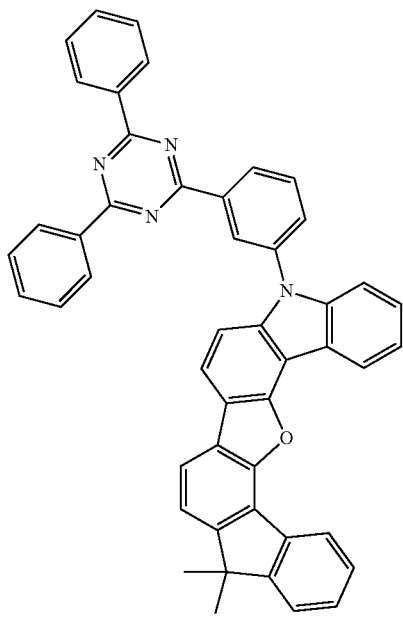
59
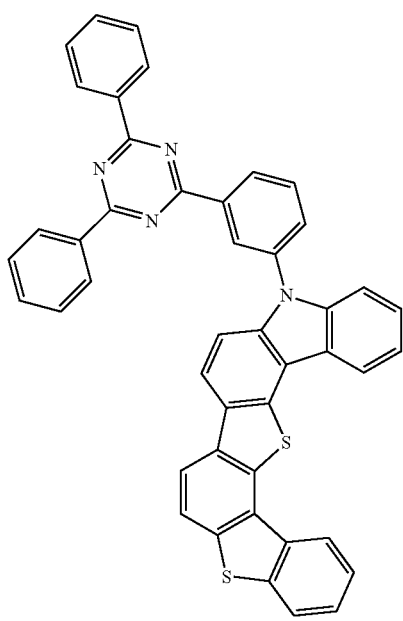
60
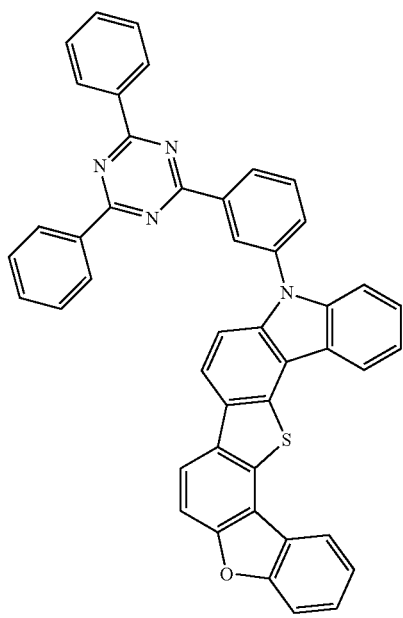
61
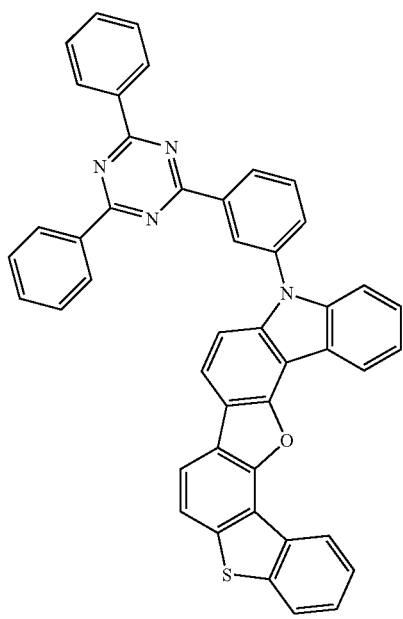

129
-continued
62
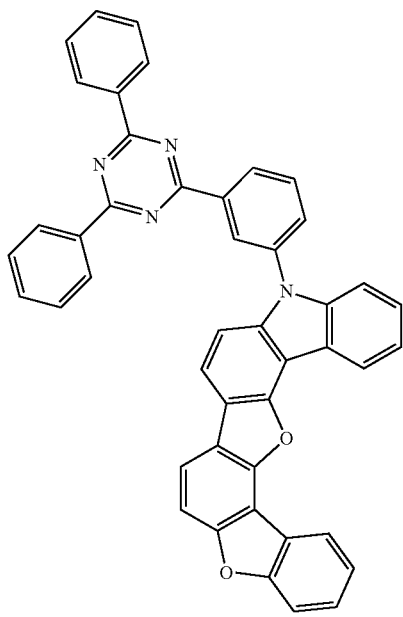
63
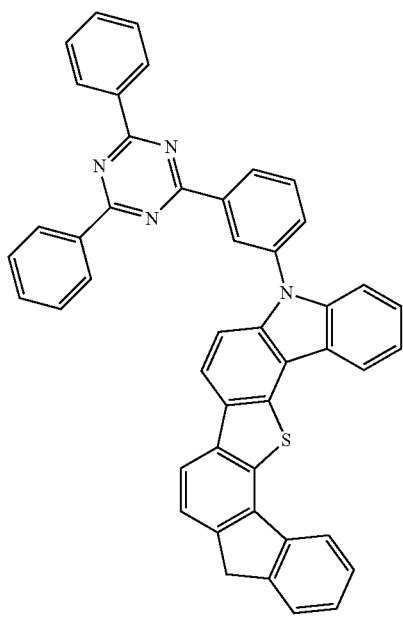
130
-continued
64
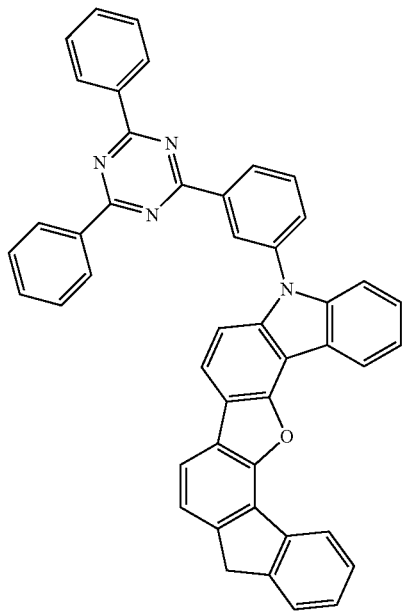
65
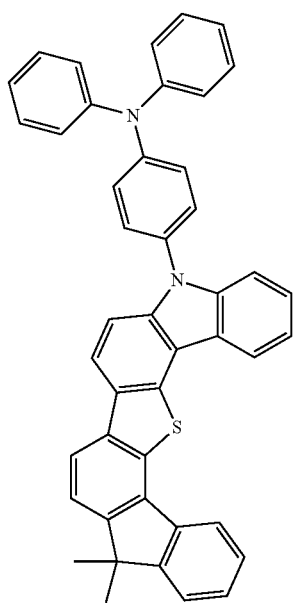

66
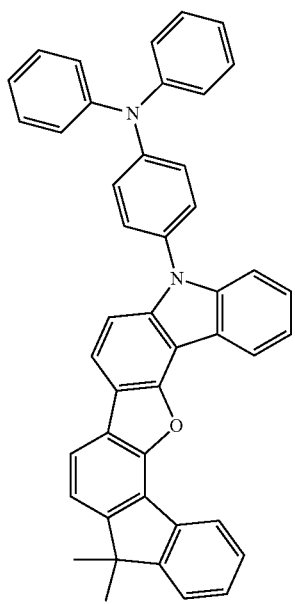
68
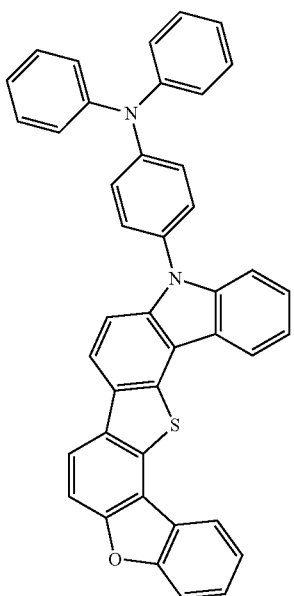
67
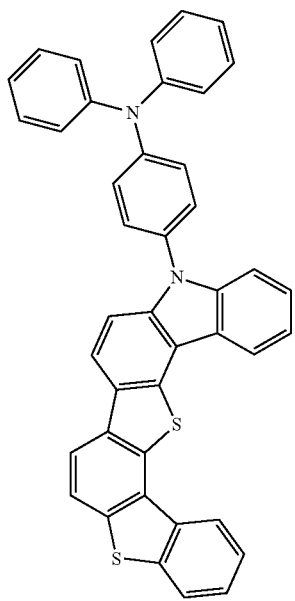
69

133
-continued
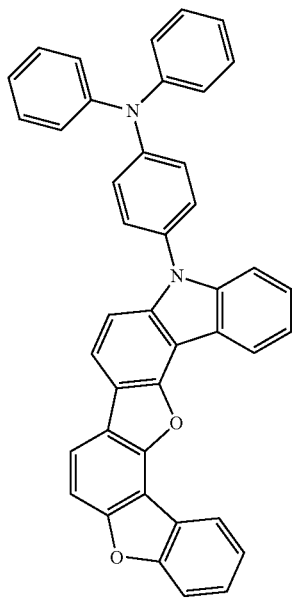
70
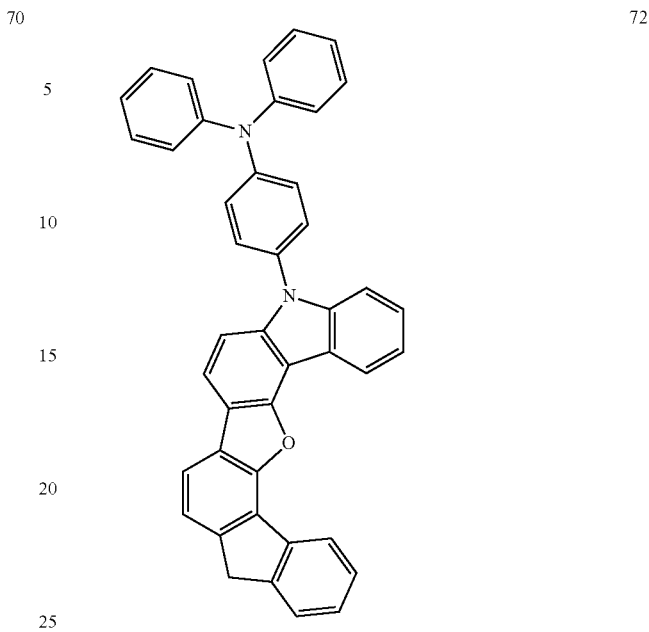
71
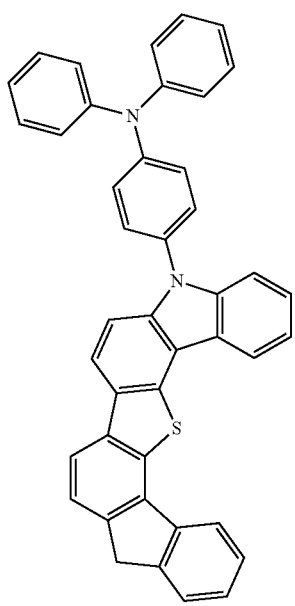
134
-continued
72
73
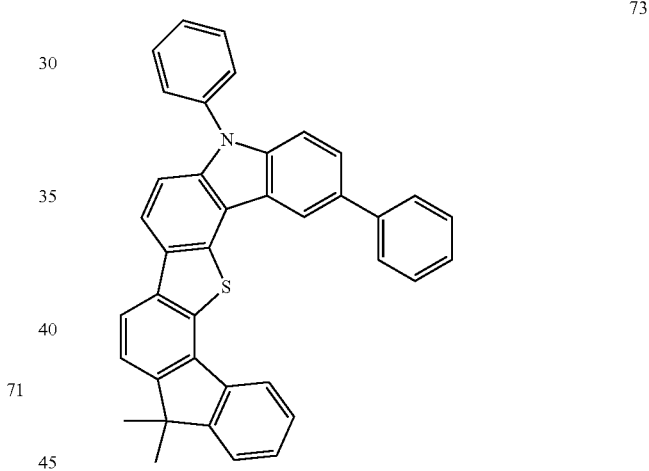
74
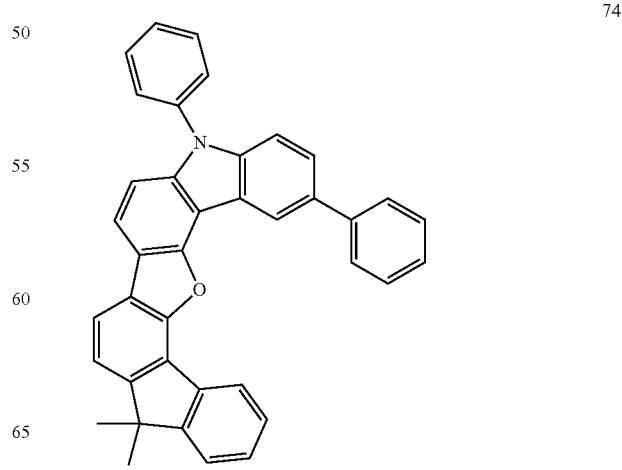

| 75 | 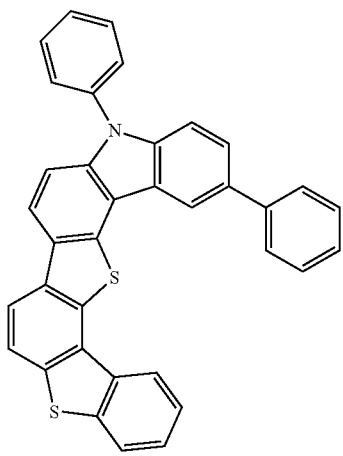 | 78 | 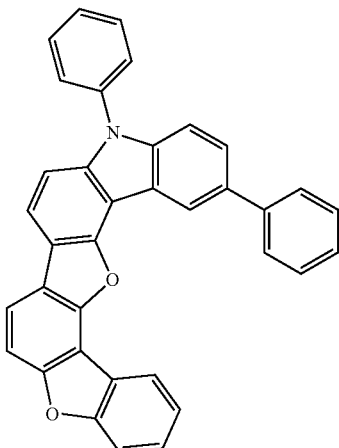 |
| 76 | 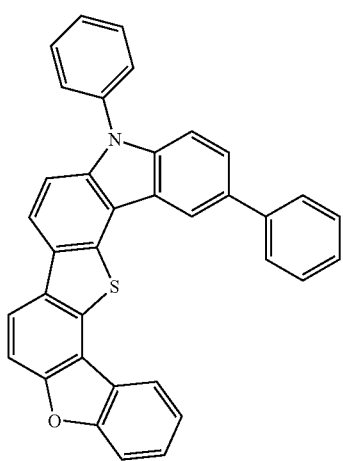 | 79 | 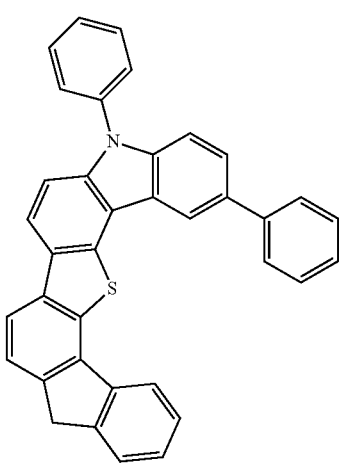 |
| 77 | 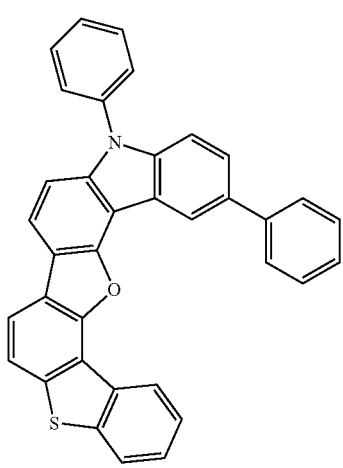 | 80 | 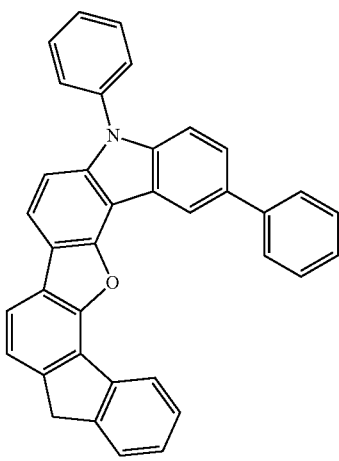 |

81
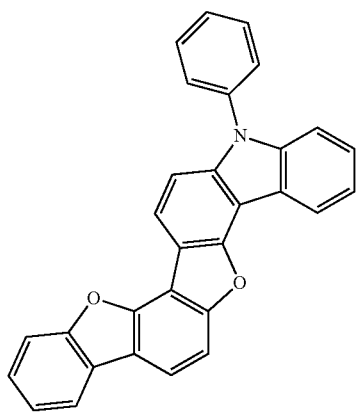
82
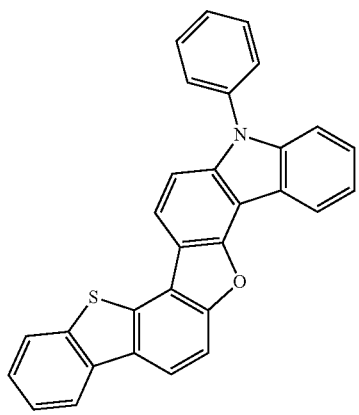
83
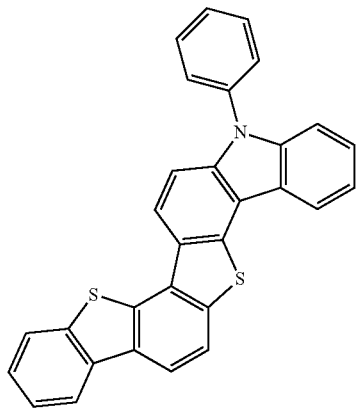
84
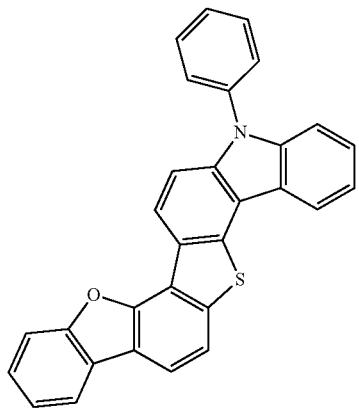
89
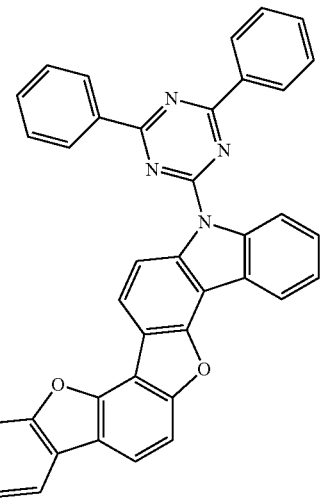
90
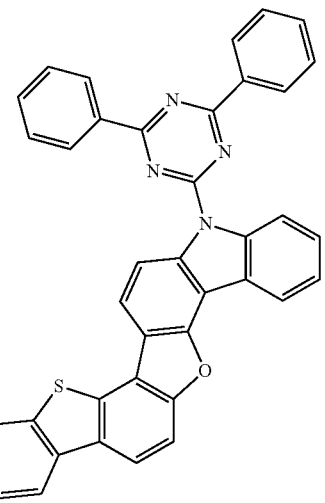
91
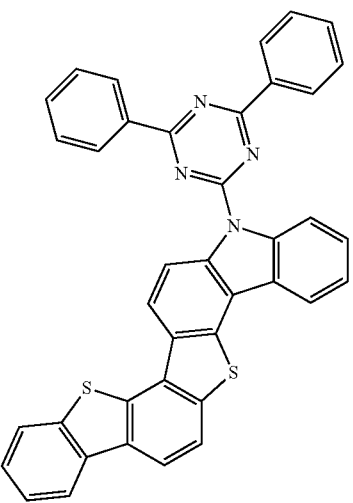

-continued
92
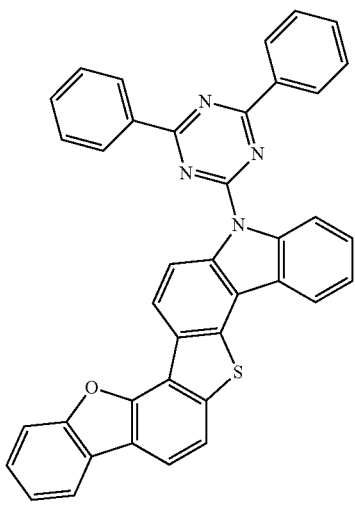
97
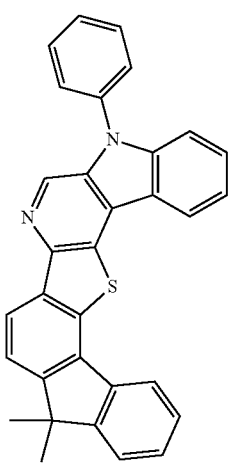
-continued
99
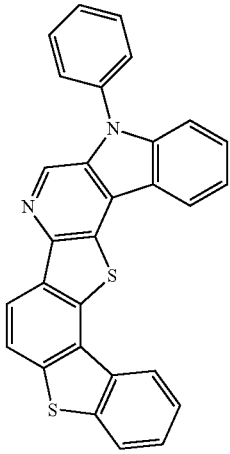
100
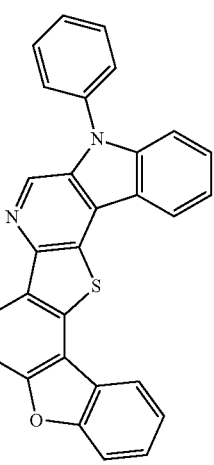
101
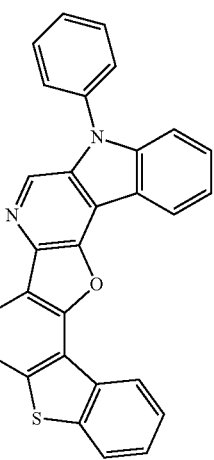
98
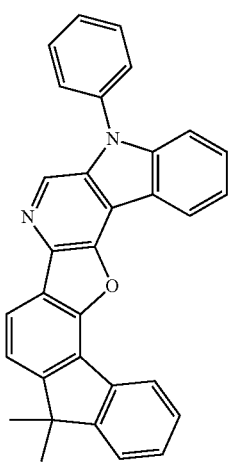

141
-continued
102
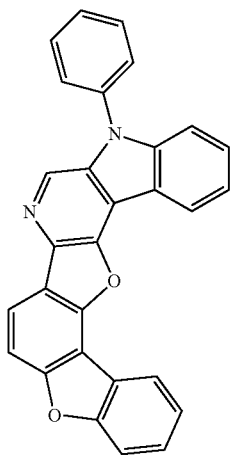
103
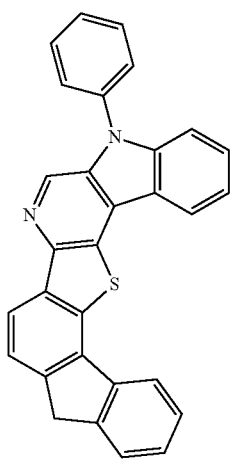
104
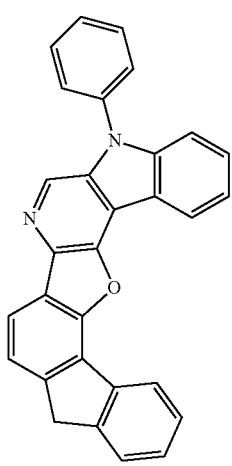
142
-continued
105
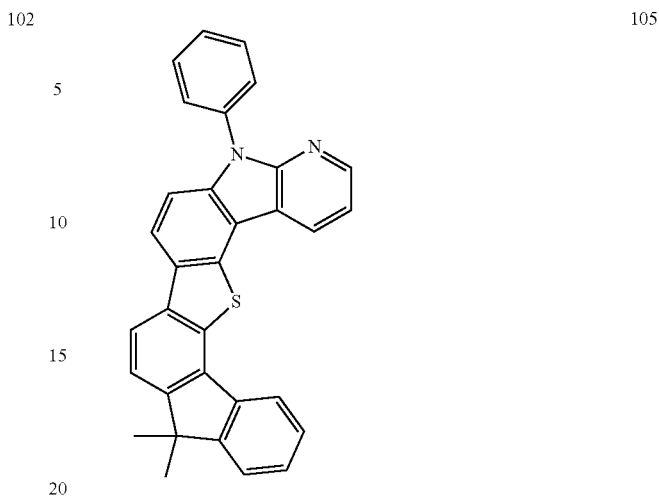
106
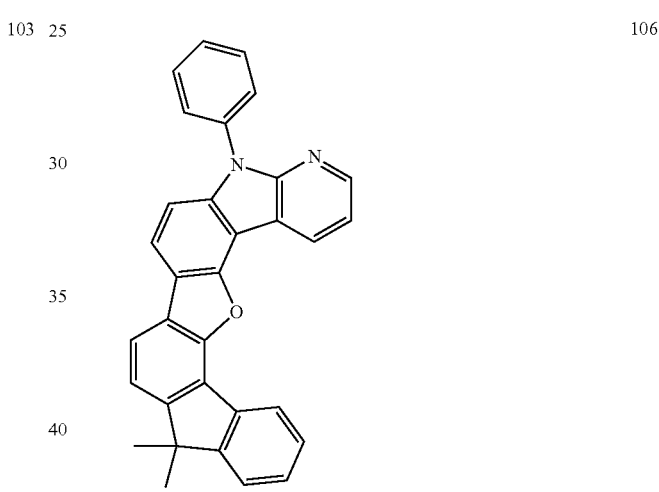
107
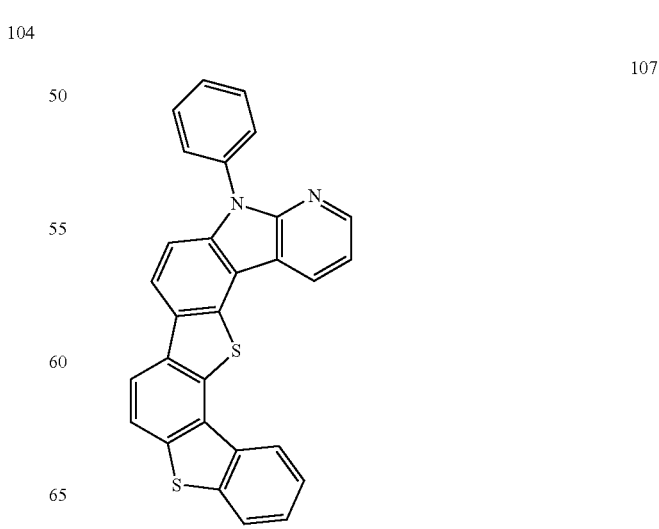

-continued
108
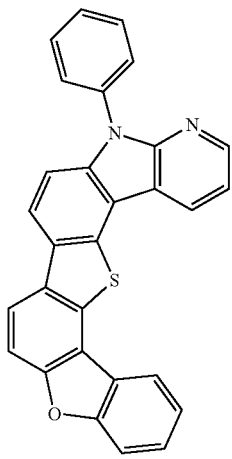
111
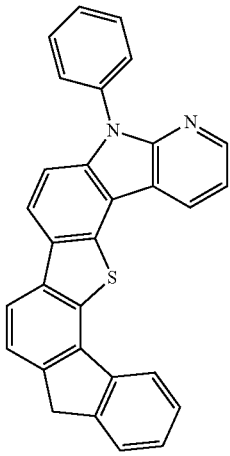
109
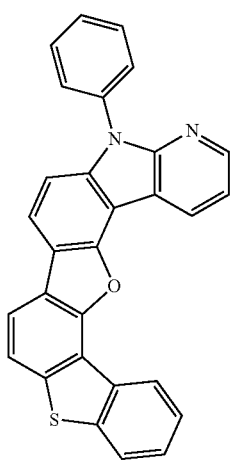
112
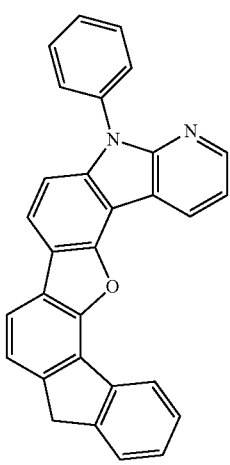
110
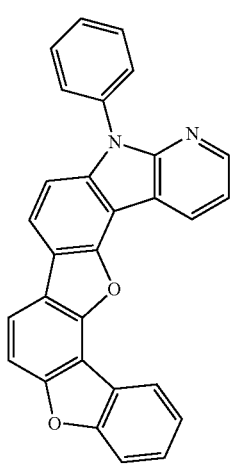
113
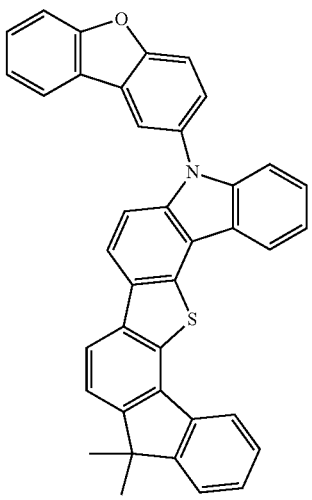

114
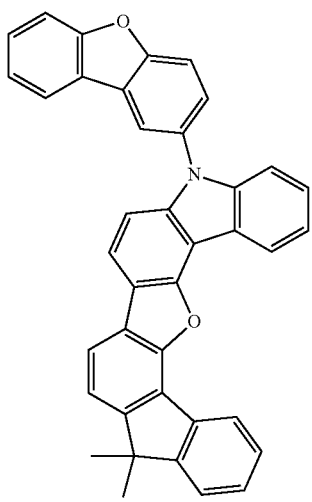
115
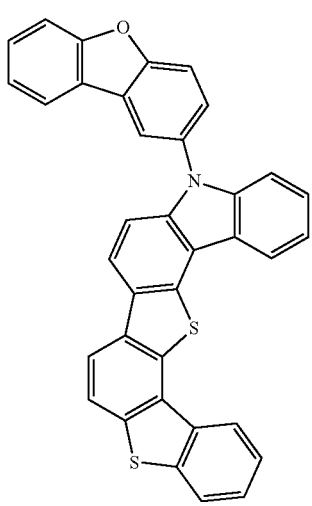
116
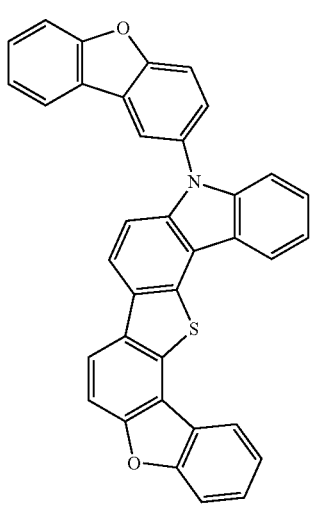
117
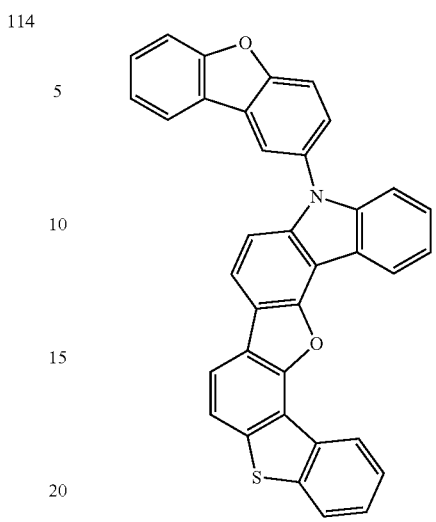
118
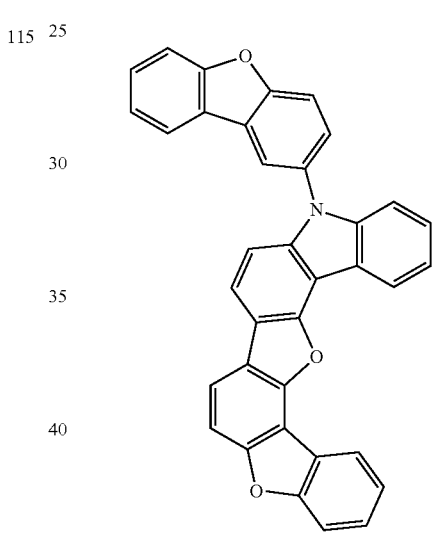
119
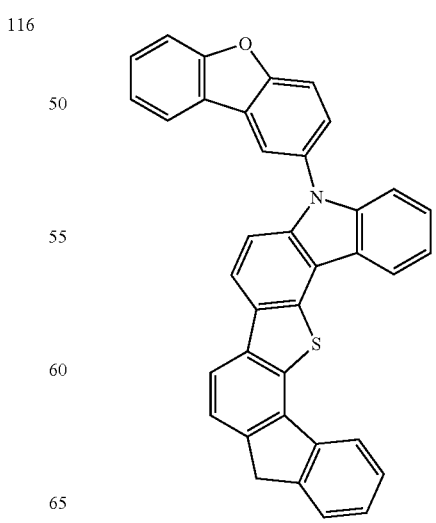

147
-continued
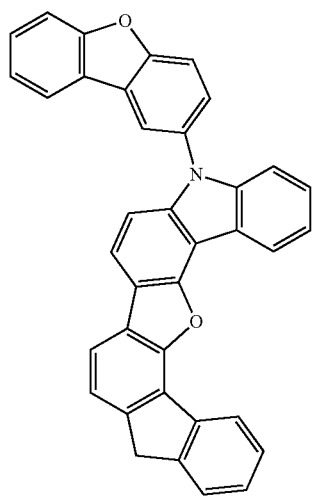
120
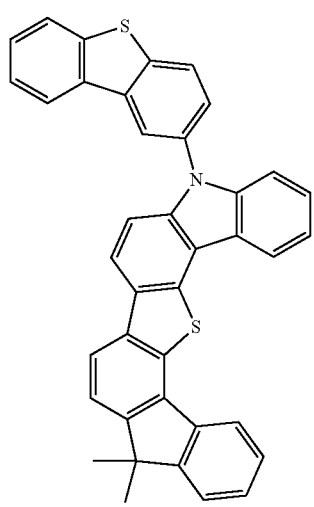
121
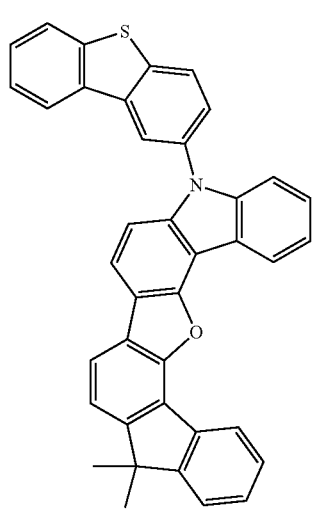
122
148
-continued
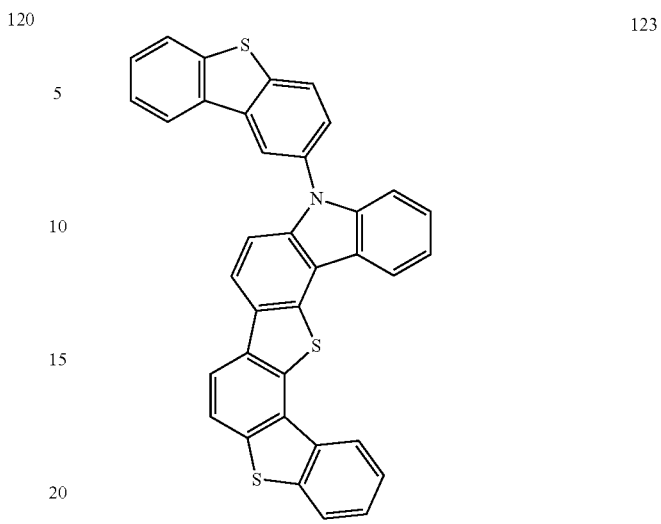
123
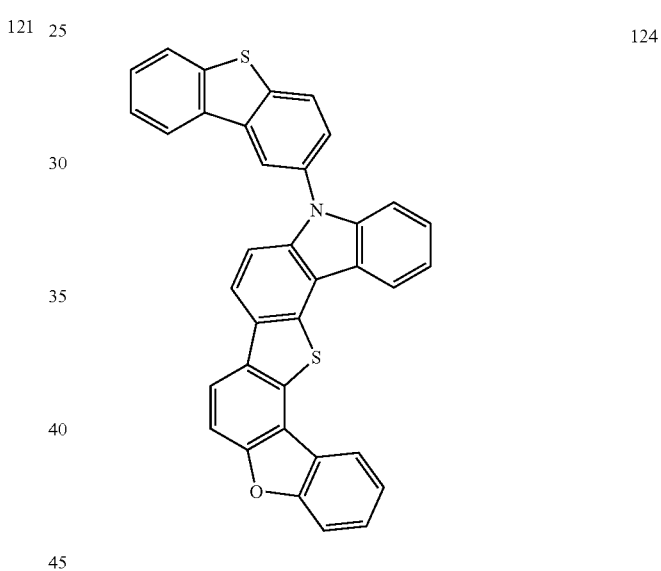
124
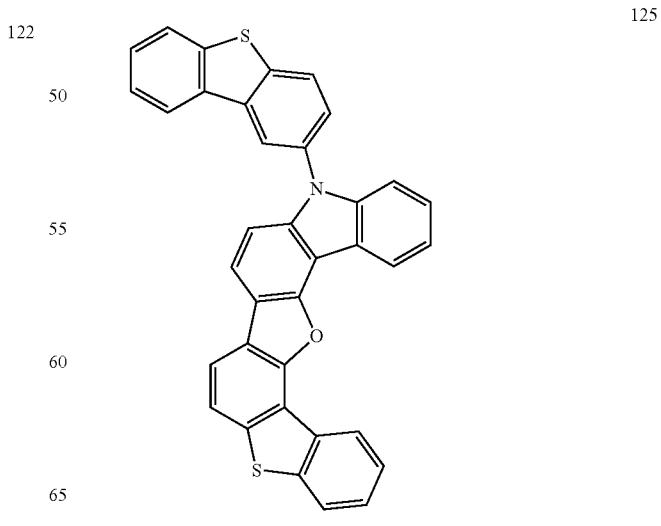
125

126
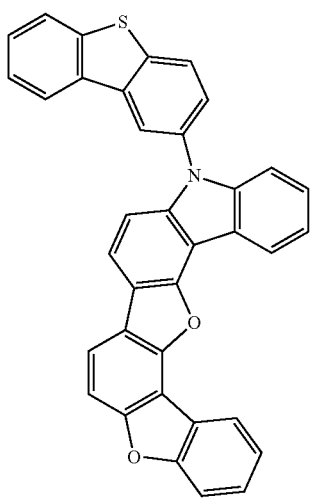
127
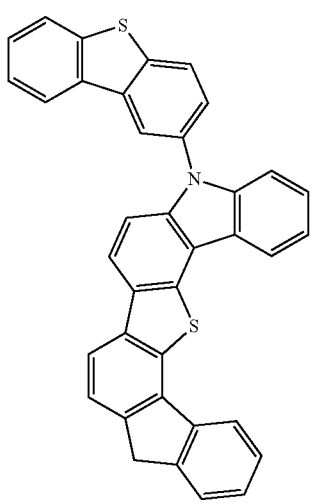
128
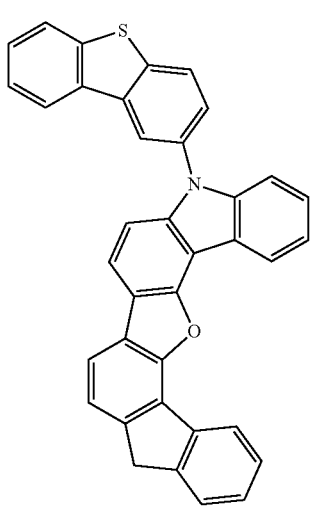
129
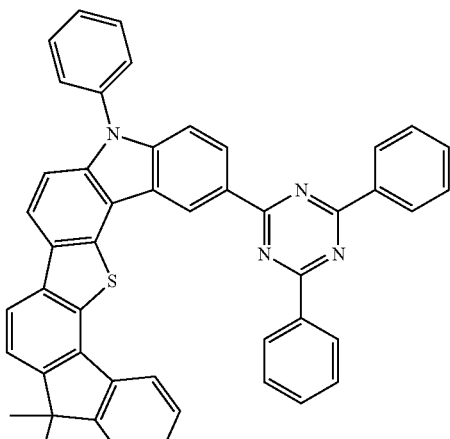
130
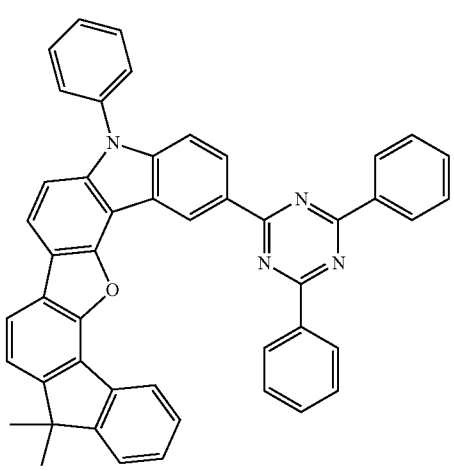
131
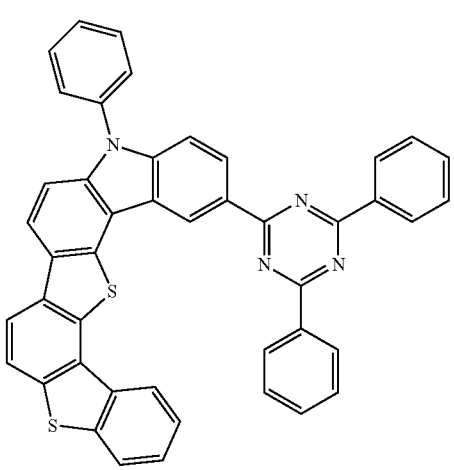

132
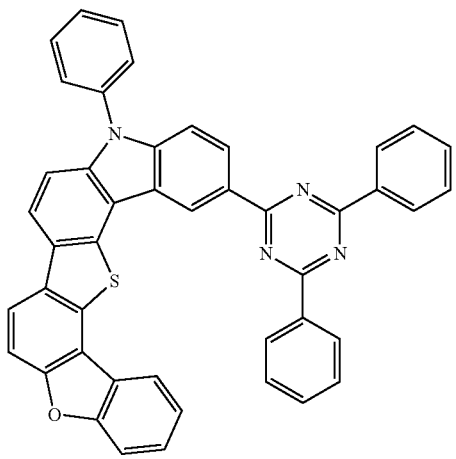
133
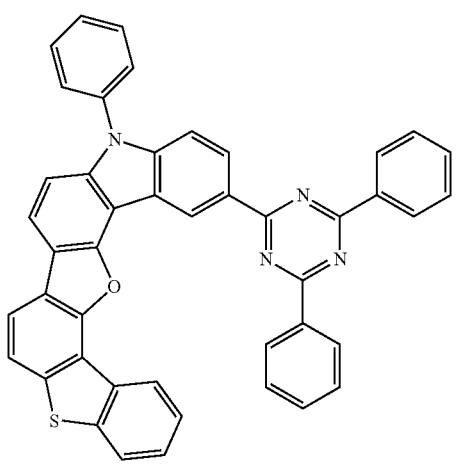
134
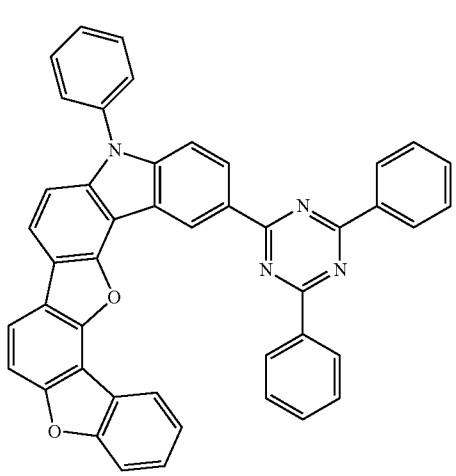
135
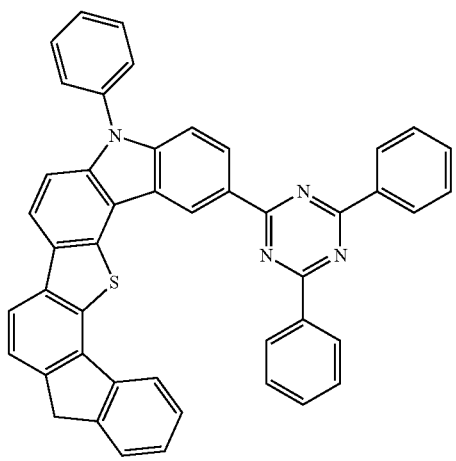
136
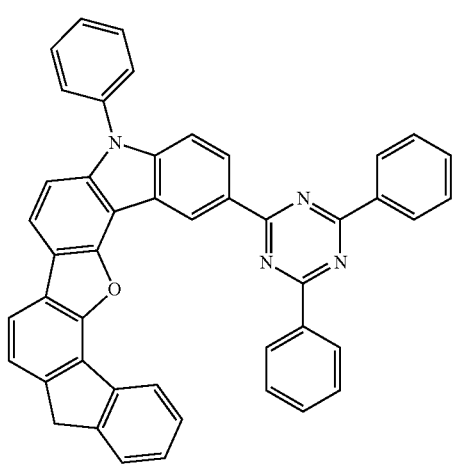
137
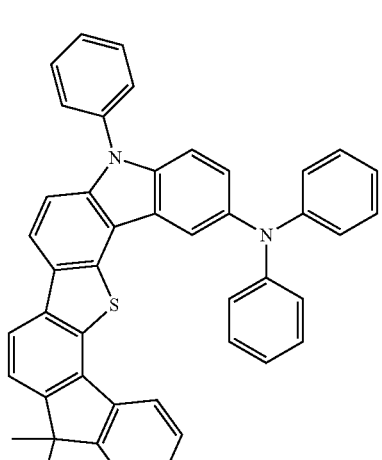

153
-continued
138
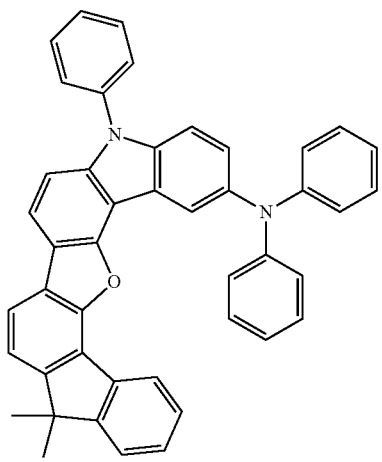
139
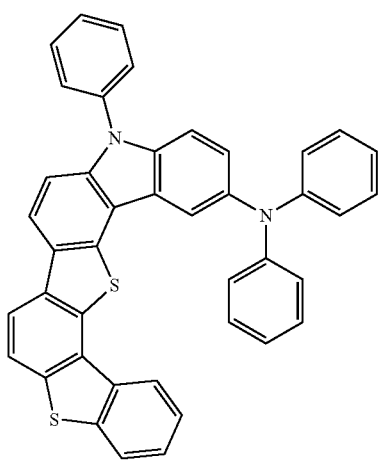
140
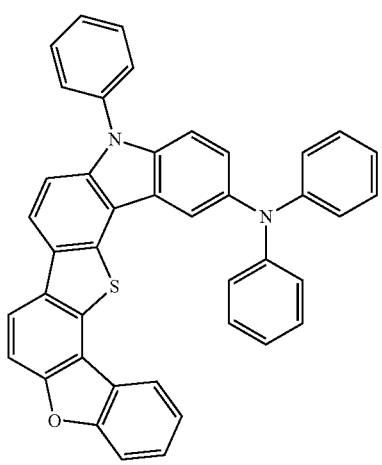
154
-continued
141
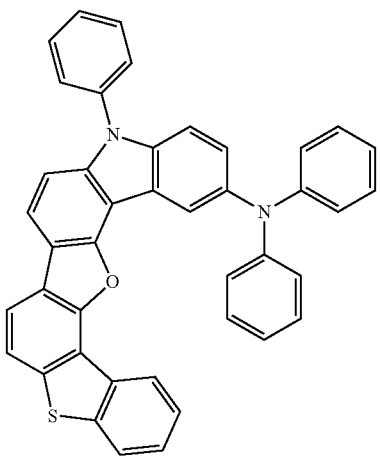
142
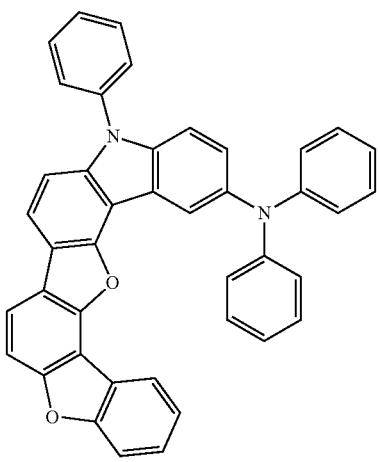
143
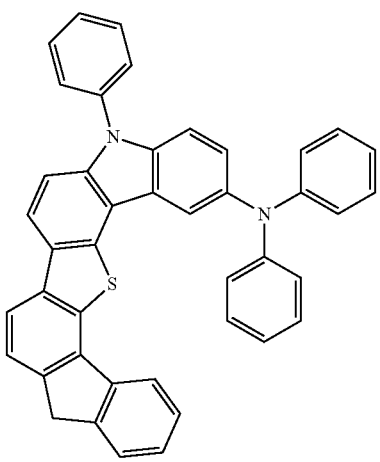

144
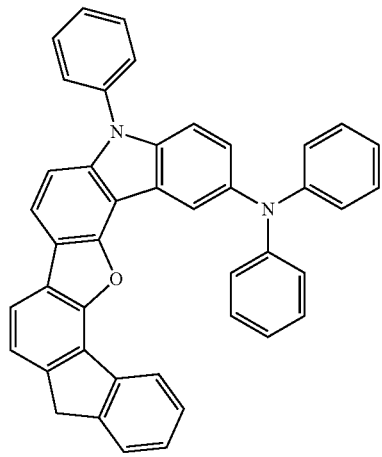
145
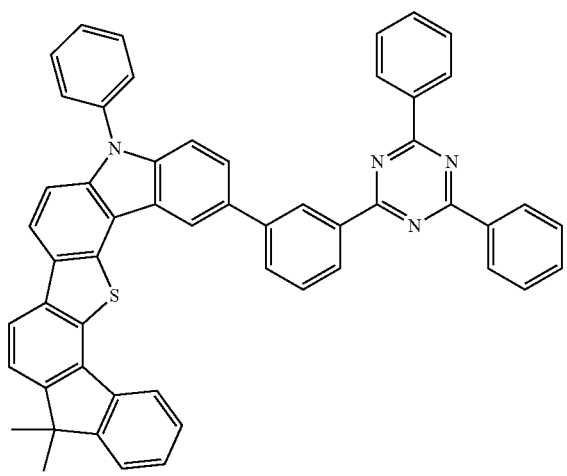
146
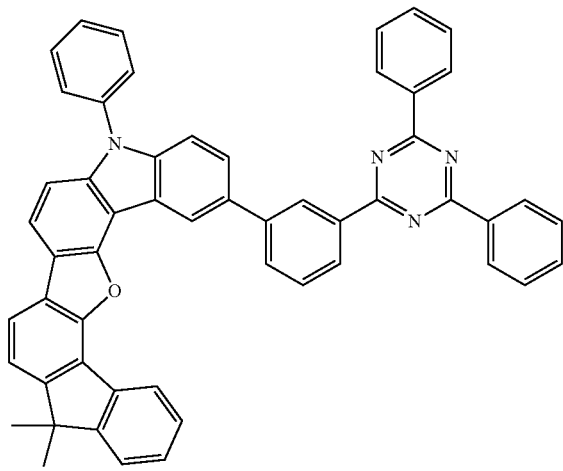
147
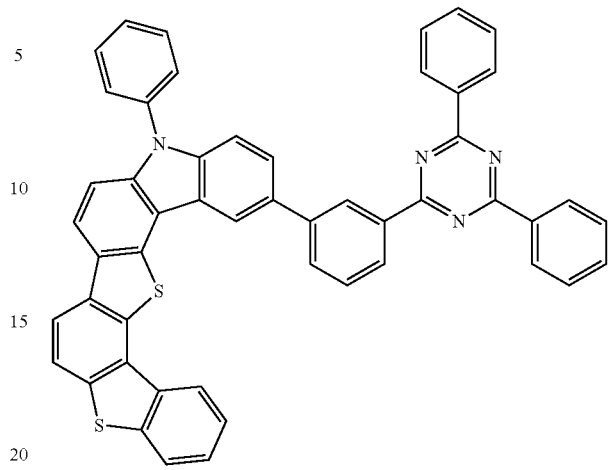
148
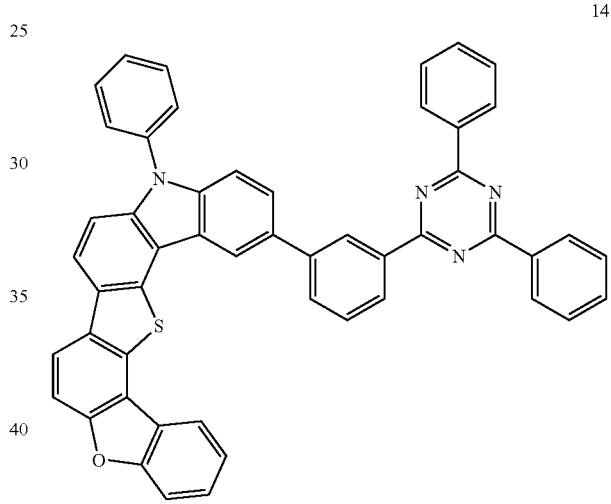
149
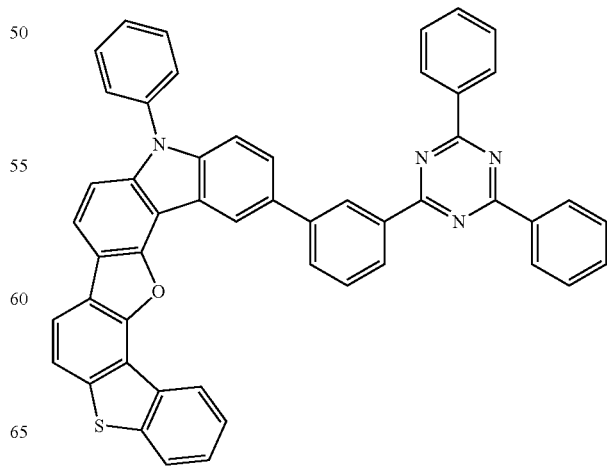

-continued
150
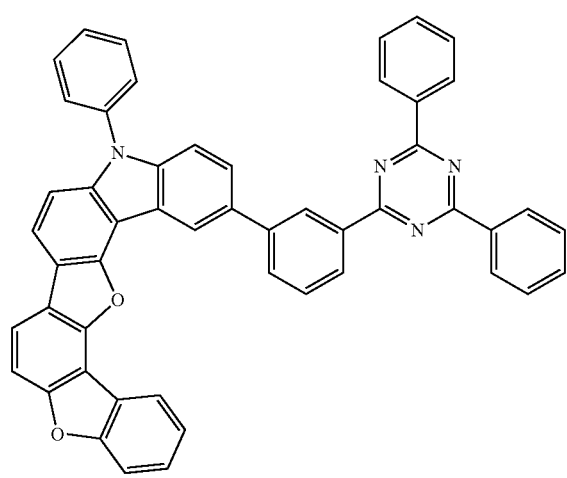
151
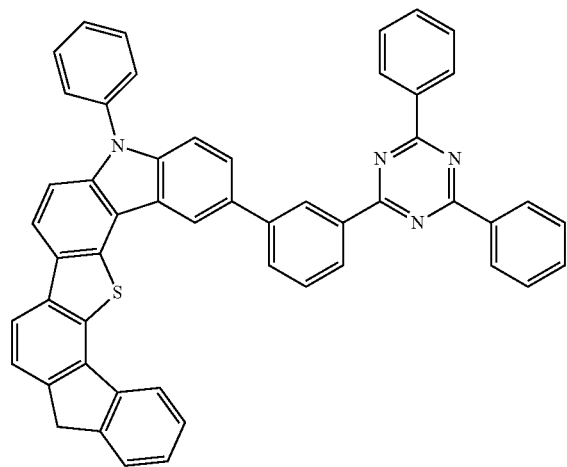
152
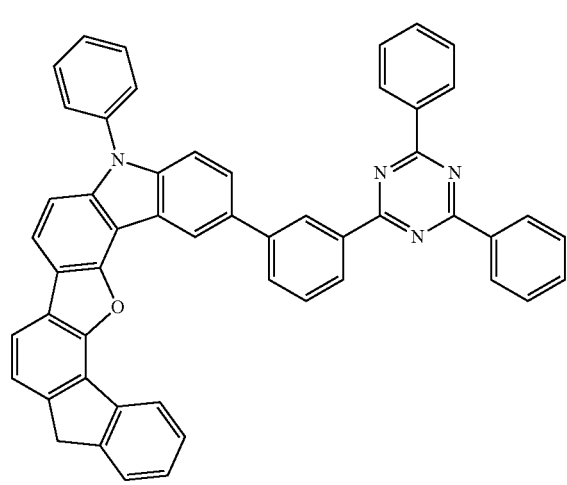
-continued
153
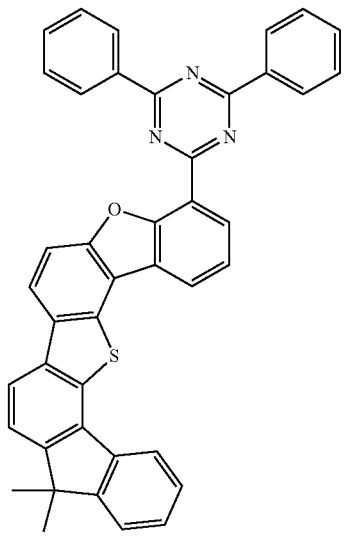
154
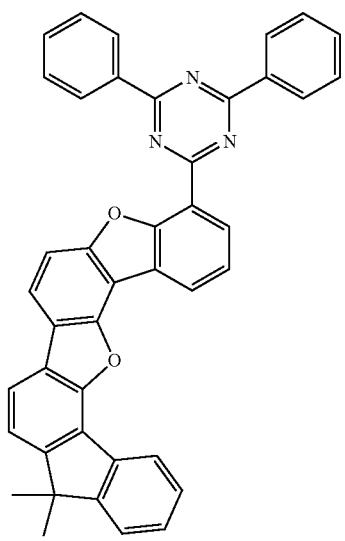
155
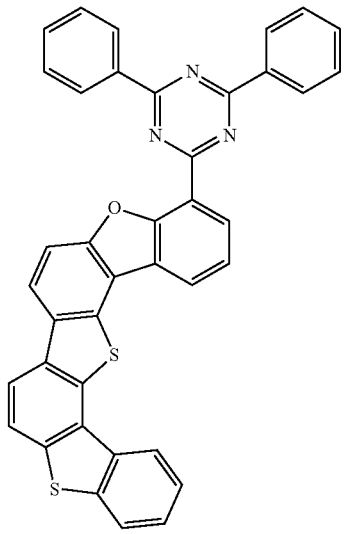

159
-continued
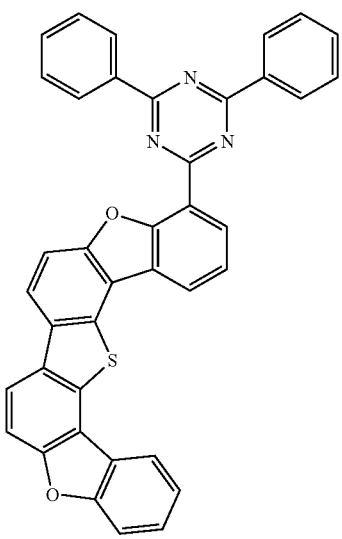
157
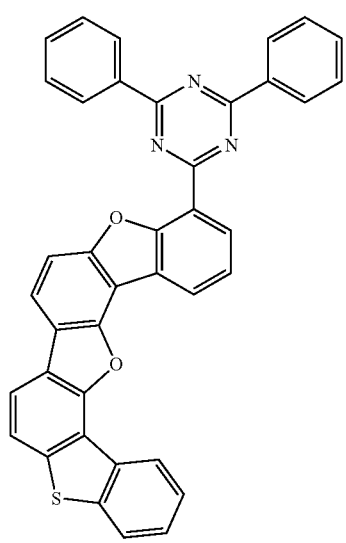
158
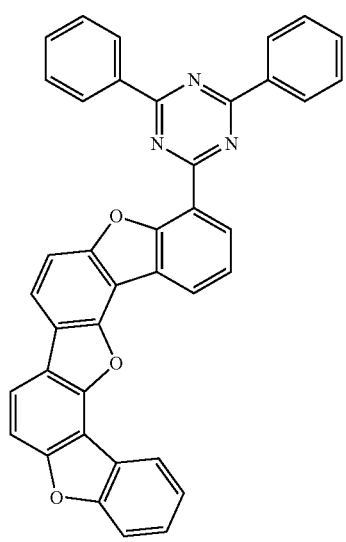
160
-continued
156
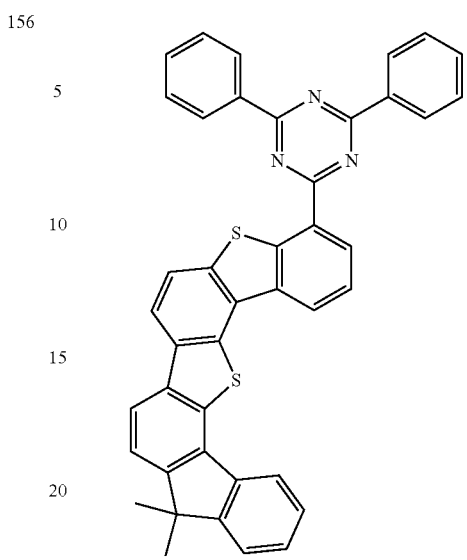
157
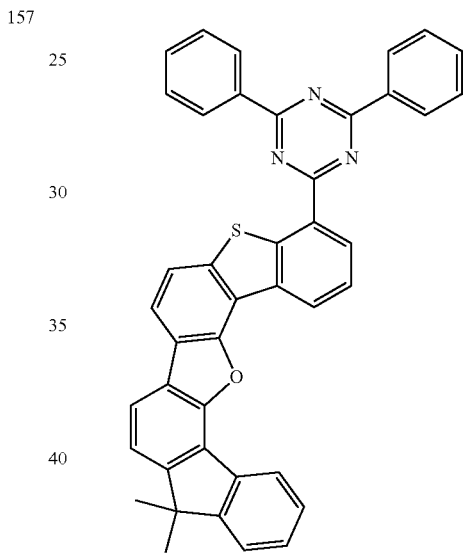
161
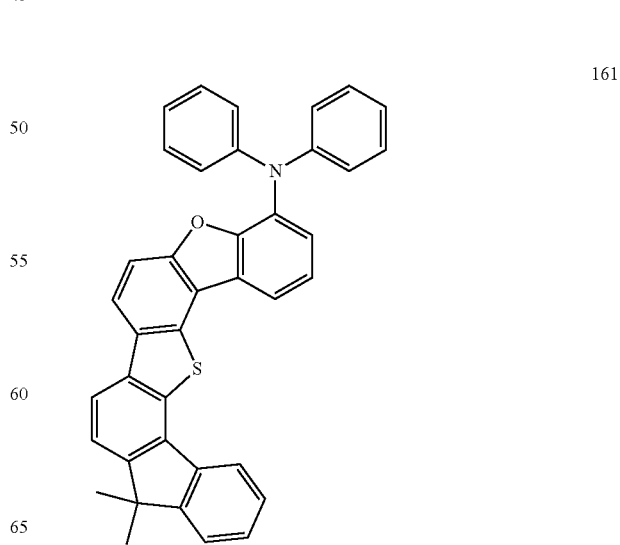

161
-continued
162
-continued
162
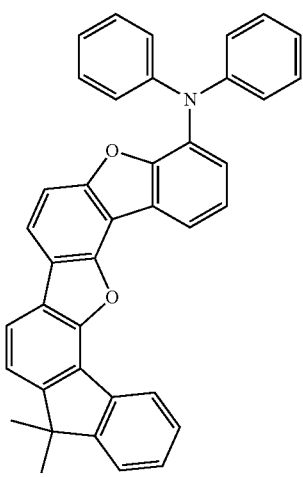
165
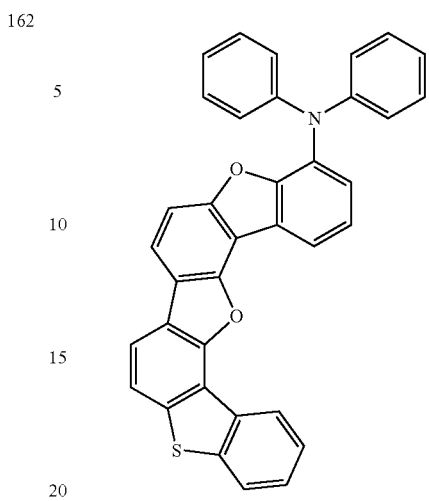
163
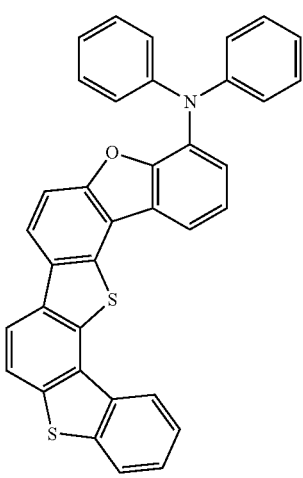
166
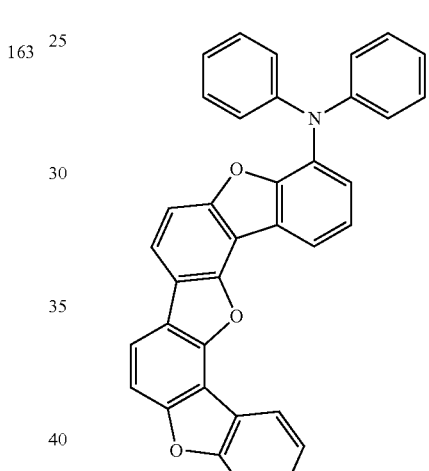
164
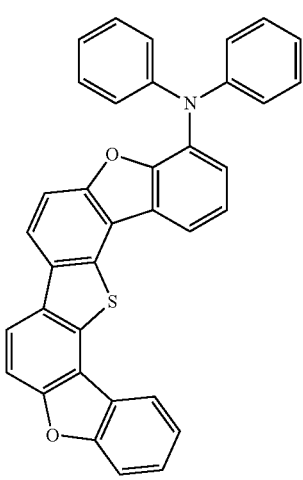
167
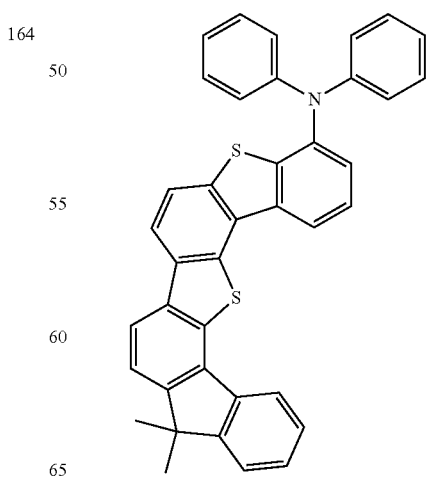

-continued

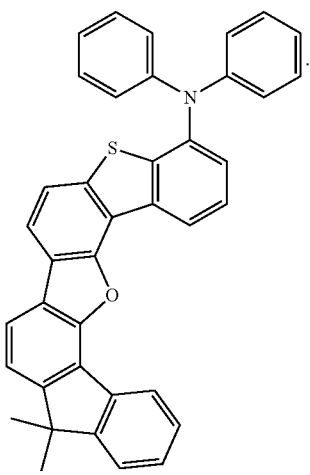

9. An organic optoelectric device, comprising:
an anode and a cathode facing each other, and
at least one organic layer positioned between the anode and the cathode, wherein the organic layer includes the organic compound as claimed in claim 1.

10. The organic optoelectric device as claimed in claim 9, wherein:
the organic layer includes an emission layer, and
the emission layer includes the organic compound.

11. The organic optoelectric device as claimed in claim 10, wherein the organic compound is included in the emission layer as a host.

12. The organic optoelectric device as claimed in claim 10, wherein:
the organic layer includes at least one auxiliary layer selected from a hole injection layer, a hole transport layer, an electron blocking layer, an electron transport layer, an electron injection layer, and a hole blocking layer, and
the auxiliary layer includes the organic compound.

13. A display device comprising the organic optoelectric device as claimed in claim 9.

* * * * *